US012243587B2

(12) United States Patent
Tran et al.

(10) Patent No.: US 12,243,587 B2
(45) Date of Patent: Mar. 4, 2025

(54) MULTIPLE ROW PROGRAMMING OPERATION IN ARTIFICIAL NEURAL NETWORK ARRAY

(71) Applicant: Silicon Storage Technology, Inc., San Jose, CA (US)

(72) Inventors: Hieu Van Tran, San Jose, CA (US); Stephen Trinh, San Jose, CA (US); Stanley Hong, San Jose, CA (US); Thuan Vu, San Jose, CA (US); Anh Ly, San Jose, CA (US); Fan Luo, Fremont, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 116 days.

(21) Appl. No.: 18/076,129

(22) Filed: Dec. 6, 2022

(65) Prior Publication Data
US 2024/0112729 A1    Apr. 4, 2024

Related U.S. Application Data

(60) Provisional application No. 63/409,177, filed on Sep. 22, 2022.

(51) Int. Cl.
G11C 11/56     (2006.01)
G06N 3/04      (2023.01)
G11C 16/10     (2006.01)

(52) U.S. Cl.
CPC ............ *G11C 11/5628* (2013.01); *G06N 3/04* (2013.01); *G11C 11/5671* (2013.01); *G11C 16/10* (2013.01); *G11C 2216/04* (2013.01)

(58) Field of Classification Search
None
See application file for complete search history.

(56) References Cited

U.S. PATENT DOCUMENTS

| 5,029,130 A  | 7/1991 | Yeh |
| 6,747,310 B2 | 6/2004 | Fan et al. |

(Continued)

FOREIGN PATENT DOCUMENTS

| TW | 201237876 A | 9/2012 |
| TW | 201638952 A | 11/2016 |

(Continued)

OTHER PUBLICATIONS

Taiwanese Office Action mailed on Mar. 29, 2024 corresponding to the related Taiwanese Patent Application No. 112125182.

(Continued)

*Primary Examiner* — Tan T. Nguyen
(74) *Attorney, Agent, or Firm* — DLA PIPER LLP US

(57) ABSTRACT

Numerous examples are disclosed of programming multiple rows in an array in an artificial neural network as part of a single programming operation. In one example, a method comprises ramping up an output of a high voltage generator to a first voltage level; while maintaining the output of the high voltage generator at the first voltage level, programming a plurality of words of K rows of memory cells in an array of memory cells using the output of the high voltage generator, where K>1; and after the programming, ramping down the output of the high voltage generator to a second voltage level.

15 Claims, 45 Drawing Sheets

(56) References Cited

U.S. PATENT DOCUMENTS

| | | | |
|---|---|---|---|
| 10,748,630 | B2 | 8/2020 | Tran et al. |
| 10,762,973 | B1* | 9/2020 | Lu ................... G11C 11/5628 |
| 2007/0291550 | A1 | 12/2007 | Yang et al. |
| 2017/0337466 | A1 | 11/2017 | Bayat et al. |
| 2017/0364792 | A1 | 12/2017 | Chai |
| 2021/0295907 | A1 | 9/2021 | Tran et al. |
| 2023/0343400 | A1* | 10/2023 | Guo ................ G11C 16/3459 |
| 2024/0071493 | A1* | 2/2024 | Zainuddin ............ G11C 16/102 |

FOREIGN PATENT DOCUMENTS

| | | | |
|---|---|---|---|
| TW | 202127450 | A | 7/2021 |
| TW | 202143243 | A | 11/2021 |
| TW | 202145223 | A | 12/2021 |
| TW | 202213360 | A | 4/2022 |
| TW | 202219965 | A | 5/2022 |

OTHER PUBLICATIONS

PCT Search Report and Written Opinion mailed on Jun. 6, 2023 corresponding to the related PCT Patent Application No. PCT/US22/053242.

* cited by examiner

2500

2600

2900

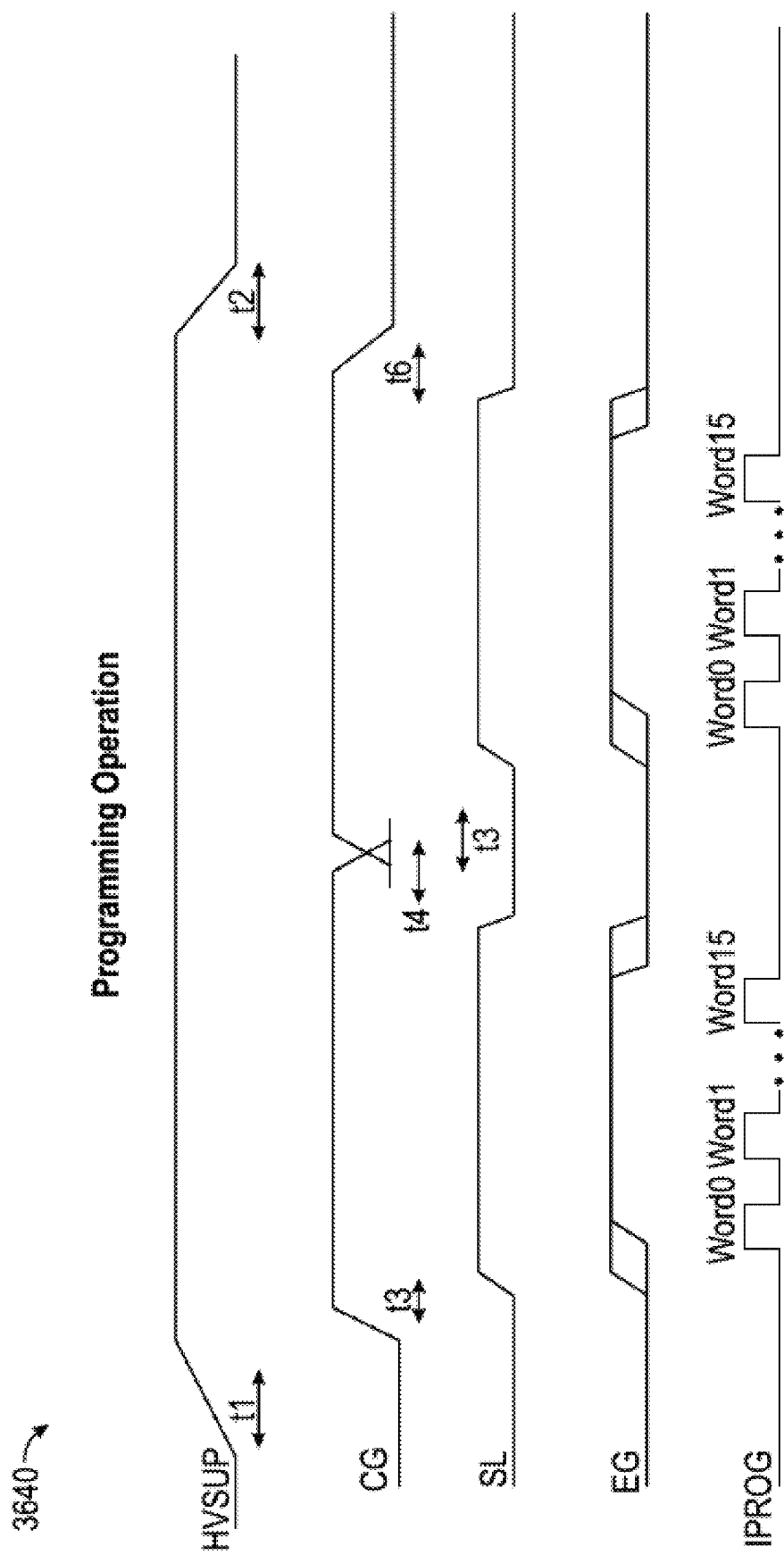

1

MULTIPLE ROW PROGRAMMING OPERATION IN ARTIFICIAL NEURAL NETWORK ARRAY

PRIORITY CLAIM

This application claims priority to U.S. Provisional Patent Application No. 63/409,177, filed on Sep. 22, 2022, and titled, "Multiple Row Programming Operation in Artificial Neural Network Array," which is incorporated by reference herein.

FIELD OF THE INVENTION

Numerous examples are disclosed of programming multiple rows in a single programming operation in an array in an artificial neural network.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e., a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. Patent Application Publication 2017/0337466A1, which is incorporated by reference. The non-volatile memory arrays operate as an analog neural memory and comprise non-volatile memory cells arranged in rows and columns. The neural network includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells store a weight value corresponding to a number of electrons on the floating gate. The plurality of memory cells multiply the first plurality of inputs by the stored weight values to generate the first plurality of outputs.

Non-Volatile Memory Cells

Non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim (FN) tunneling.

Memory cell 210 is programmed by source side injection (SSI) with hot electrons (where electrons are placed on the floating gate) by placing a positive voltage on the word line terminal 22, and a positive voltage on the source region 14. Electron current will flow from the drain region 16 towards the source region 14. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e., erased of electrons), then the portion of the channel region 18 under the floating gate 20 is turned on as well, and current will flow across the channel region 18, which is sensed as the erased or "1" state. If the floating gate 20 is negatively charged (i.e., programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage and current ranges that can be applied to the terminals of memory cell 210 for performing read, erase, and program operations:

TABLE NO. 1

Operation of Flash Memory Cell 210 of FIG. 2

|  | WL | BL | SL |
|---|---|---|---|
| Read | 2-3 V | 0.6-2 V | 0 V |
| Erase | ~11-13 V | 0 V | 0 V |
| Program | 1-2 V | 10.5-3 µA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage and current ranges that can be applied to the terminals of memory cell 310 for performing read, erase, and program operations:

TABLE NO. 2

Operation of Flash Memory Cell 310 of FIG. 3

|  | WL/SG | BL | CG | EG | SL |
|---|---|---|---|---|---|
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 0.1-1 µA | 8-11 V | 4.5-9 V | 4.5-5 V |

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage is applied on the source line during a program operation to compensate for a lack of control gate bias.

Table No. 3 depicts typical voltage and current ranges that can be applied to the terminals of memory cell 410 for performing read, erase, and program operations:

TABLE NO. 3

Operation of Flash Memory Cell 410 of FIG. 4

|  | WL/SG | BL | EG | SL |
|---|---|---|---|---|
| Read | 0.7-2.2 V | 0.6-2 V | 0-2.6 V | 0 V |
| Erase | −0.5 V/0 V | 0 V | 11.5 V | 0 V |
| Program | 1 V | 0.2-3 µA | 4.5 V | 7-9 V |

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line) extends over floating gate 20, separated by an insulating layer (not shown). The erase is done by FN tunneling of electrons from FG to substrate, programming is by channel hot electron (CHE) injection at region between the channel 18 and the drain region 16, by the electrons flowing from the source region 14 towards to drain region 16 and read operation which is similar to that for memory cell 210 with a higher control gate voltage.

Table No. 4 depicts typical voltage ranges that can be applied to the terminals of memory cell 510 and substrate 12 for performing read, erase, and program operations:

TABLE NO. 4

Operation of Flash Memory Cell 510 of FIG. 5

|  | CG | BL | SL | Substrate |
|---|---|---|---|---|
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), CT (charge trap) memory, CN (carbon-tube) memory, OTP (bi-level or multi-level one time programmable), and CeRAM (correlated electron ram), without limitation.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e., charge on the floating gate) of each memory cell in the array can be continuously changed from a fully erased state to a fully programmed state, and vice-versa, independently and with minimal disturbance of other memory cells. This means the cell storage is effectively analog or at the very least can store one of many discrete values (such as 16 or 64 different values), which allows for very precise and individual tuning of all the memory cells in the memory array, and which makes the memory array ideal for storing and making fine tuning adjustments to the synapsis weights of the neural network.

Neural Networks Employing Non-Volatile Memory Cell Arrays

FIG. 6 conceptually illustrates a non-limiting example of a neural network utilizing a non-volatile memory array of the present examples. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the feature maps of layer C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of layer C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function P1 is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in layer S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed-up output values of differential summer 38 are then supplied to an activation function block 39, which rectifies the output. The activation function block 39 may provide sigmoid, tanh, or ReLU functions. The rectified output values of activation function block 39 become an element of a feature map as the next layer (e.g. C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function block 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

FIG. 8 is a block diagram depicting the usage of numerous layers of VMM arrays 32, here labeled as VMM arrays 32*a*, 32*b*, 32*c*, 32*d*, and 32*e*. As shown in FIG. 8, the input, denoted Inputx, is converted from digital to analog by a digital-to-analog converter 31 and provided to input VMM array 32*a*. The converted analog inputs could be voltage or current. The input D/A conversion for the first layer could be done by using a function or a LUT (look up table) that maps the inputs Inputx to appropriate analog levels for the matrix multiplier of input VMM array 32*a*. The input conversion could also be done by an analog to analog (A/A) converter to convert an external analog input to a mapped analog input to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32a,32b,32c,32d,32e): one input layer (32a), two hidden layers (32b,32c), and two fully connected layers (32d,32e). One of ordinary skill in the art will appreciate that this is merely an example and that a system instead could comprise more than two hidden layers and more than two fully connected layers.

Vector-by-Matrix Multiplication (VMM) Arrays

FIG. 9 depicts neuron VMM array 900, which is particularly suited for memory cells 310 as shown in FIG. 3 and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one example, only even rows are used, and in another example, only odd rows are used. The current placed on each source line (SL0, SL1, respectively) performs a summing function of all the currents from the memory cells connected to that particular source line.

As described herein for neural networks, the non-volatile memory cells of VMM array 900, i.e., the memory cells 310 of VMM array 900, may be configured to operate in a sub-threshold region.

The non-volatile reference memory cells and the non-volatile memory cells described herein are biased in weak inversion (sub threshold region):

$$Ids = Io * e^{(Vg-Vth)/nVt} = w*Io*e^{(Vg)/nVt},$$

where $w = e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to (Wt/L)*u*Cox*(n−1)*Vt² where u is carrier mobility and Wt and L are width and length, respectively, of the memory cell.

For an I-to-V log converter using a memory cell (such as a reference memory cell or a peripheral memory cell) or a transistor to convert input current into an input voltage:

$$Vg = n*Vt*\log[Ids/wp*Io]$$

where, wp is w of a reference or peripheral memory cell.

For a memory array used as a vector matrix multiplier VMM array with the current input, the output current is:

$$Iout = wa*Io*e^{(Vg)/nVt}, \text{namely}$$

$$Iout = (wa/wp)*Iin = W*Iin$$

$$W = e^{(Vthp-Vtha)/nVt}$$

Here, wa=w of each memory cell in the memory array. Vthp is effective threshold voltage of the peripheral memory cell and Vtha is effective threshold voltage of the main (data) memory cell. Note that the threshold voltage of a transistor is a function of substrate body bias voltage and the substrate body bias voltage, denoted Vsb, can be modulated to compensate for various conditions, on such temperature. The threshold voltage Vth can be expressed as:

$$Vth = Vth0 + \text{gamma}(\text{SQRT}|Vsb-2*\varphi F|-\text{SQRT}|2*\varphi F|)$$

where Vth0 is threshold voltage with zero substrate bias, φF is a surface potential, and gamma is a body effect parameter.

A wordline or control gate can be used as the input for the memory cell for the input voltage.

Alternatively, the flash memory cells of VMM arrays described herein can be configured to operate in the linear region:

$$Ids = \text{beta}*(Vgs-Vth)*Vds; \text{beta}=u*Cox*Wt/L$$

$$W = \alpha(Vgs-Vth)$$

meaning weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region can be used to linearly convert an input/output current into an input/output voltage.

Alternatively, the memory cells of VMM arrays described herein can be configured to operate in the saturation region:

$$Ids = \frac{1}{2}*\text{beta}*(Vgs-Vth)^2; \text{beta}=u*Cox*Wt/L$$

$$W\alpha(Vgs-Vth)^2, \text{meaning weight } W \text{ is proportional to} (Vgs-Vth)^2$$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

Other examples for VMM array 32 of FIG. 7 are described in U.S. Pat. No. 10,748,630, which is incorporated by reference herein. As described in that application. a sourceline or a bitline can be used as the neuron output (current summation output).

FIG. 10 depicts neuron VMM array 1000, which is particularly suited for memory cells 210 as shown in FIG. 2 and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells.

Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 (only partially depicted) with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3) by the weights stored in the memory array 1003 and then adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages and currents for VMM array 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 5

Operation of VMM Array 1000 of FIG. 10:

|  | WL | WL -unsel | BL | BL -unsel | SL | SL -unsel |
|---|---|---|---|---|---|---|
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

FIG. 11 depicts neuron VMM array 1100, which is particularly suited for memory cells 210 as shown in FIG. 2 and is utilized as the synapses and parts of neurons between an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages and currents for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

Operation of VMM Array 1100 of FIG. 11

|  | WL | WL -unsel | BL | BL -unsel | SL | SL -unsel |
|---|---|---|---|---|---|---|
| Read | 1-3.5 V | −0.5 V/0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

FIG. 12 depicts neuron VMM array 1200, which is particularly suited for memory cells 310 as shown in FIG. 3 and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 (only partially shown) with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bit lines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially programmed until the desired charge on the floating gate is reached. If too much charge is placed on the floating gate (such that the wrong value is stored in the cell), the cell is erased and the sequence of partial programming operations starts over. As shown, two rows sharing the same erase gate (such as EG0 or EG1) are erased together (which is known as a page erase), and thereafter, each cell is partially programmed until the desired charge on the floating gate is reached.

Table No. 7 depicts operating voltages and currents for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

Operation of VMM Array 1200 of FIG. 12

|  | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 1.0-2 V | −0.5 V/ 0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

FIG. 13 depicts neuron VMM array 1300, which is particularly suited for memory cells 310 as shown in FIG. 3, and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as needed to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bit lines BL0-BLN, where each bit line sums all currents from the non-volatile memory cells connected to that particular bitline.

Table No. 8 depicts operating voltages and currents for VMM array 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 8

Operation of VMM Array 1300 of FIG. 13

|  | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

FIG. 22 depicts neuron VMM array 2200, which is particularly suited for memory cells 210 as shown in FIG. 2 and is utilized as the synapses and parts of neurons between an input layer and the next layer. In VMM array 2200, the inputs $INPUT_0$ . . . . , $INPUT_N$ are received on bit lines $BL_0$, . . . $BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

FIG. 23 depicts neuron VMM array 2300, which is particularly suited for memory cells 210 as shown in FIG. 2 and is utilized as the synapses and parts of neurons between an input layer and the next layer. In this example, the inputs $INPUT_0$, $INPUT_1$, $INPUT_2$, and $INPUT_3$ are received on source lines $SL_0$, $SL_1$, $SL_2$, and $SL_3$, respectively, and the outputs $OUTPUT_0$, . . . $OUTPUT_N$ are generated on bit lines $BL_0$, . . . , $BL_N$.

FIG. 24 depicts neuron VMM array 2400, which is particularly suited for memory cells 210 as shown in FIG. 2, and is utilized as the synapses and parts of neurons between an input layer and the next layer. In this example, the inputs $INPUT_0$, . . . , $INPUT_M$ are received on word lines $WL_0$, . . . , $WL_M$, respectively, and the outputs $OUTPUT_0$, . . . $OUTPUT_N$ are generated on bit lines $BL_0$, . . . , $BL_N$.

FIG. 25 depicts neuron VMM array 2500, which is particularly suited for memory cells 310 as shown in FIG. 3, and is utilized as the synapses and parts of neurons between an input layer and the next layer. In this example, the inputs $INPUT_0$, . . . , $INPUT_M$ are received on word lines $WL_0$, . . . , $WL_M$, respectively, and the outputs $OUTPUT_0$, . . . $OUTPUT_N$ are generated on bit lines $BL_0$, . . . , $BL_N$.

FIG. 26 depicts neuron VMM array 2600, which is particularly suited for memory cells 410 as shown in FIG. 4, and is utilized as the synapses and parts of neurons between an input layer and the next layer. In this example, the inputs $INPUT_0$, . . . , $INPUT_N$ are received on vertical control gate lines $CG_0$, . . . , $CG_N$, respectively, and the outputs $OUTPUT_1$ and $OUTPUT_2$ are generated on source lines $SL_0$ and $SL_1$.

FIG. 27 depicts neuron VMM array 2700, which is particularly suited for memory cells 410 as shown in FIG. 4 and is utilized as the synapses and parts of neurons between an input layer and the next layer. In this example, the inputs $INPUT_0$, . . . , $INPUT_N$ are received on the gates of bit line control gates 2701-1, 2701-2, . . . , 2701-(N−1), and 2701-N, respectively, which are coupled to bit lines $BL_0$, . . . , $BL_N$, respectively. Example outputs $OUTPUT_1$ and $OUTPUT_2$ are generated on source lines $SL_0$ and $SL_1$.

FIG. 28 depicts neuron VMM array 2800, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, . . . , $INPUT_M$ are received on word lines $WL_0$, . . . , $WL_M$, and the outputs $OUTPUT_0$, . . . , $OUTPUT_N$ are generated on bit lines $BL_0$, . . . , $BL_N$, respectively.

FIG. 29 depicts neuron VMM array 2900, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, . . . , $INPUT_M$ are received on control gate lines $CG_0$, . . . , $CG_M$. Outputs $OUTPUT_0$, . . . , $OUTPUT_N$ are generated on vertical source lines $SL_0$, . . . , $SL_N$, respectively, where each source line $SL_i$ is coupled to the source lines of all memory cells in column i.

FIG. 30 depicts neuron VMM array 3000, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, . . . , $INPUT_M$ are received on control gate lines $CG_0$, . . . , $CG_M$. Outputs $OUTPUT_0$, . . . , $OUTPUT_N$ are generated on vertical bit lines $BL_0$, . . . , $BL_N$, respectively, where each bit line $BL_i$ is coupled to the bit lines of all memory cells in column i.

Long Short-Term Memory

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

FIG. 14 depicts an example LSTM 1400. LSTM 1400 in this example comprises cells 1401, 1402, 1403, and 1404. Cell 1401 receives input vector $x_0$ and generates output vector $h_0$ and cell state vector $c_0$. Cell 1402 receives input vector $x_1$, the output vector (hidden state) $h_0$ from cell 1401, and cell state $c_0$ from cell 1401 and generates output vector $h_1$ and cell state vector $c_1$. Cell 1403 receives input vector $x_2$, the output vector (hidden state) $h_1$ from cell 1402, and cell state $c_1$ from cell 1402 and generates output vector $h_2$ and cell state vector $c_2$. Cell 1404 receives input vector $x_3$, the output vector (hidden state) $h_2$ from cell 1403, and cell state $c_2$ from cell 1403 and generates output vector $h_3$. Additional cells can be used, and an LSTM with four cells is merely an example.

FIG. 15 depicts an example implementation of an LSTM cell 1500, which can be used for cells 1401, 1402, 1403, and 1404 in FIG. 14. LSTM cell 1500 receives input vector x(t), cell state vector c(t−1) from a preceding cell, and output vector h(t−1) from a preceding cell, and generates cell state vector c(t) and output vector h(t).

LSTM cell 1500 comprises sigmoid function devices 1501, 1502, and 1503, each of which applies a number between 0 and 1 to control how much of each component in the input vector is allowed through to the output vector. LSTM cell 1500 also comprises tanh devices 1504 and 1505 to apply a hyperbolic tangent function to an input vector, multiplier devices 1506, 1507, and 1508 to multiply two vectors together, and addition device 1509 to add two vectors together. Output vector h(t) can be provided to the next LSTM cell in the system, or it can be accessed for other purposes.

FIG. 16 depicts an LSTM cell 1600, which is an example of an implementation of LSTM cell 1500. For the reader's convenience, the same numbering from LSTM cell 1500 is used in LSTM cell 1600. Sigmoid function devices 1501, 1502, and 1503 and tanh device 1504 each comprise multiple VMM arrays 1601 and activation function blocks 1602. Thus, it can be seen that VMM arrays are particular useful in LSTM cells used in certain neural network systems. The multiplier devices 1506, 1507, and 1508 and the addition device 1509 are implemented in a digital manner or in an analog manner. The activation function blocks 1602 can be implemented in a digital manner or in an analog manner.

An alternative to LSTM cell 1600 (and another example of an implementation of LSTM cell 1500) is shown in FIG. 17. In FIG. 17, sigmoid function devices 1501, 1502, and 1503 and tanh device 1504 share the same physical hardware (VMM arrays 1701 and activation function block 1702) in a time-multiplexed fashion. LSTM cell 1700 also comprises multiplier device 1703 to multiply two vectors together, addition device 1708 to add two vectors together, tanh device 1505 (which comprises activation function block 1702), register 1707 to store the value i(t) when i(t) is output from sigmoid function block 1702, register 1704 to store the value f(t)*c(t−1) when that value is output from multiplier device 1703 through multiplexor 1710, register 1705 to store the value i(t)*u(t) when that value is output from multiplier device 1703 through multiplexor 1710, and register 1706 to store the value o(t)*c~(t) when that value is output from multiplier device 1703 through multiplexor 1710, and multiplexor 1709.

Whereas LSTM cell 1600 contains multiple sets of VMM arrays 1601 and respective activation function blocks 1602, LSTM cell 1700 contains only one set of VMM arrays 1701 and activation function block 1702, which are used to represent multiple layers in the example of LSTM cell 1700. LSTM cell 1700 will require less space than LSTM cell 1600, as LSTM cell 1700 will require ¼ as much space for VMMs and activation function blocks compared to LSTM cell 1600.

It can be further appreciated that LSTM units will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The examples described below therefore reduce the circuitry required outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

FIG. 18 depicts an example GRU 1800. GRU 1800 in this example comprises cells 1801, 1802, 1803, and 1804. Cell 1801 receives input vector $x_0$ and generates output vector $h_0$. Cell 1802 receives input vector $x_1$, the output vector $h_0$ from cell 1801 and generates output vector $h_1$. Cell 1803 receives input vector $x_2$ and the output vector (hidden state) $h_1$ from cell 1802 and generates output vector $h_2$. Cell 1804 receives input vector $x_3$ and the output vector (hidden state) $h_2$ from cell 1803 and generates output vector $h_3$. Additional cells can be used, and an GRU with four cells is merely an example.

FIG. 19 depicts an example implementation of a GRU cell 1900, which can be used for cells 1801, 1802, 1803, and 1804 of FIG. 18. GRU cell 1900 receives input vector x(t) and output vector h(t−1) from a preceding GRU cell and generates output vector h(t). GRU cell 1900 comprises sigmoid function devices 1901 and 1902, each of which applies a number between 0 and 1 to components from output vector h(t−1) and input vector x(t). GRU cell 1900 also comprises a tanh device 1903 to apply a hyperbolic tangent function to an input vector, a plurality of multiplier devices 1904, 1905, and 1906 to multiply two vectors together, an addition device 1907 to add two vectors together, and a complementary device 1908 to subtract an input from 1 to generate an output.

FIG. 20 depicts a GRU cell 2000, which is an example of an implementation of GRU cell 1900. For the reader's convenience, the same numbering from GRU cell 1900 is used in GRU cell 2000. As can be seen in FIG. 20, sigmoid function devices 1901 and 1902, and tanh device 1903 each comprise multiple VMM arrays 2001 and activation function blocks 2002. Thus, it can be seen that VMM arrays are of particular use in GRU cells used in certain neural network systems. The multiplier devices 1904, 1905, 1906, the addition device 1907, and the complementary device 1908 are implemented in a digital manner or in an analog manner. The activation function blocks 2002 can be implemented in a digital manner or in an analog manner.

An alternative to GRU cell 2000 (and another example of an implementation of GRU cell 1900) is shown in FIG. 21. In FIG. 21, GRU cell 2100 utilizes VMM arrays 2101 and activation function block 2102, which when configured as a sigmoid function applies a number between 0 and 1 to control how much of each component in the input vector is allowed through to the output vector. In FIG. 21, sigmoid function devices 1901 and 1902 and tanh device 1903 share the same physical hardware (VMM arrays 2101 and activation function block 2102) in a time-multiplexed fashion. GRU cell 2100 also comprises multiplier device 2103 to multiply two vectors together, addition device 2105 to add two vectors together, complementary device 2109 to subtract an input from 1 to generate an output, multiplexor 2104, register 2106 to hold the value h(t−1)*r(t) when that value is output from multiplier device 2103 through multiplexor 2104, register 2107 to hold the value h(t−1)*z(t) when that value is output from multiplier device 2103 through multiplexor 2104, and register 2108 to hold the value h^(t)*(1−z(t)) when that value is output from multiplier device 2103 through multiplexor 2104.

Whereas GRU cell 2000 contains multiple sets of VMM arrays 2001 and activation function blocks 2002, GRU cell 2100 contains only one set of VMM arrays 2101 and activation function block 2102, which are used to represent multiple layers in the example of GRU cell 2100. GRU cell 2100 will require less space than GRU cell 2000, as GRU cell 2100 will require ⅓ as much space for VMMs and activation function blocks compared to GRU cell 2000.

It can be further appreciated that GRU systems will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The examples described below therefore reduce the circuitry required outside of the VMM arrays themselves.

The input to the VMM arrays can be an analog level, a binary level, a pulse, a time modulated pulse, or digital bits (in this case a DAC is needed to convert digital bits to appropriate input analog level) and the output can be an analog level, a binary level, a timing pulse, pulses, or digital bits (in this case an output ADC is needed to convert output analog level into digital bits).

In general, for each memory cell in a VMM array, each weight W can be implemented by a single memory cell or by a differential cell or by two blend memory cells (average of 2 cells).

In the differential cell case, two memory cells are needed to implement a weight W as a differential weight (W=W+−W−). In the two blend memory cells, two memory cells are needed to implement a weight W as an average of two cells.

FIG. 31 depicts VMM system 3100. In some examples, the weights, W, stored in a VMM array are stored as differential pairs, W+ (positive weight) and W− (negative weight), where W=(W+)−(W−). In VMM system 3100, half of the bit lines are designated as W+ lines, that is, bit lines connecting to memory cells that will store positive weights W+, and the other half of the bit lines are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3101 and 3102. The output of a W+ line and the output of a W− line are combined together to give effectively W=W+−W− for each pair of (W+, W−) cells for all pairs of (W+, W−) lines. While the above has been described in relation to W− lines interspersed among the W+ lines in an alternating fashion, in other examples W+ lines and W− lines can be arbitrarily located anywhere in the array.

FIG. 32 depicts another example. In VMM system 3210, positive weights W+ are implemented in first array 3211 and negative weights W− are implemented in a second array 3212, second array 3212 separate from the first array, and the resulting weights are appropriately combined together by summation circuits 3213.

FIG. 33 depicts VMM system 3300. the weights, W, stored in a VMM array are stored as differential pairs, W+(positive weight) and W− (negative weight), where W=(W+)−(W−). VMM system 3300 comprises array 3301 and array 3302. Half of the bit lines in each of array 3301 and 3302 are designated as W+ lines, that is, bit lines connecting to memory cells that will store positive weights W+, and the other half of the bit lines in each of array 3301 and 3302 are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3303, 3304, 3305, and 3306. The output of a W+ line and the output of a W− line from each array 3301, 3302 are respectively combined together to give effectively W=W+−W− for each pair of (W+, W−) cells for all pairs of (W+, W−) lines. In addition, the W values from each array 3301 and 3302 can be further combined through summation circuits 3307 and 3308, such that each W value is the result of a W value from array 3301 minus a W value from array 3302, meaning that the end result from summation circuits 3307 and 3308 is a differential value of two differential values.

Each non-volatile memory cell used in the analog neural memory system is to be erased and programmed to hold a very specific and precise amount of charge, i.e., the number of electrons, in the floating gate. For example, each floating gate should hold one of N different values, where N is the number of different weights that can be indicated by each cell. Examples of N include 16, 32, 64, 128, and 256.

It is desirable to reduce latency in programming operations to increase the overall speed of operation of the artificial neural network.

SUMMARY OF THE INVENTION

Numerous examples are disclosed of programming multiple rows in an array in an artificial neural network as part of a single programming operation.

BRIEF DESCRIPTION OF THE DRAWINGS

FIGS. 36A, 36B, 36C, and 36D depict example programming waveforms for consecutive rows.

DETAILED DESCRIPTION OF THE INVENTION

VMM System Architecture

Figure 1:
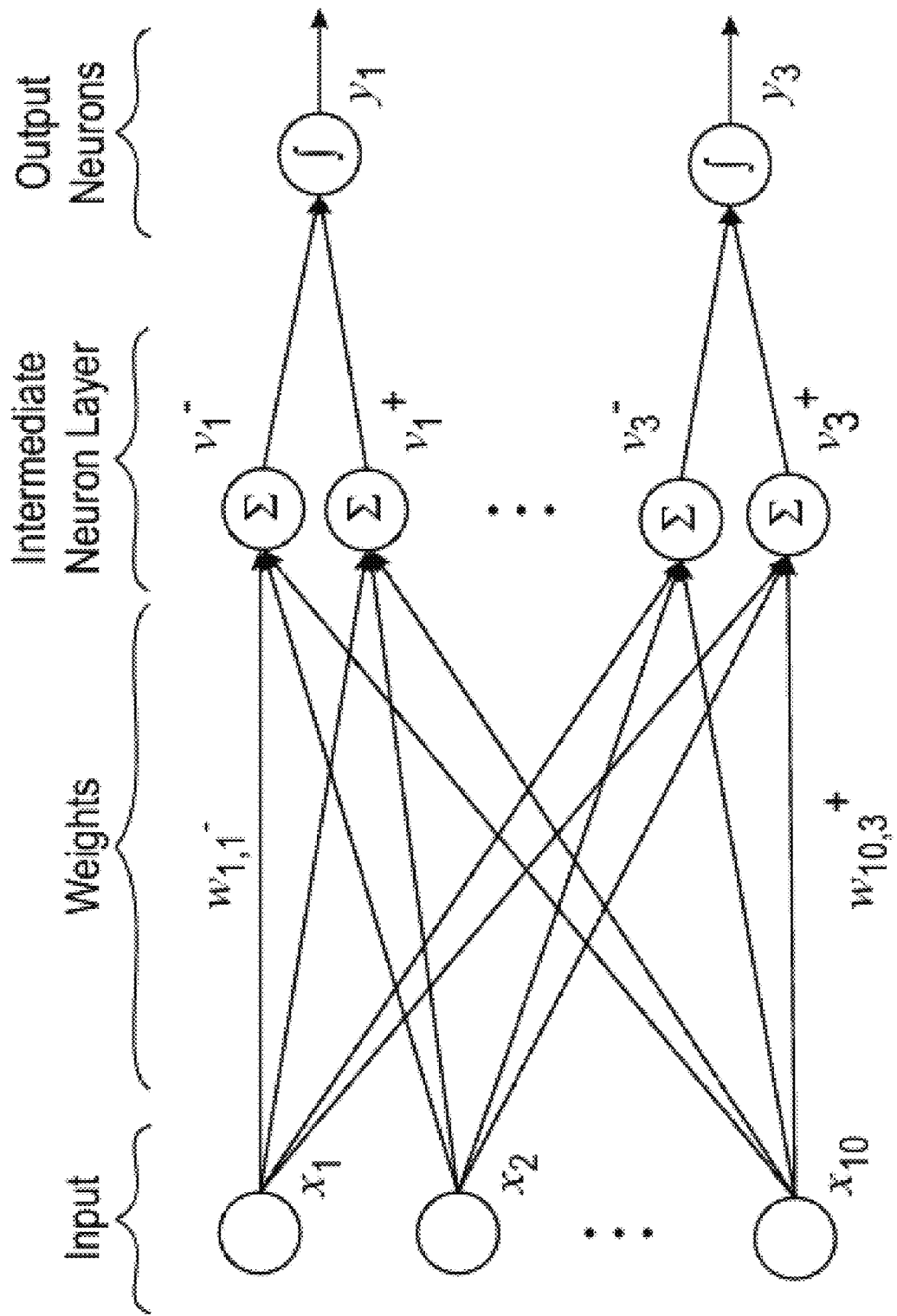
FIG. 1 is a diagram that illustrates an artificial neural network.
Figure 2:
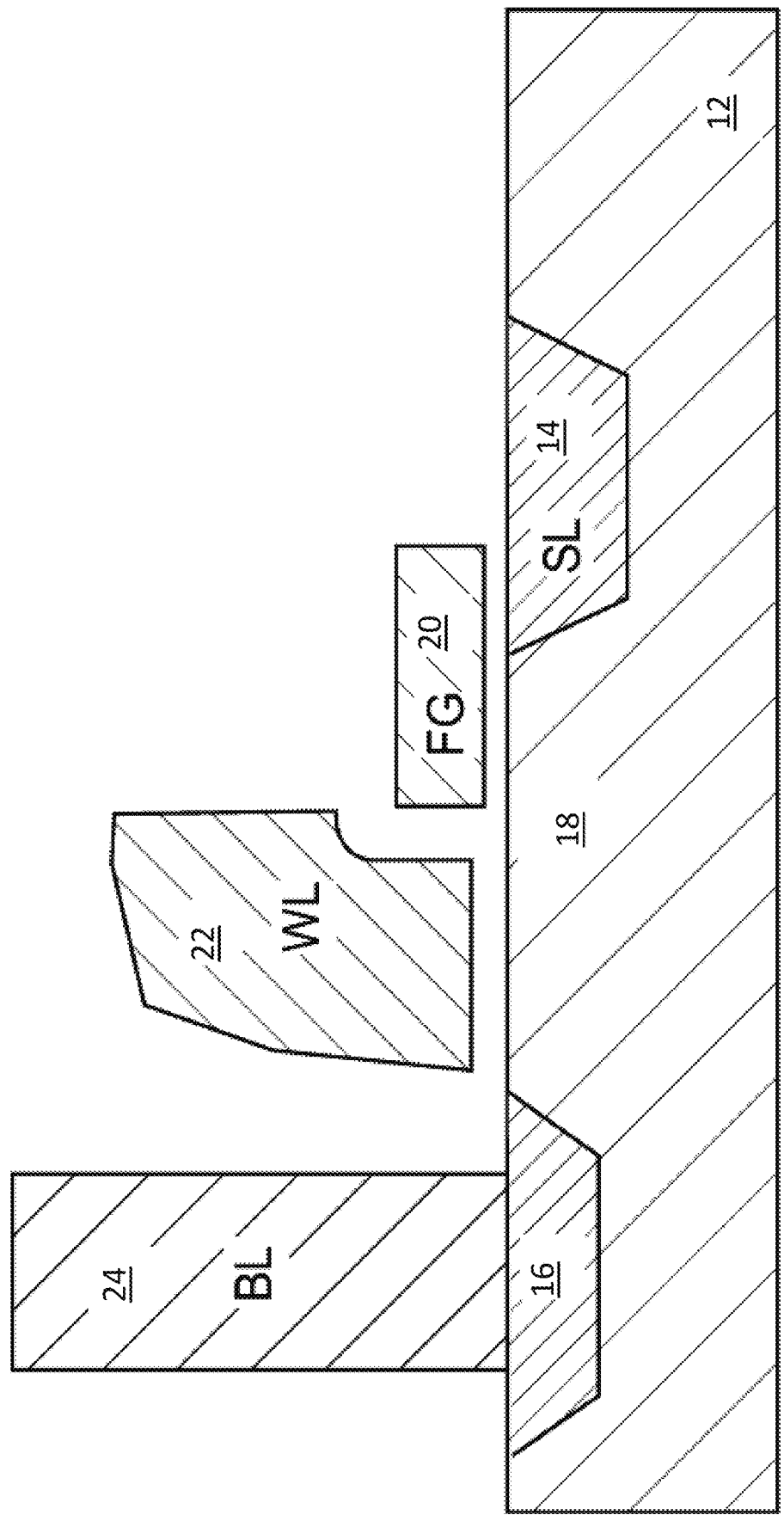
FIG. 2 depicts a prior art split gate flash memory cell.
Figure 3:
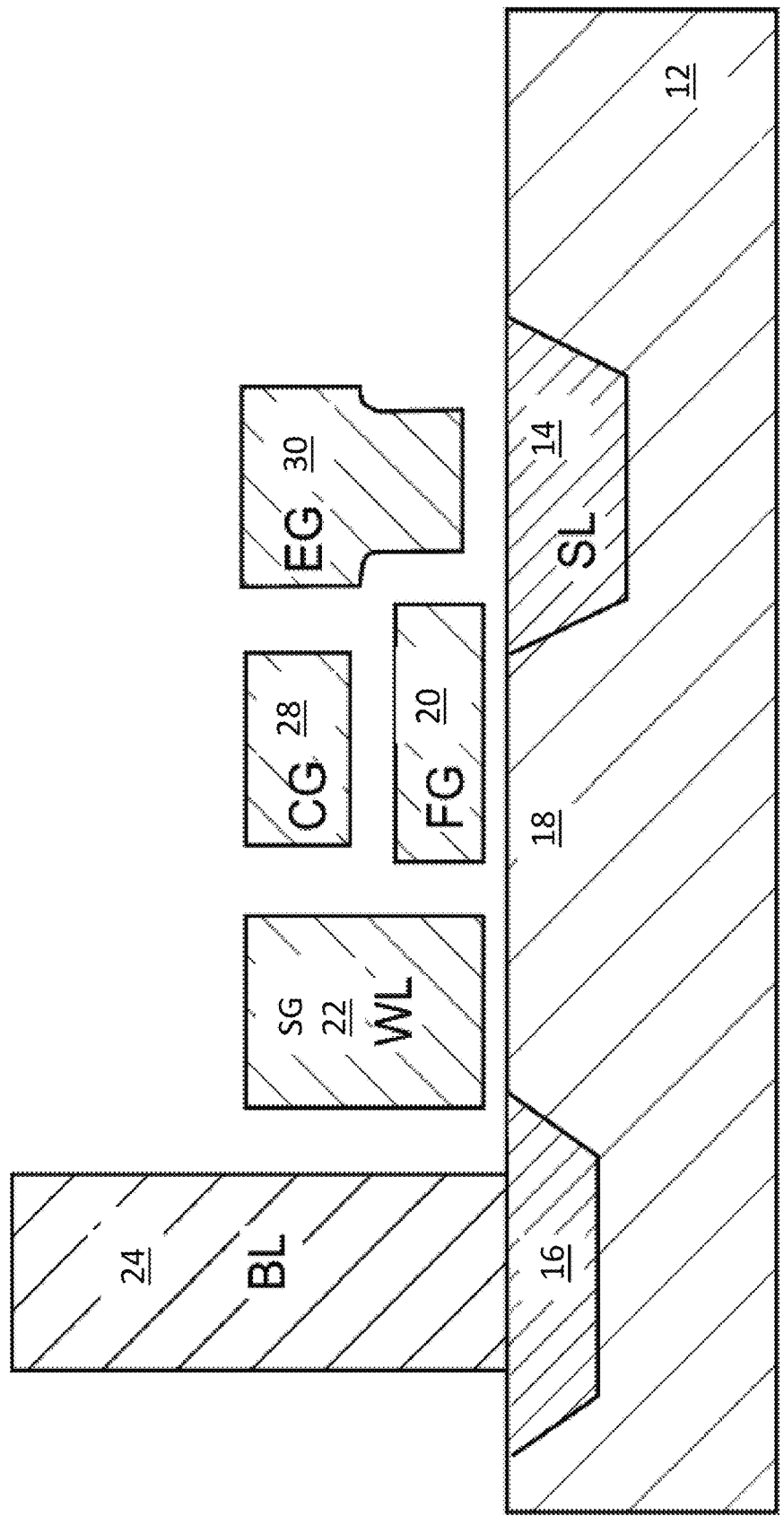
FIG. 3 depicts another prior art split gate flash memory cell.
Figure 4:
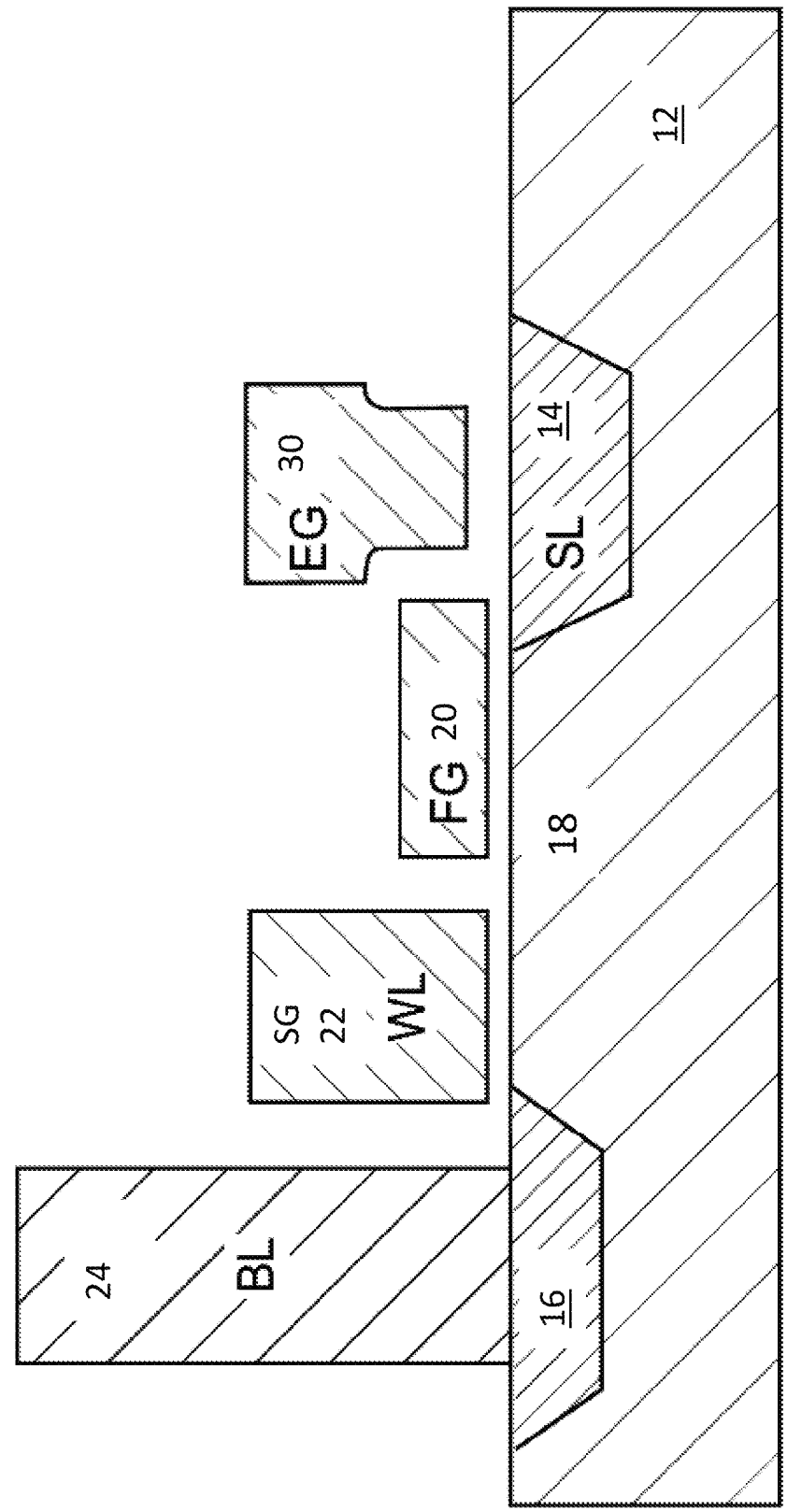
FIG. 4 depicts another prior art split gate flash memory cell.
Figure 5:
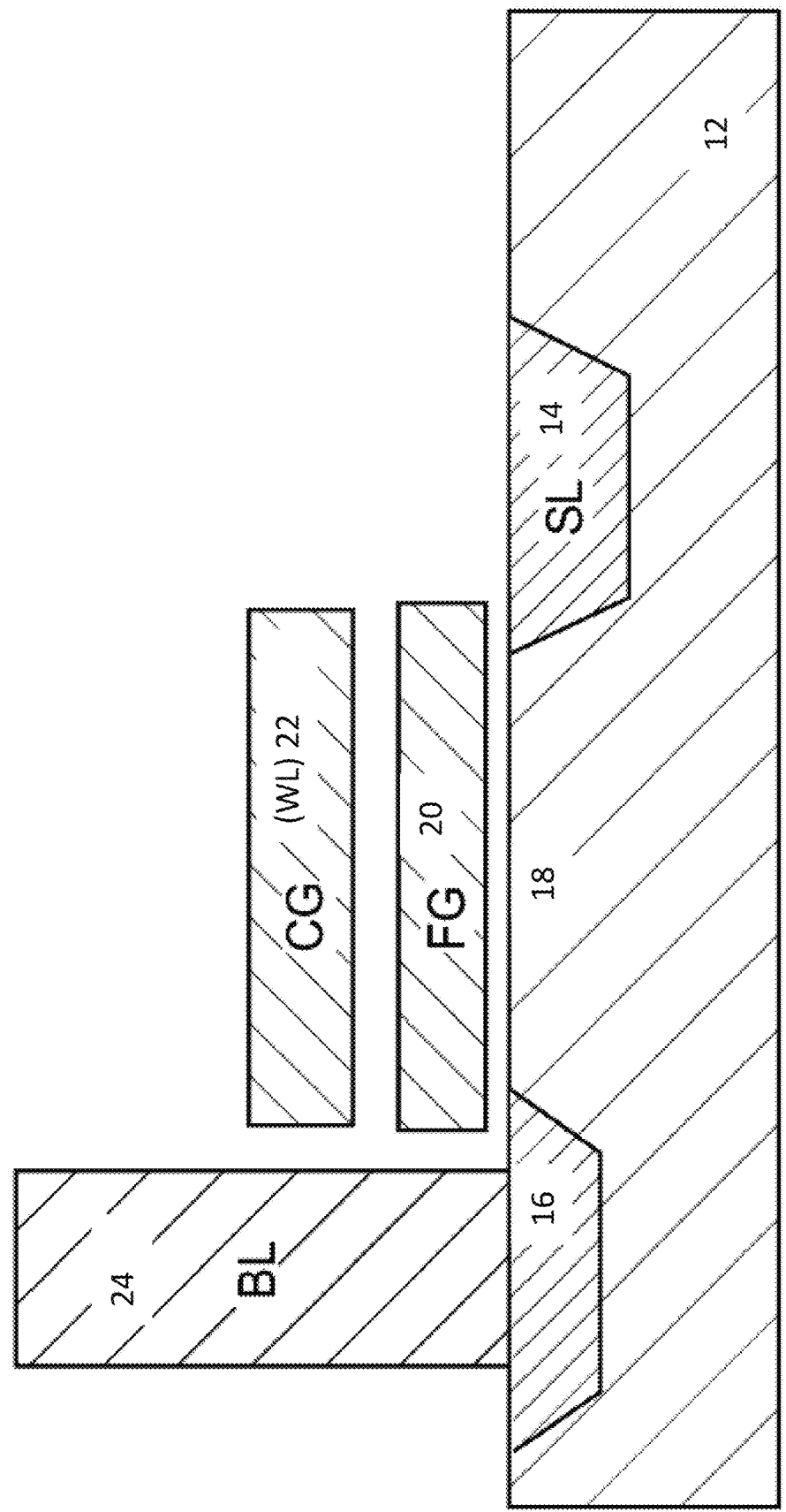
FIG. 5 depicts another prior art split gate flash memory cell.
Figure 6:
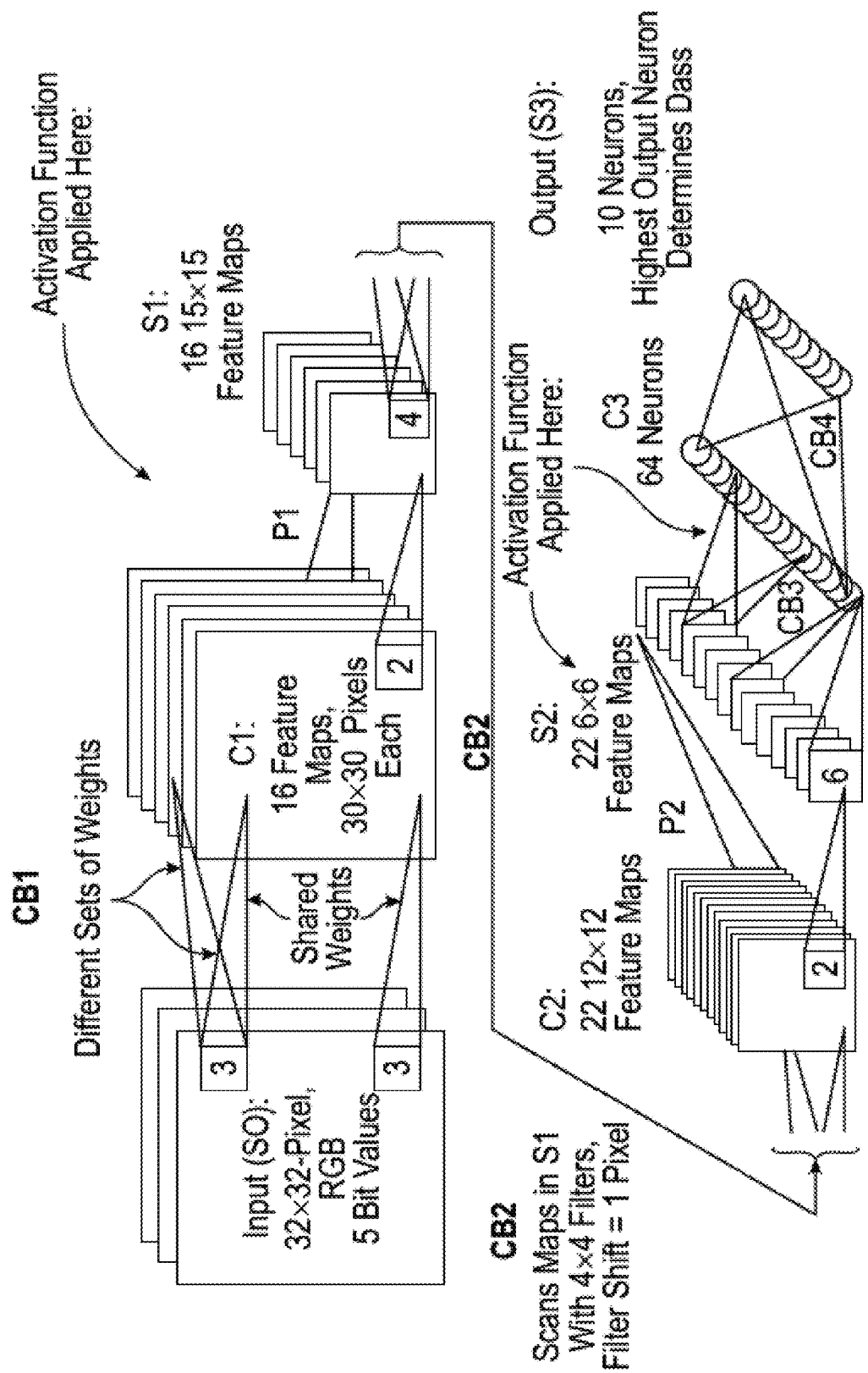
FIG. 6 is a diagram illustrating the different levels of an exemplary artificial neural network utilizing one or more non-volatile memory arrays.
Figure 7:
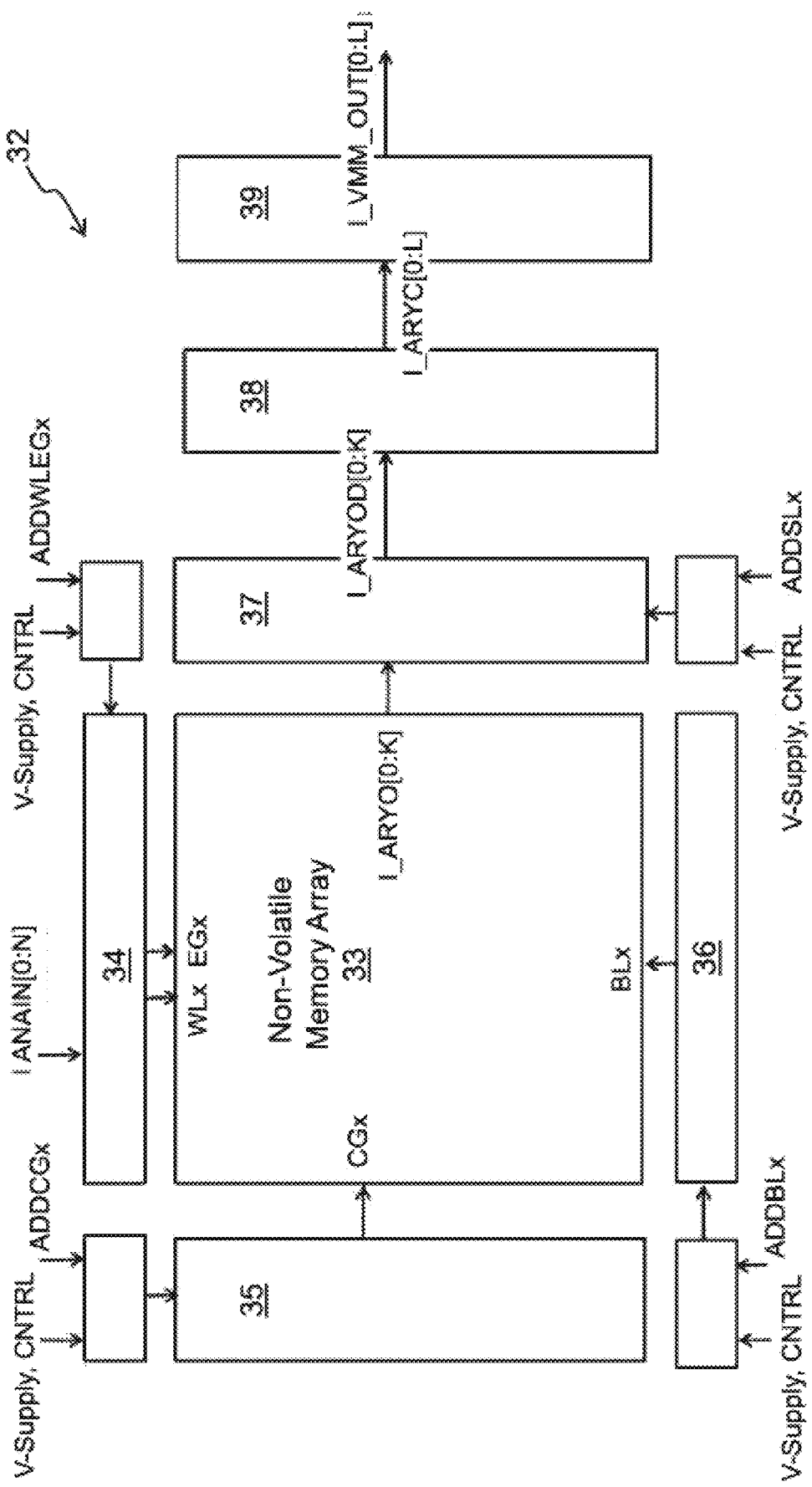
FIG. 7 is a block diagram illustrating a VMM system.
Figure 8:
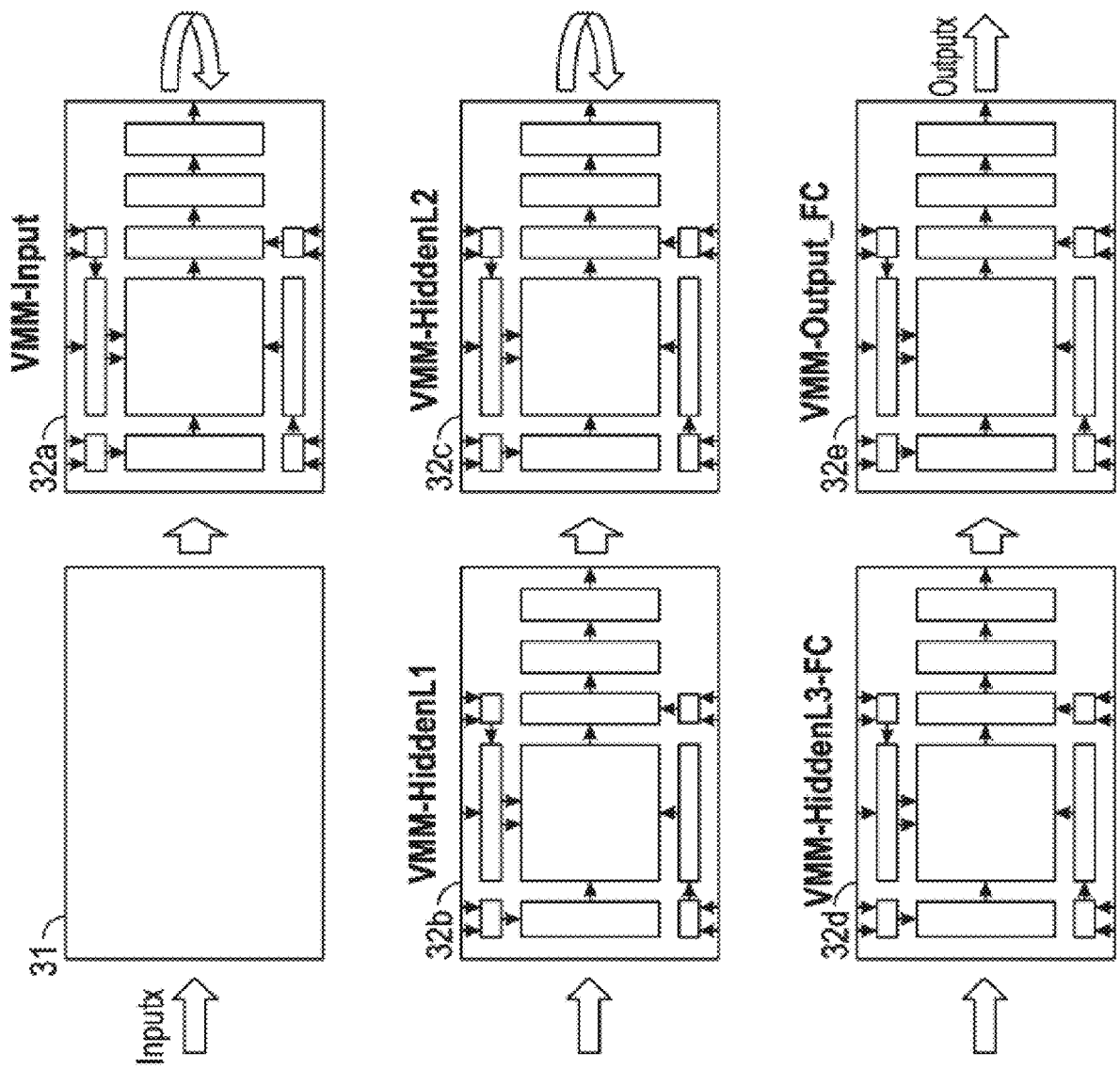
FIG. 8 is a block diagram illustrates an example artificial neural network utilizing one or more VMM systems.
Figure 9:
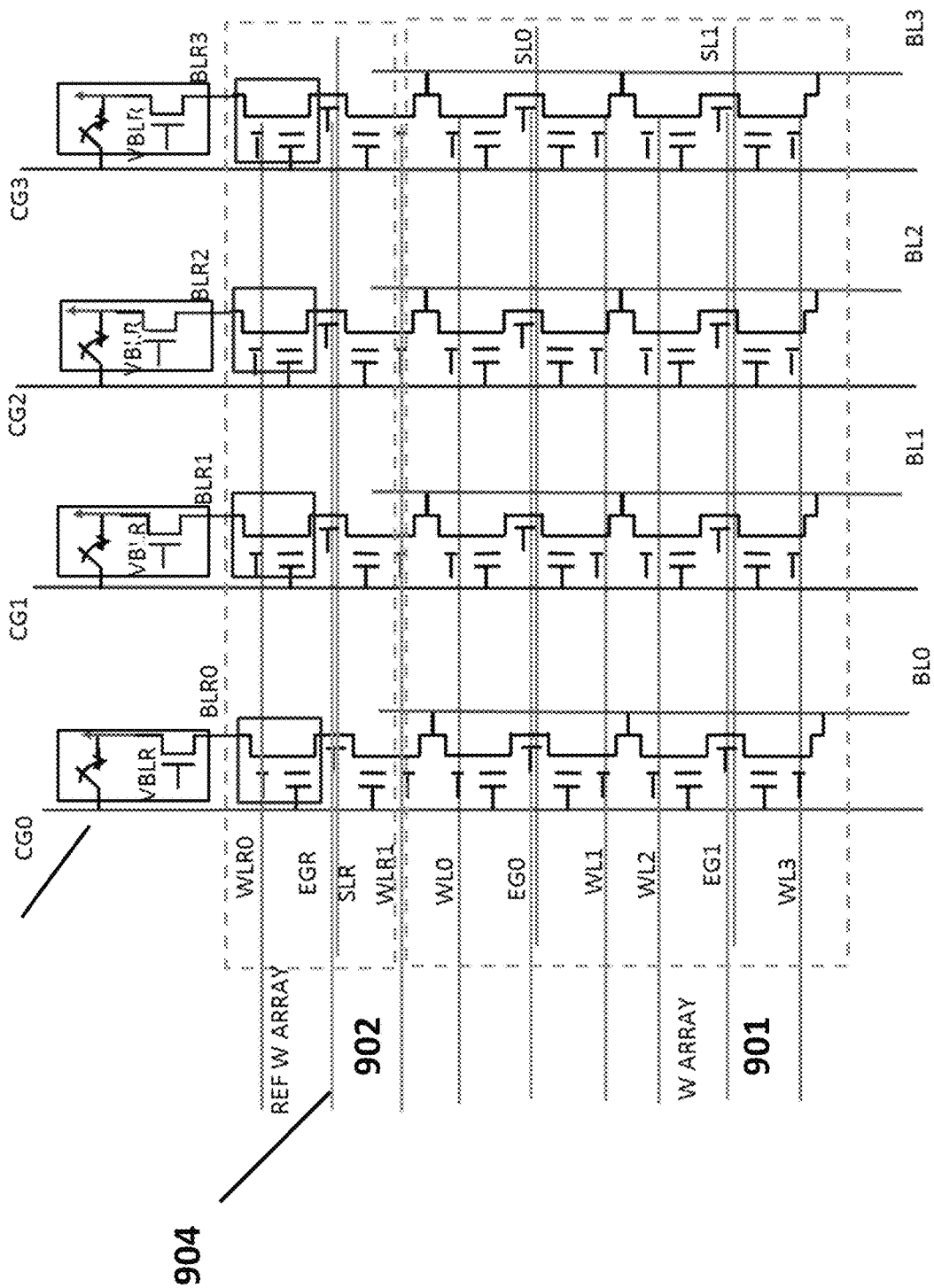
FIG. 9 depicts another example of a VMM system.
Figure 10:
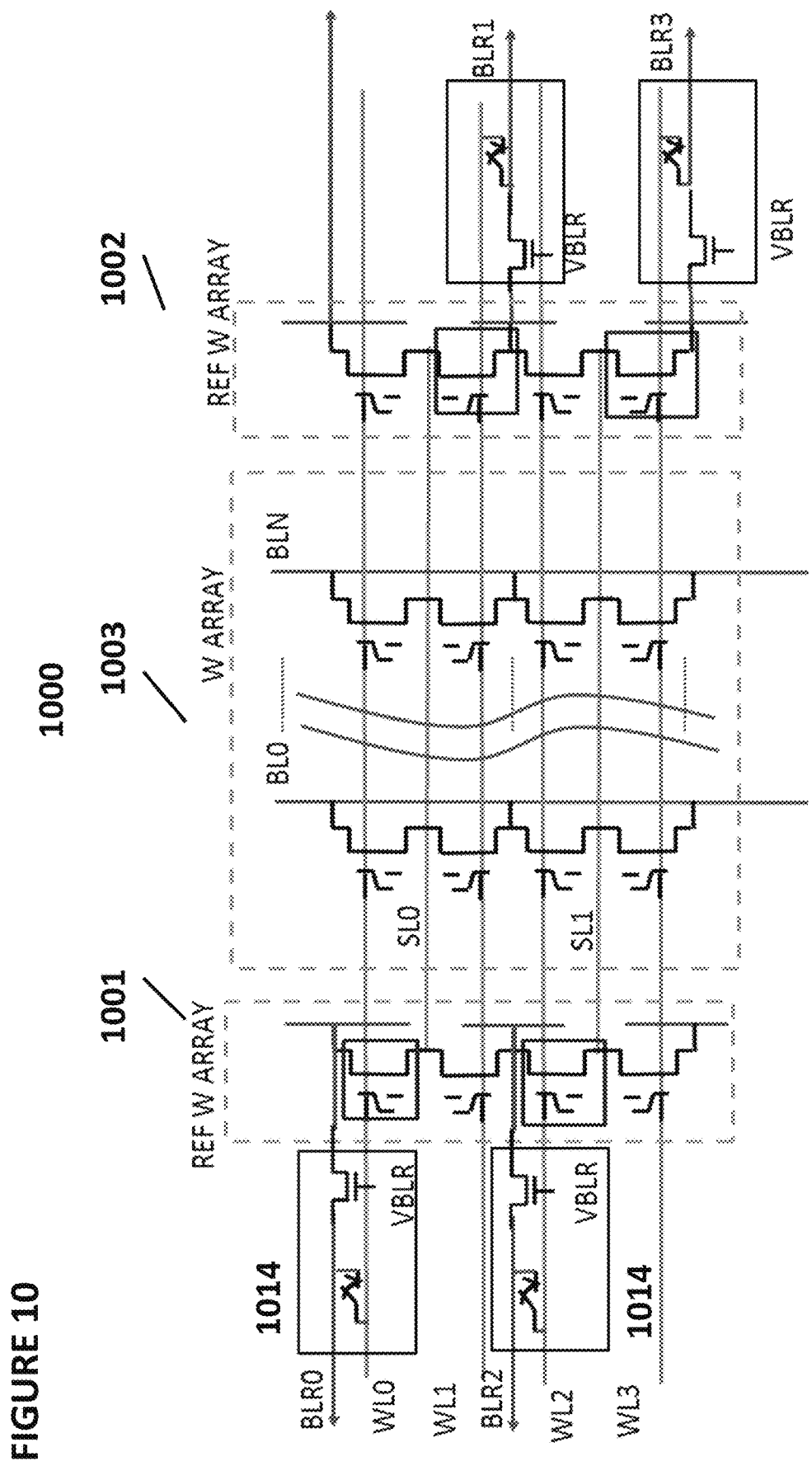
FIG. 10 depicts another example of a VMM system.
Figure 11:
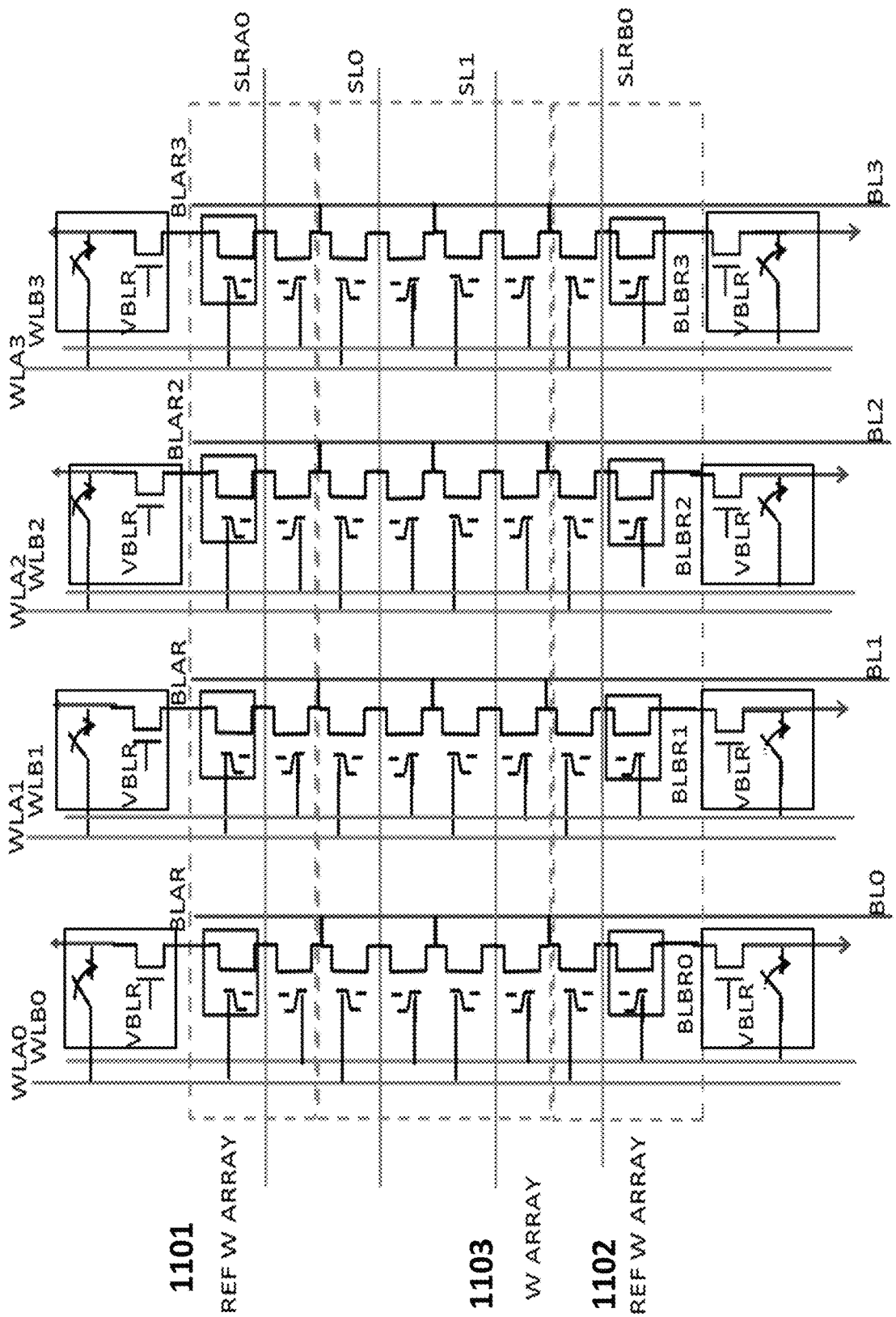
FIG. 11 depicts another example of a VMM system.
Figure 12:
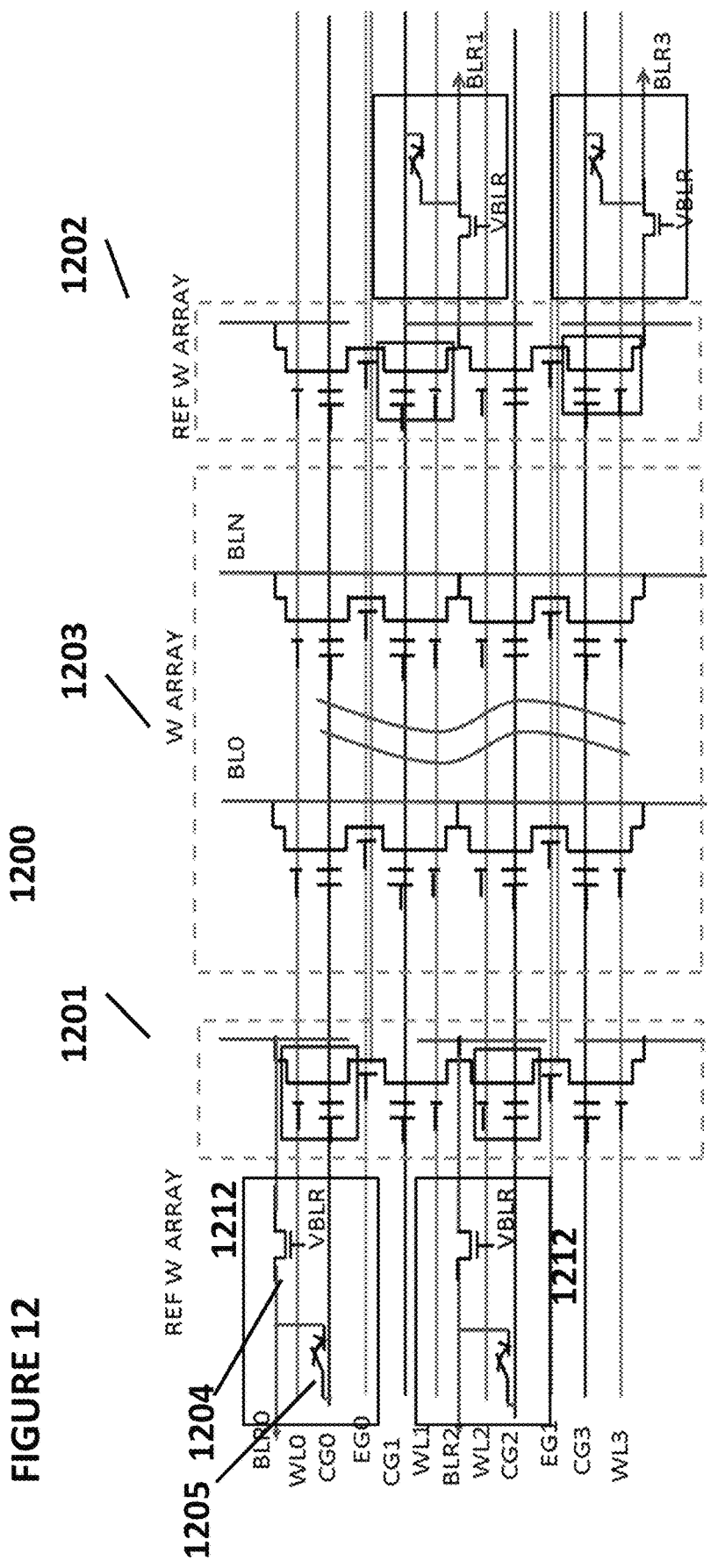
FIG. 12 depicts another example of a VMM system.
Figure 13:
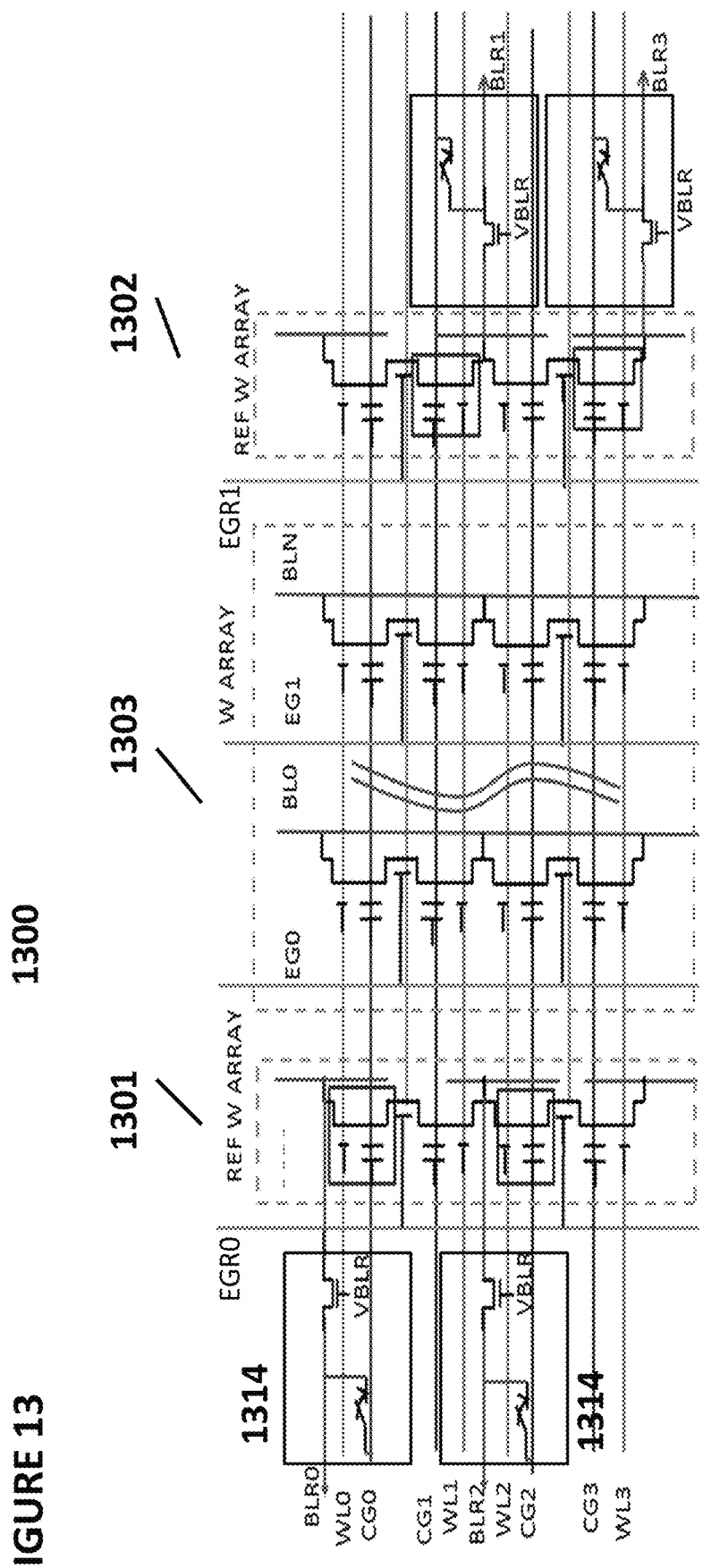
FIG. 13 depicts another example t of a VMM system.
Figure 14:
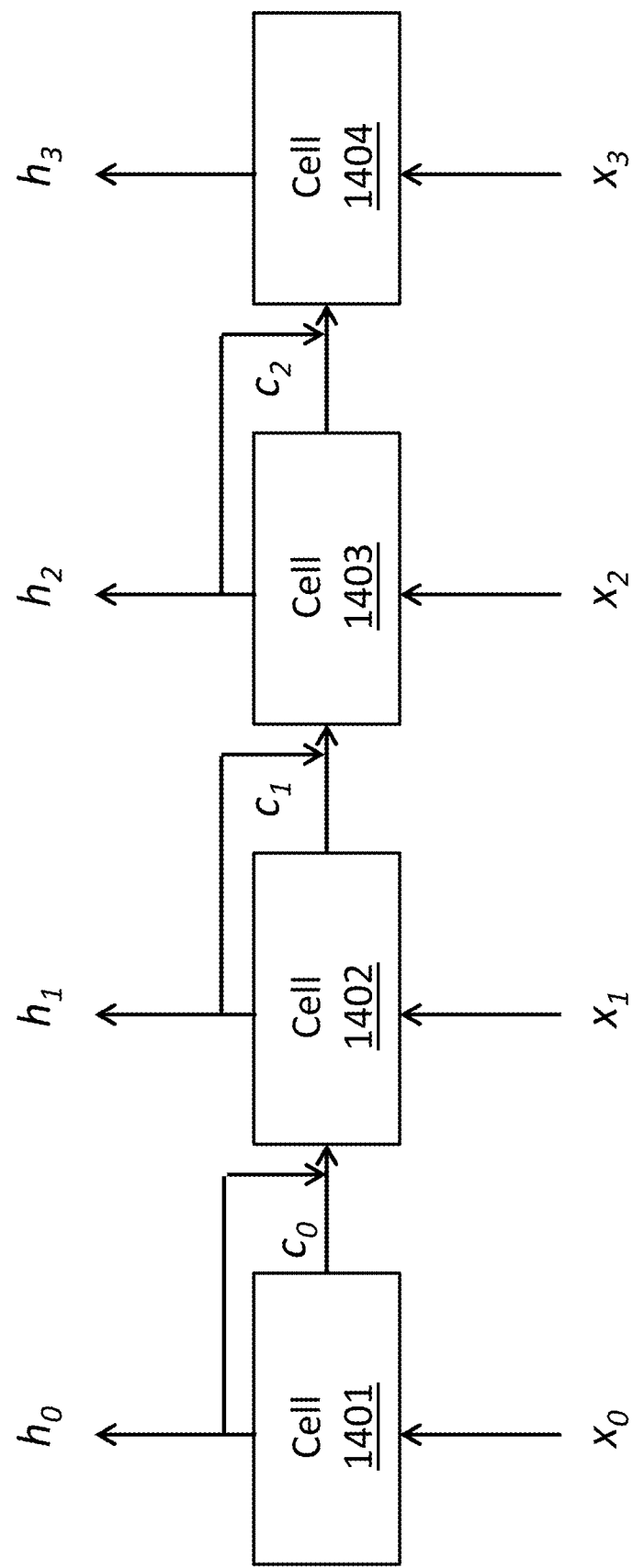
FIG. 14 depicts a prior art long short-term memory system.
Figure 15:
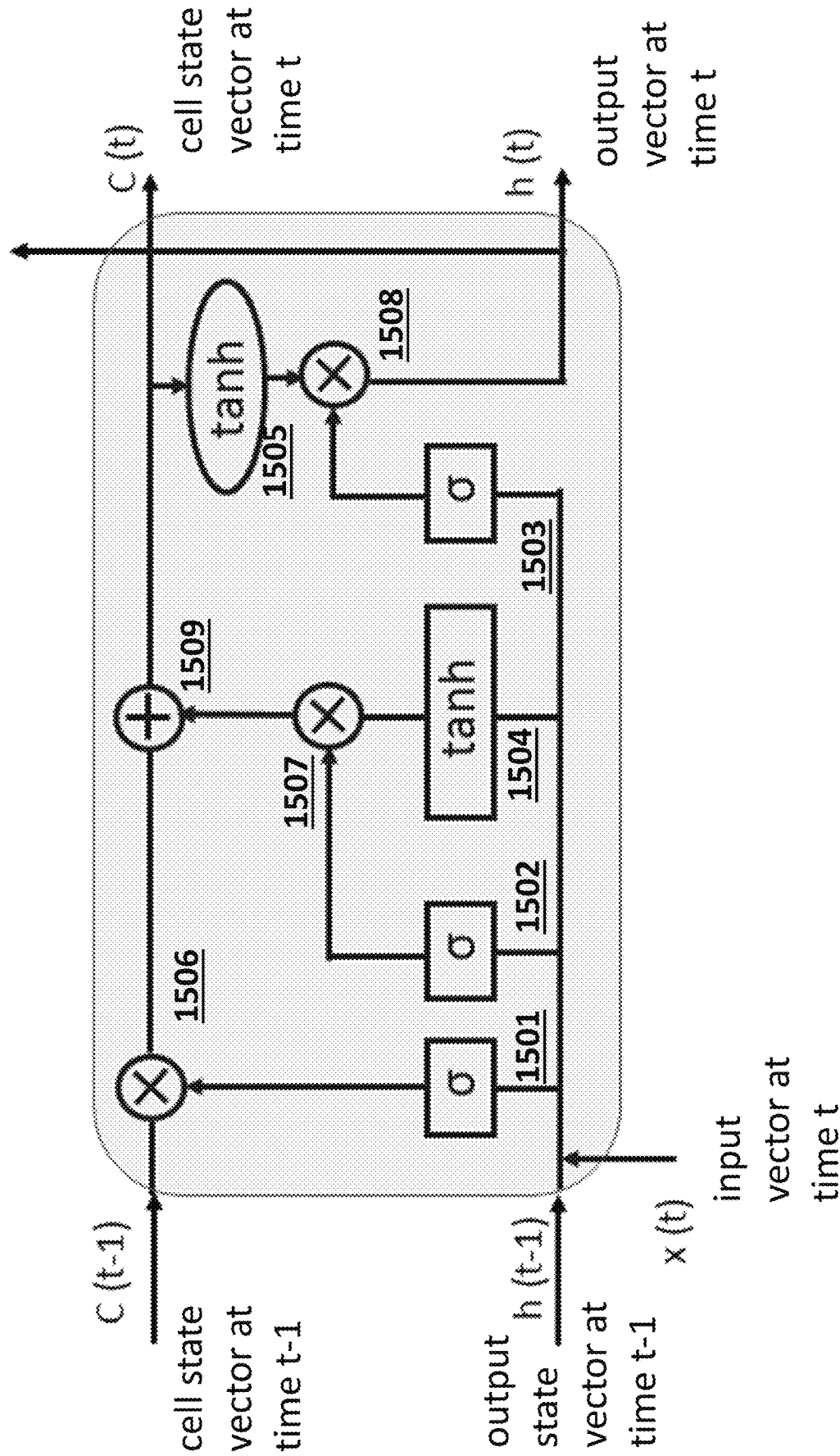
FIG. 15 depicts an example cell for use in a long short-term memory system.
Figure 16:
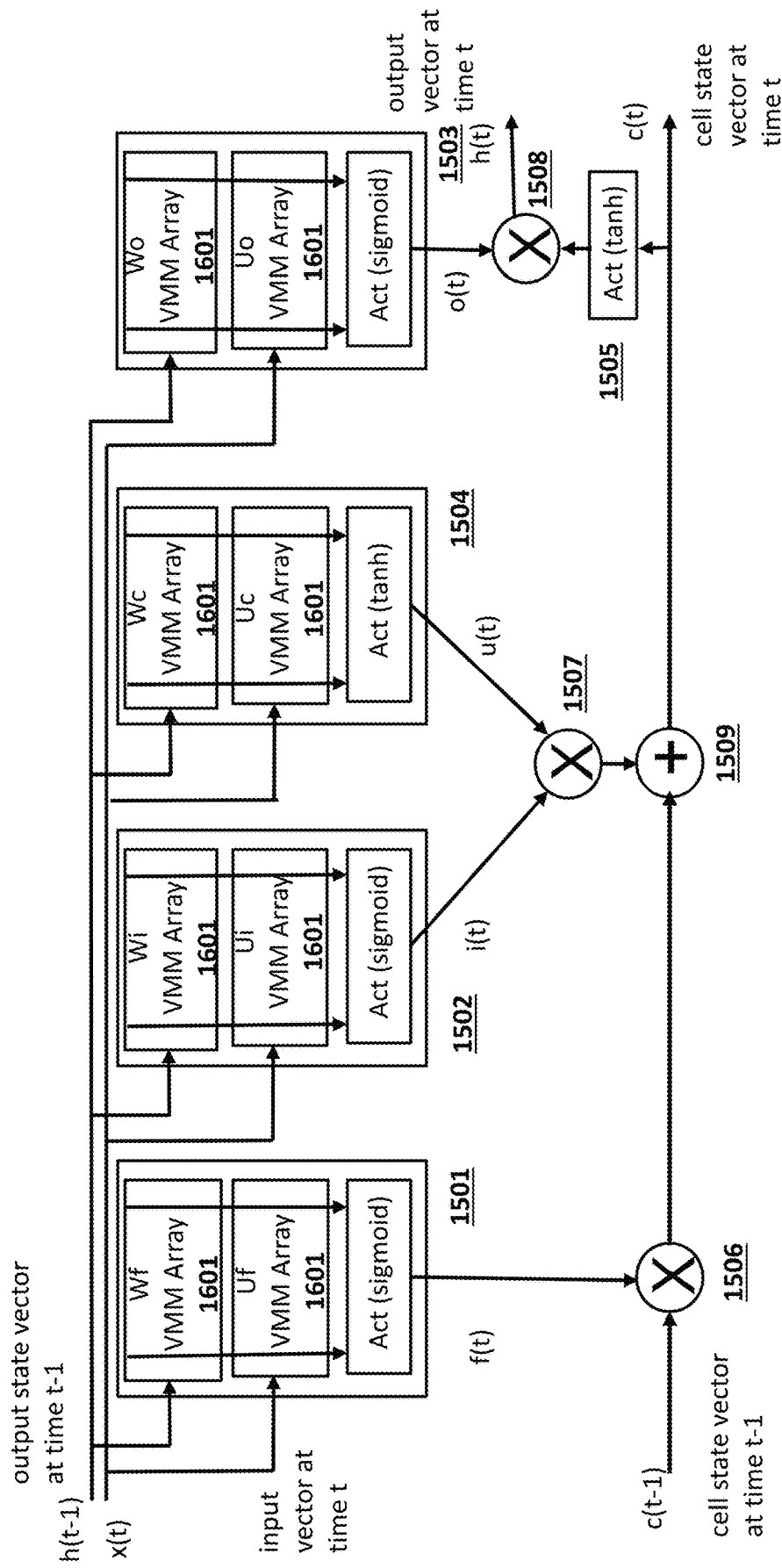
FIG. 16 depicts an example implementation of the cell of FIG. 15.
Figure 17:
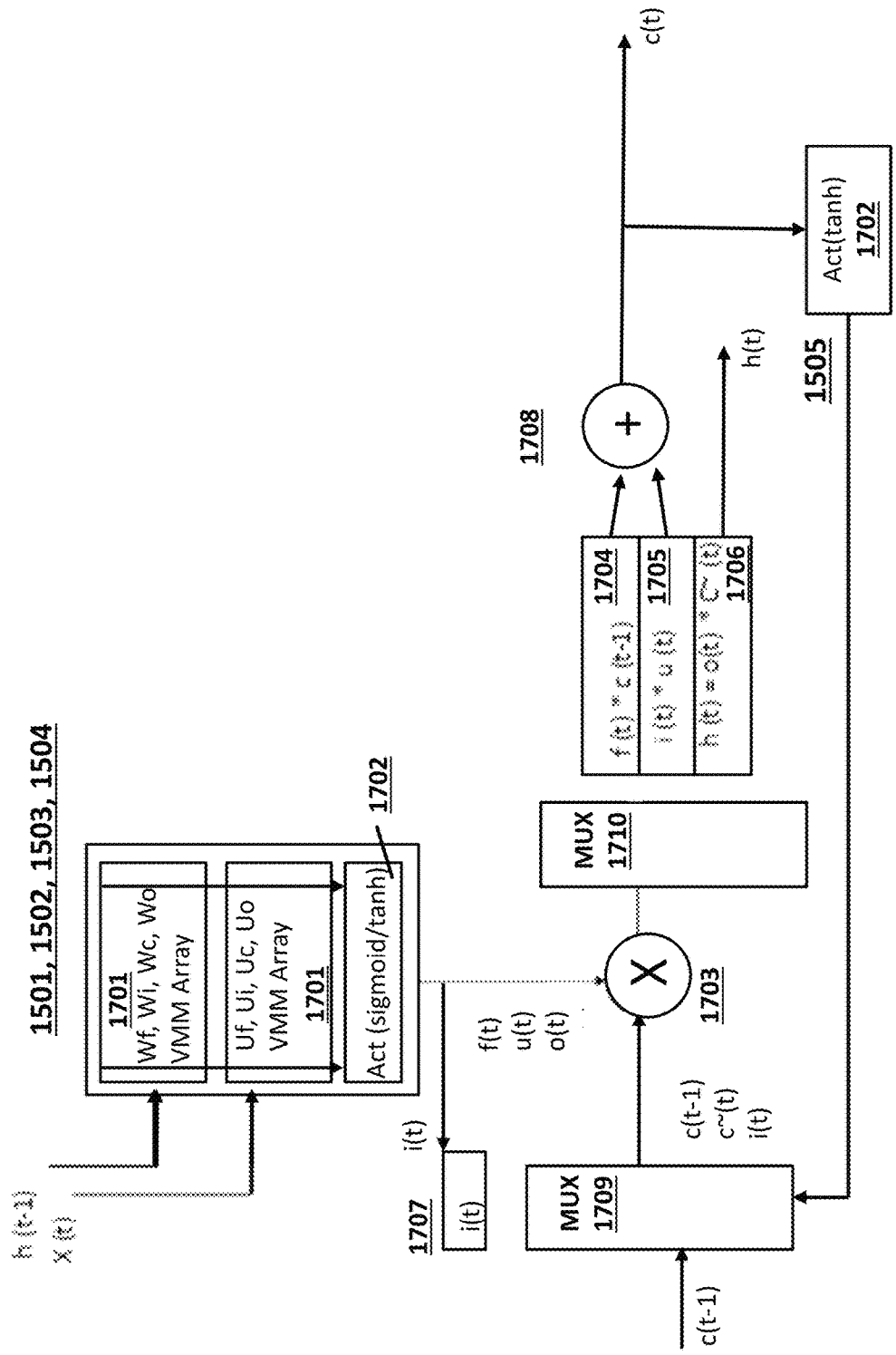
FIG. 17 depicts another example implementation of the cell of FIG. 15.
Figure 18:
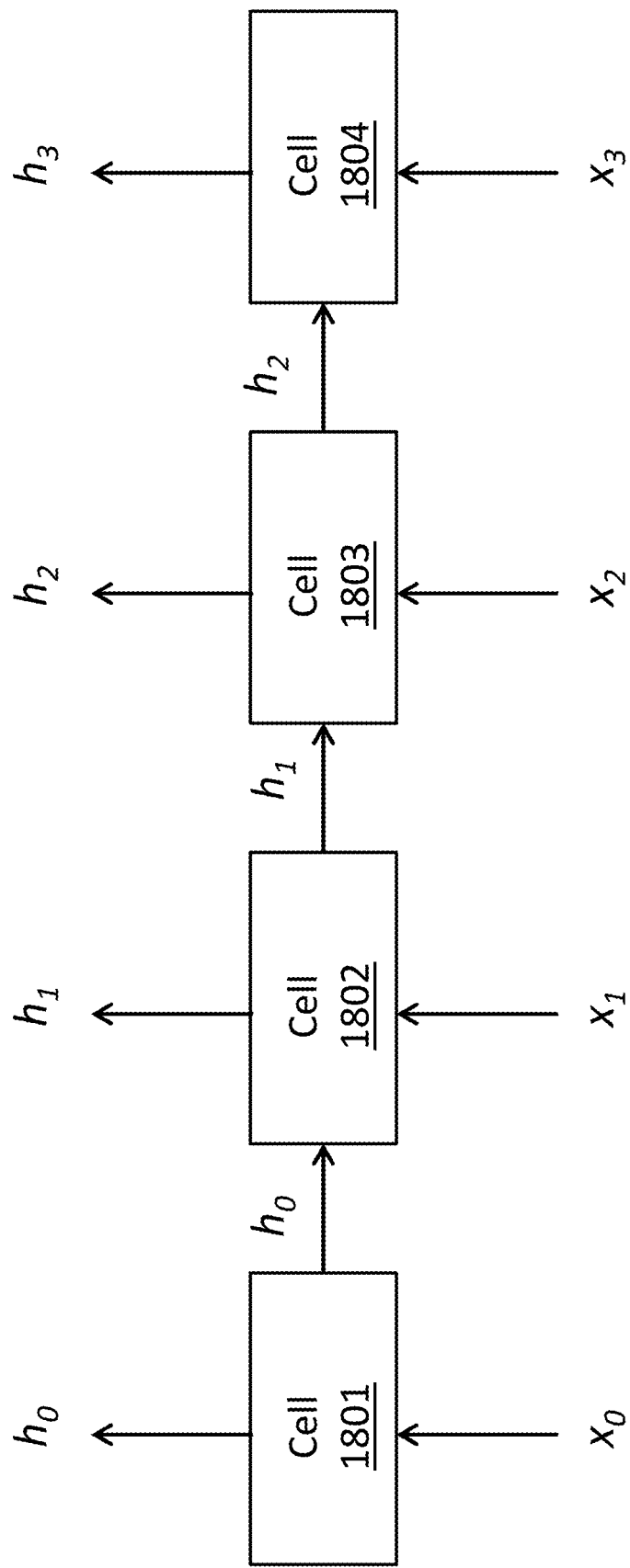
FIG. 18 depicts a prior art gated recurrent unit system.
Figure 19:
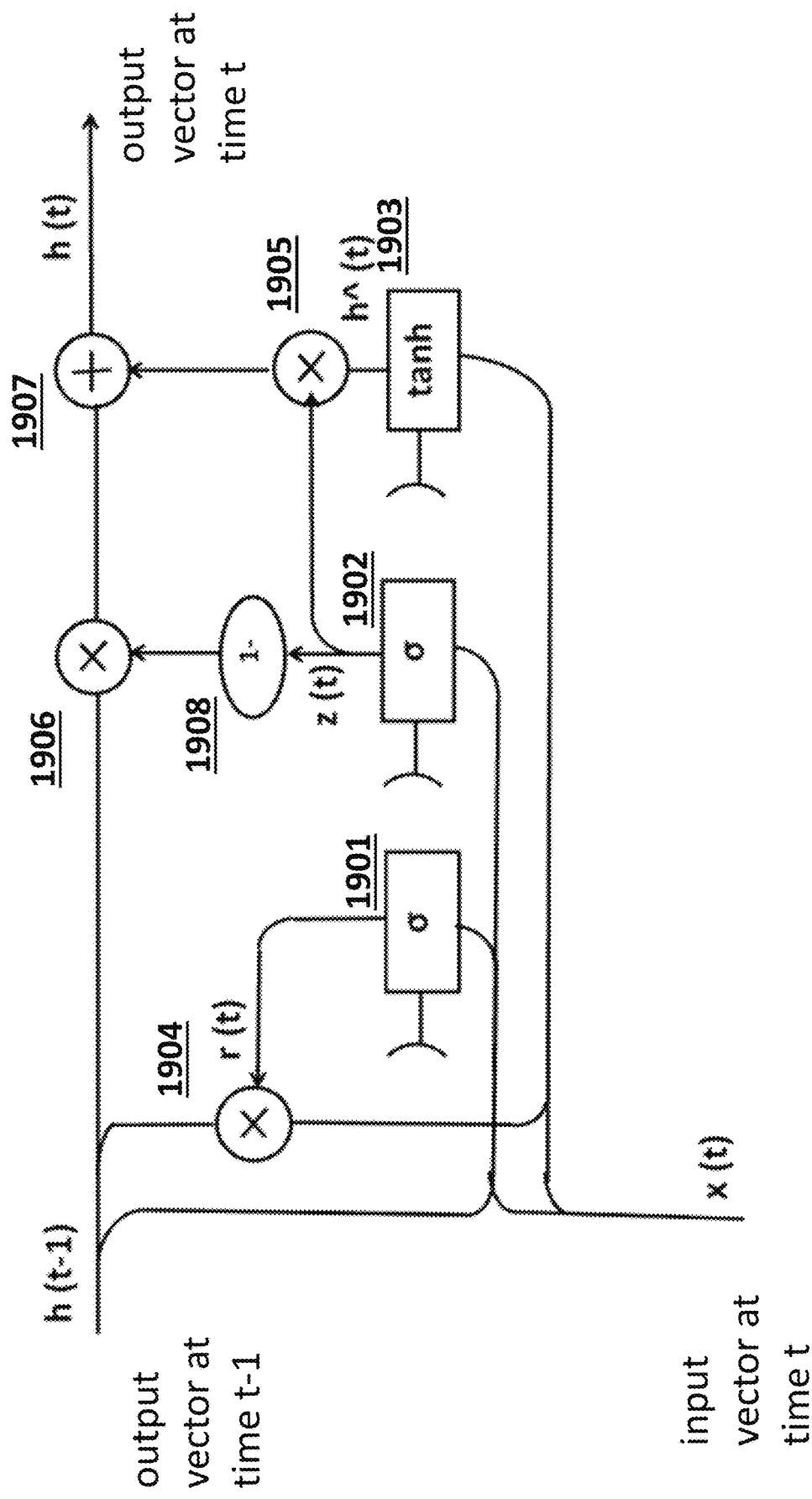
FIG. 19 depicts an example cell for use in a gated recurrent unit system.
Figure 20:
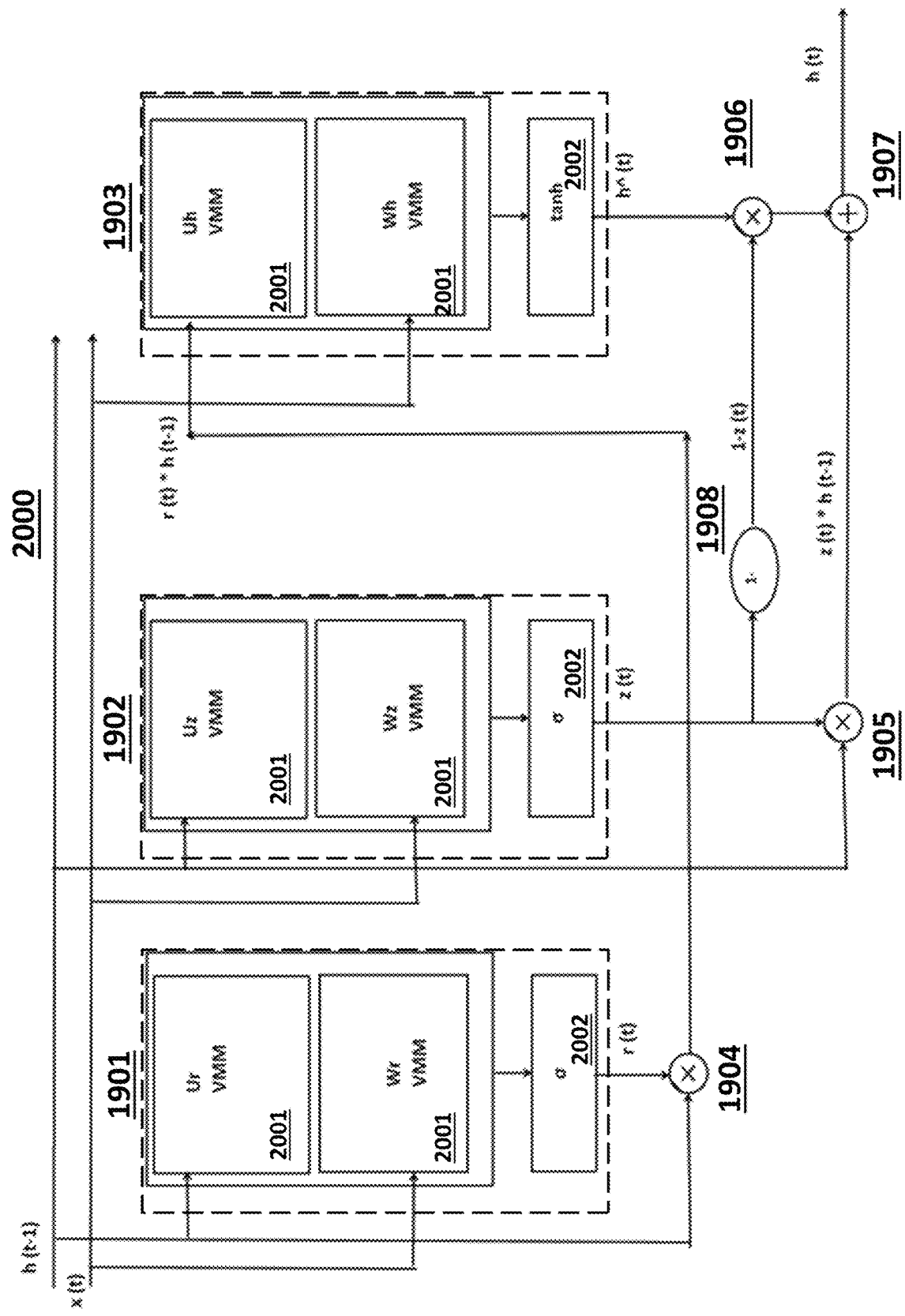
FIG. 20 depicts an example implementation t of the cell of FIG. 19.
Figure 21:
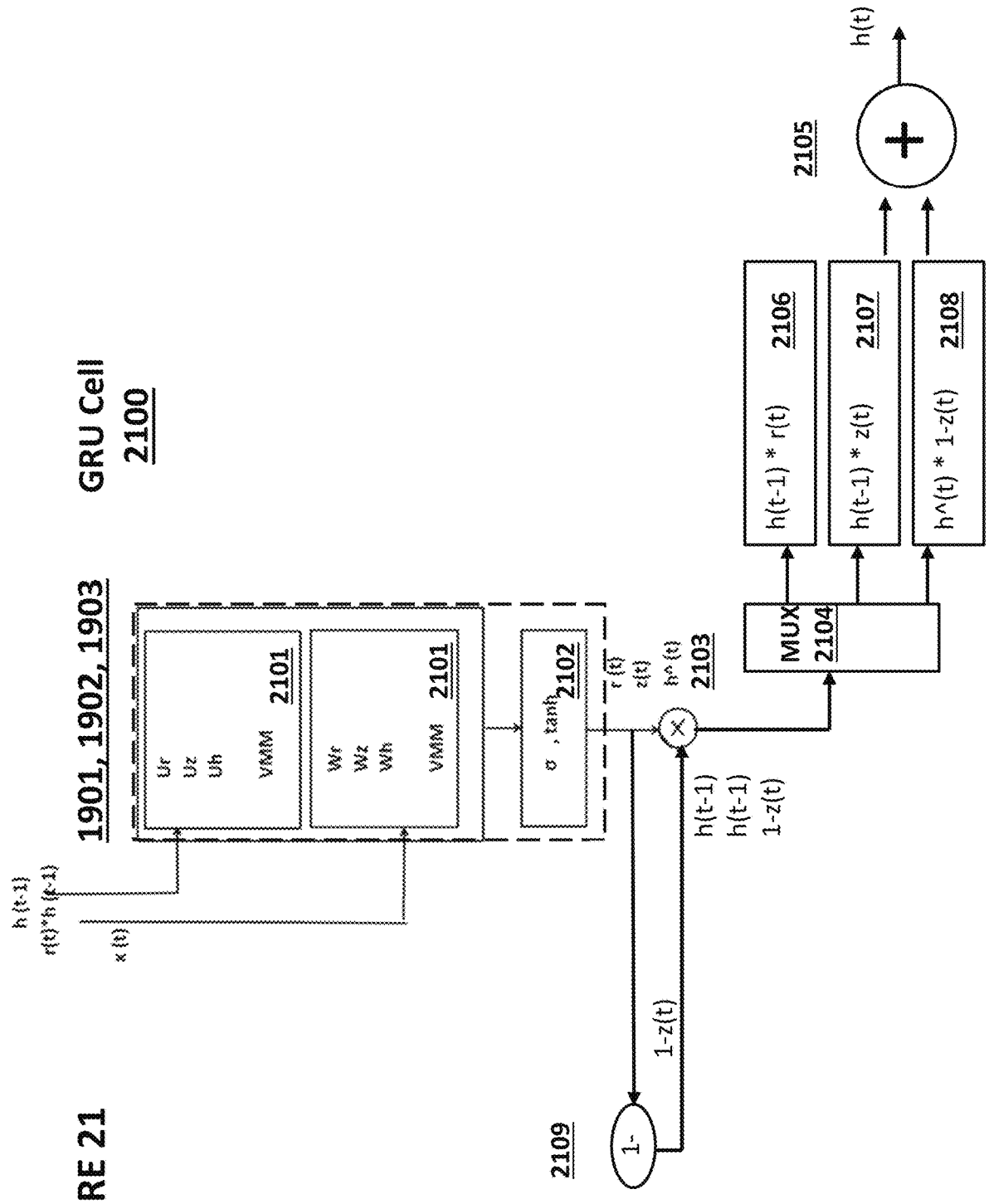
FIG. 21 depicts another example implementation of the cell of FIG. 19.
Figure 22:
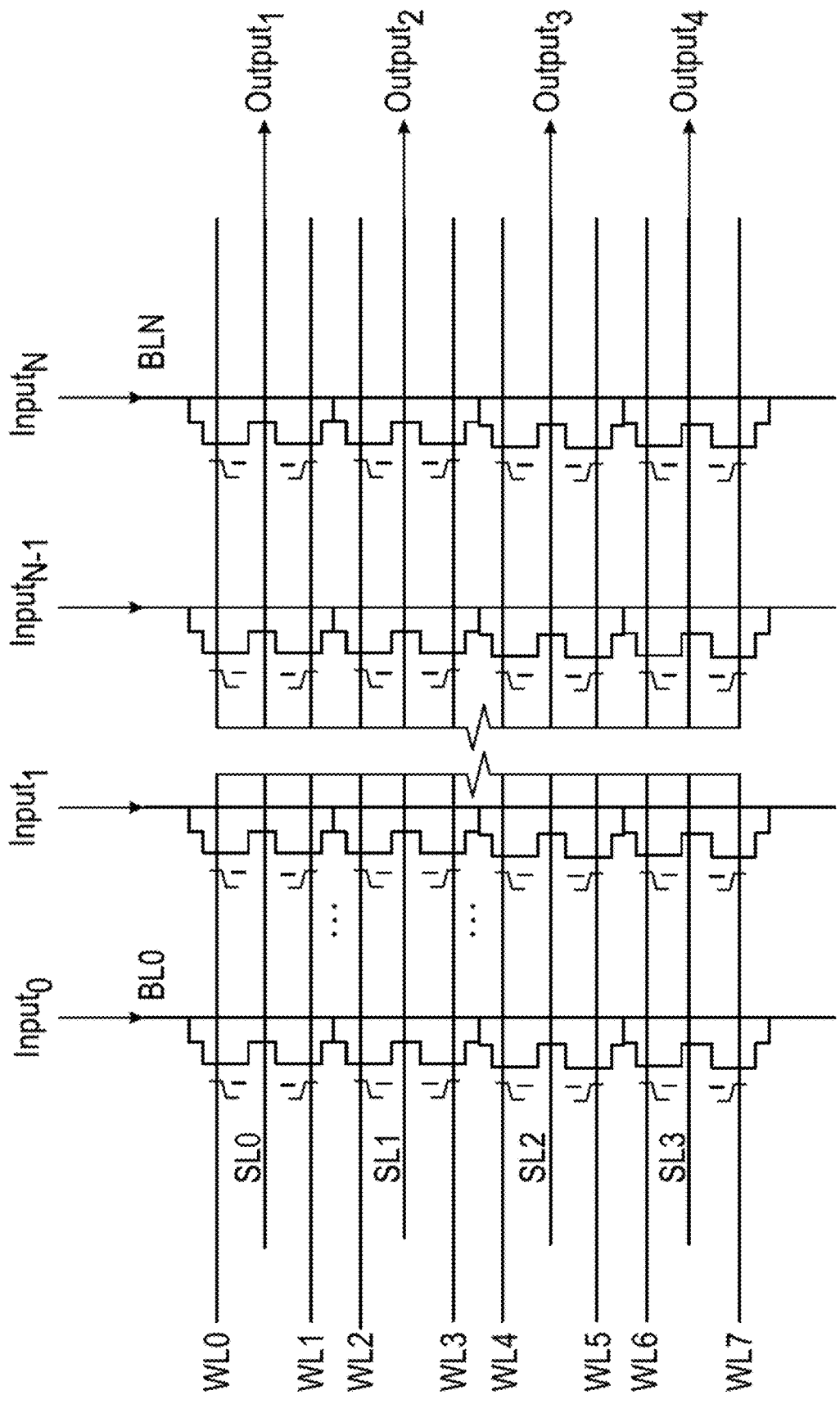
FIG. 22 depicts another example of a VMM system.
Figure 23:
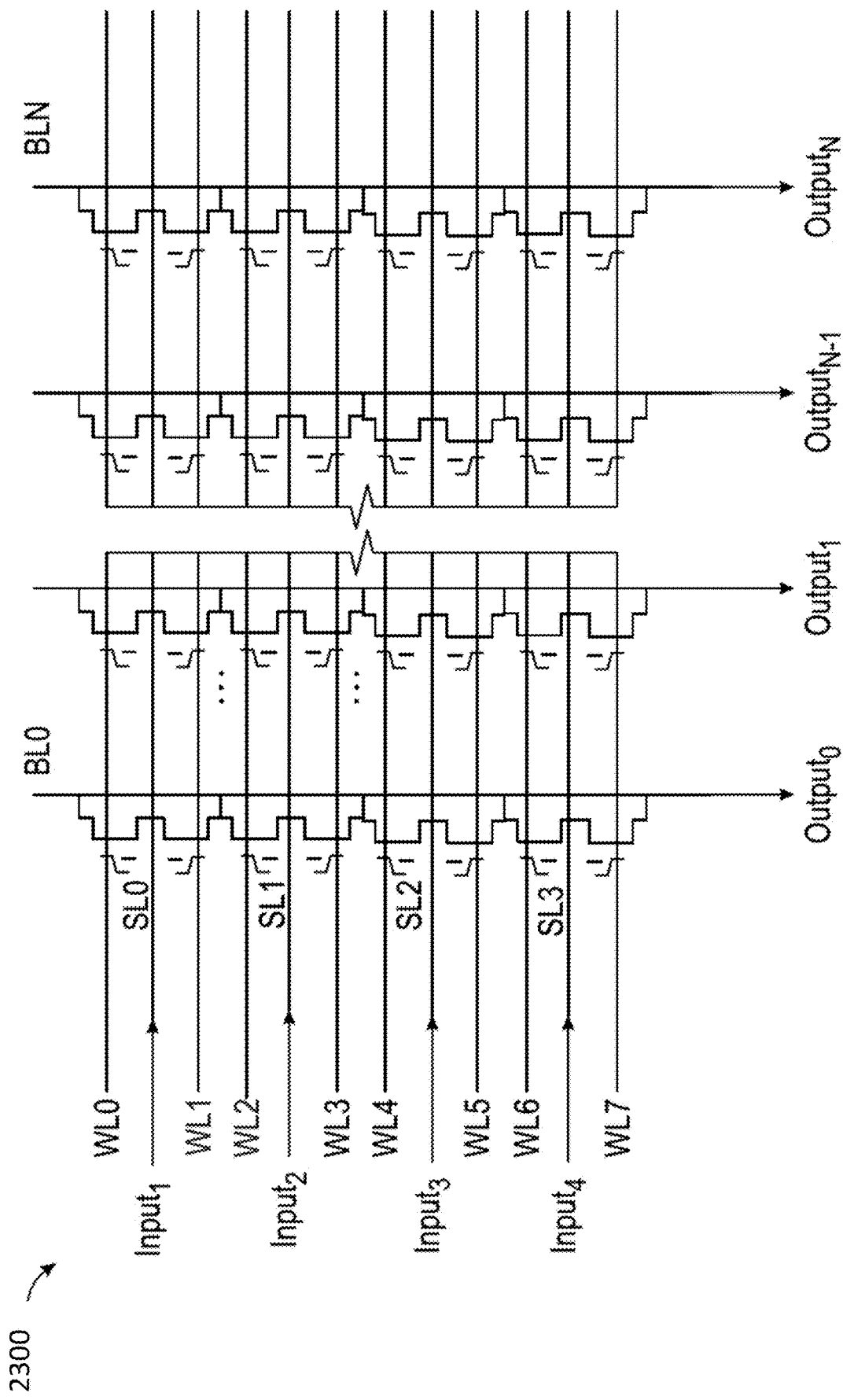
FIG. 23 depicts another example of a VMM system.
Figure 24:
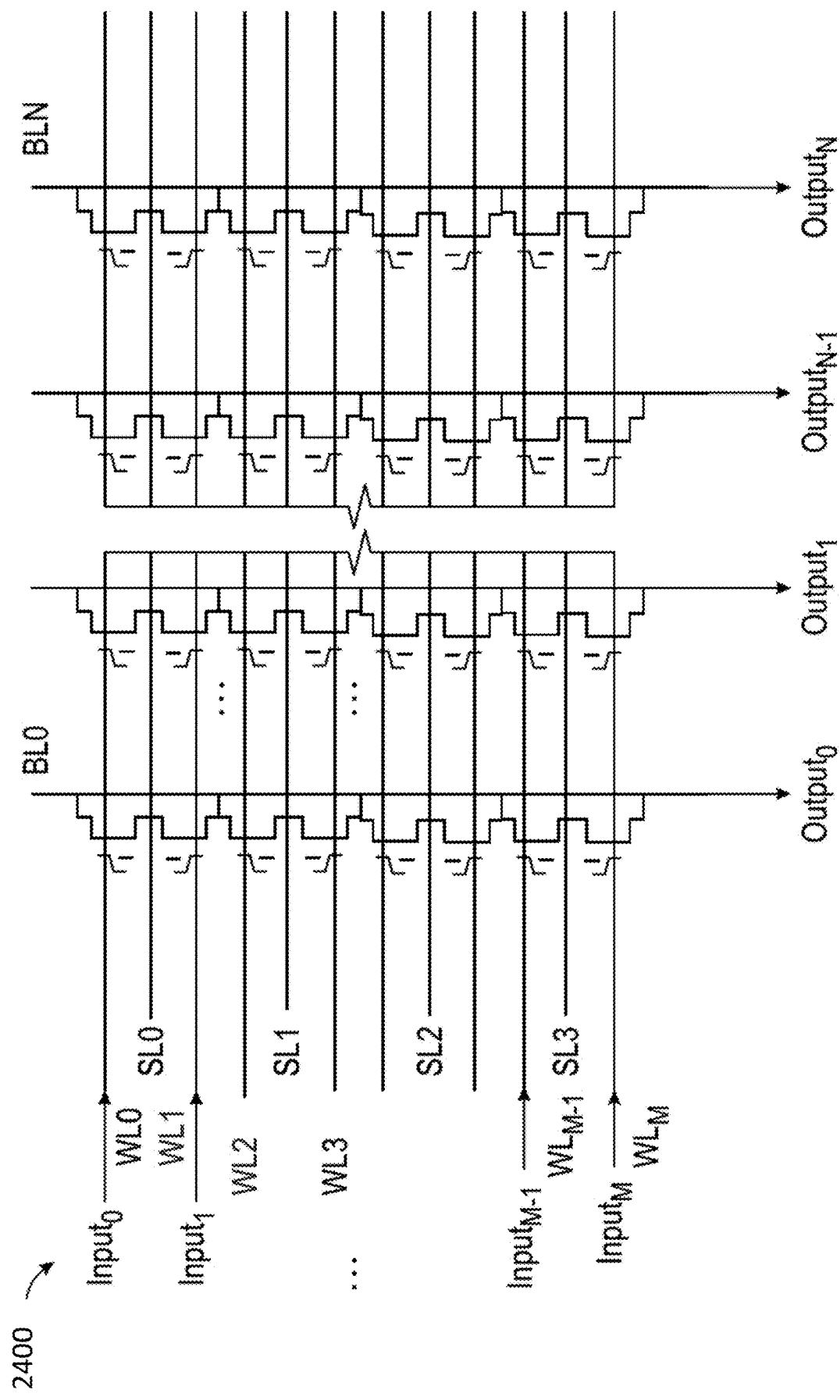
FIG. 24 depicts another example of a VMM system.
Figure 25:
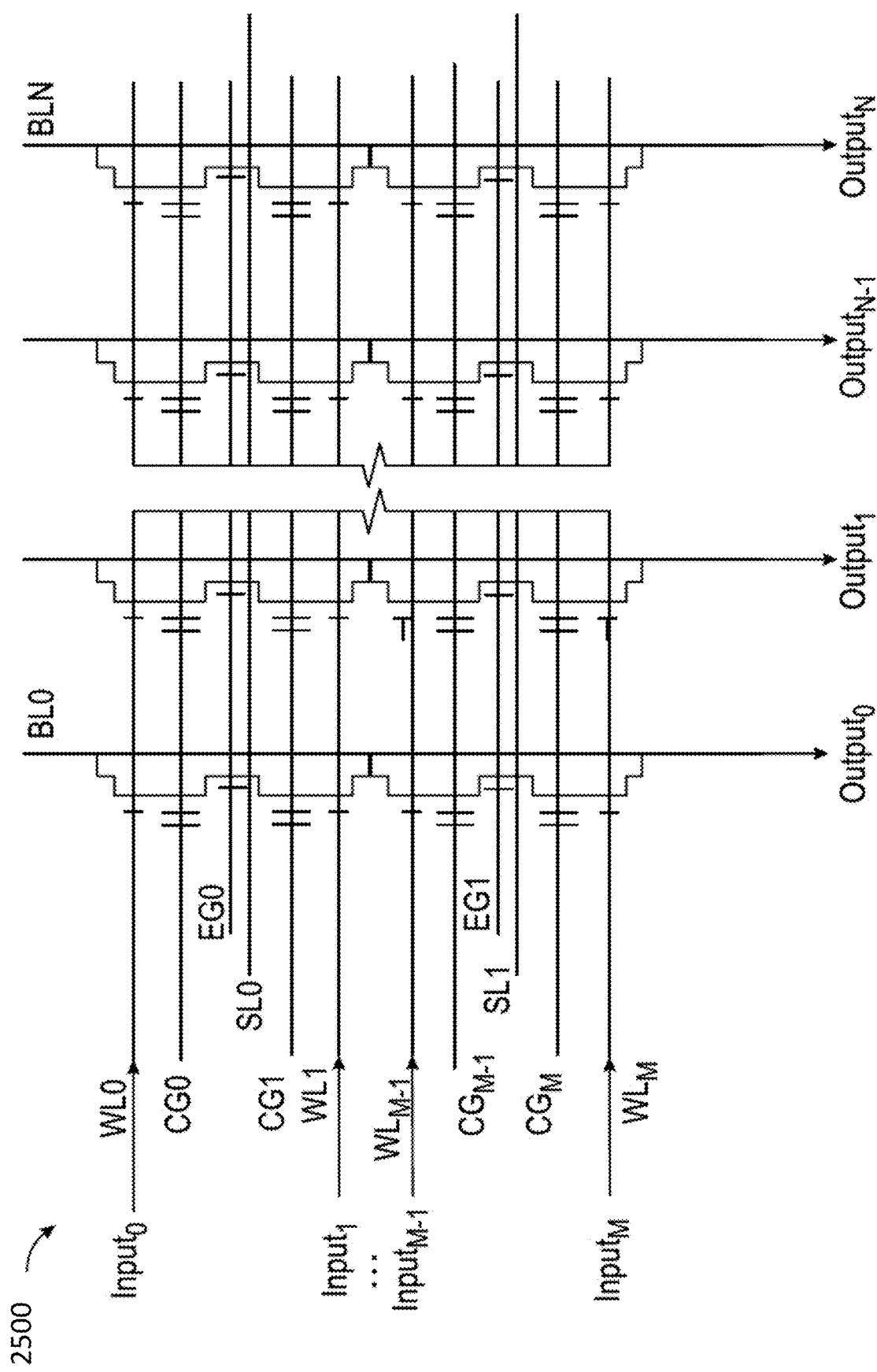
FIG. 25 depicts another example of a VMM system.
Figure 26:
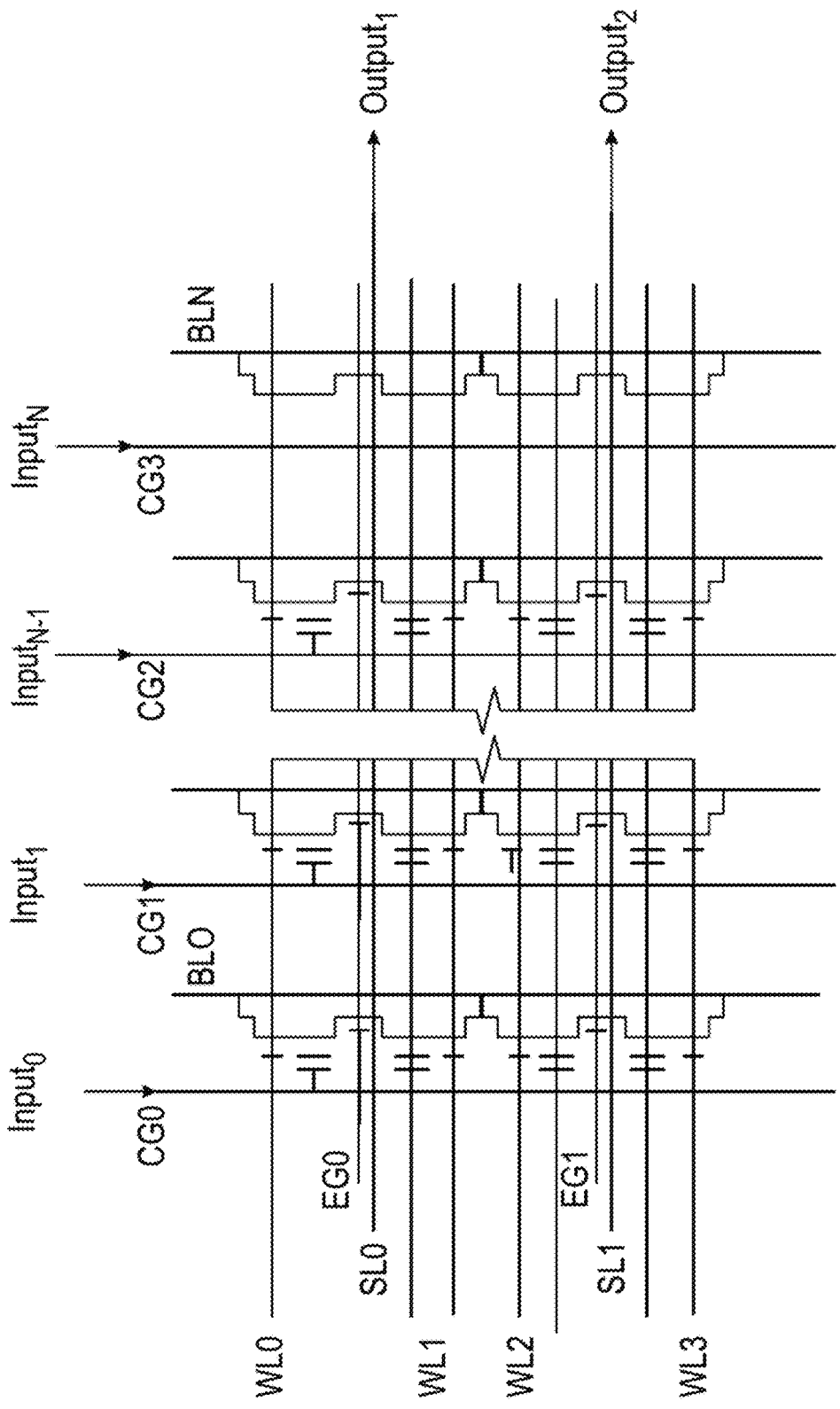
FIG. 26 depicts another example of a VMM system.
Figure 27:
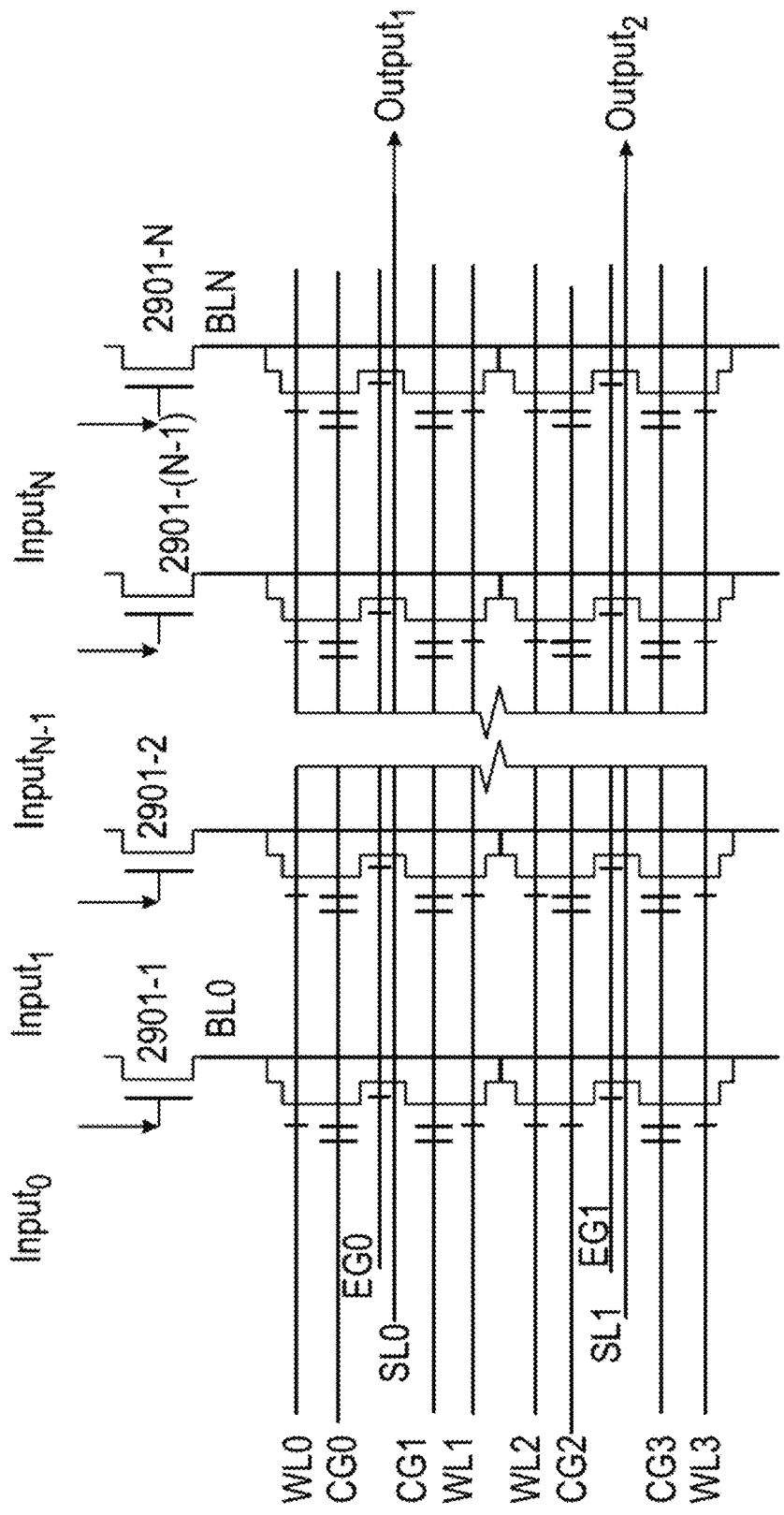
FIG. 27 depicts another example of a VMM system.
Figure 28:
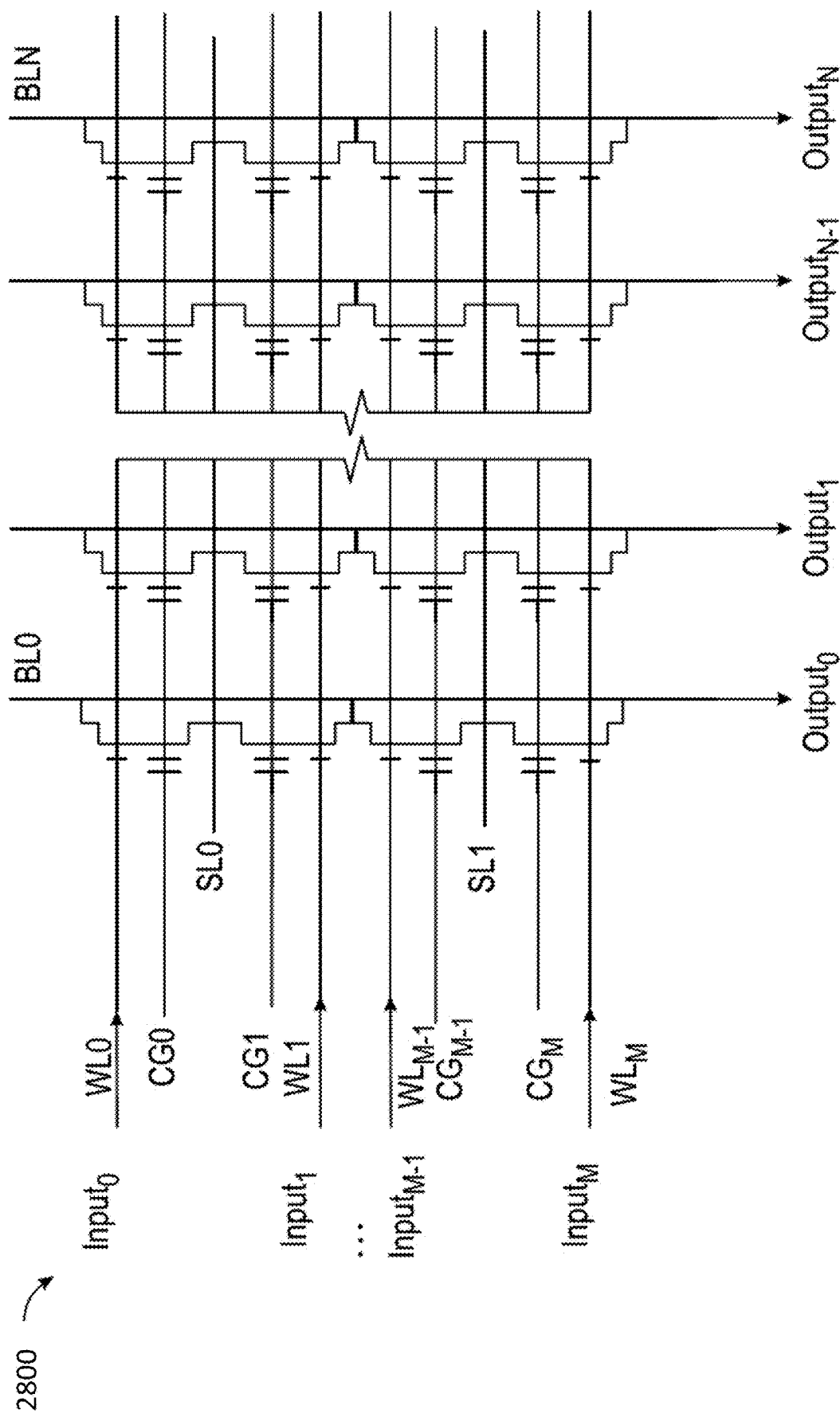
FIG. 28 depicts another example of a VMM system.
Figure 29:
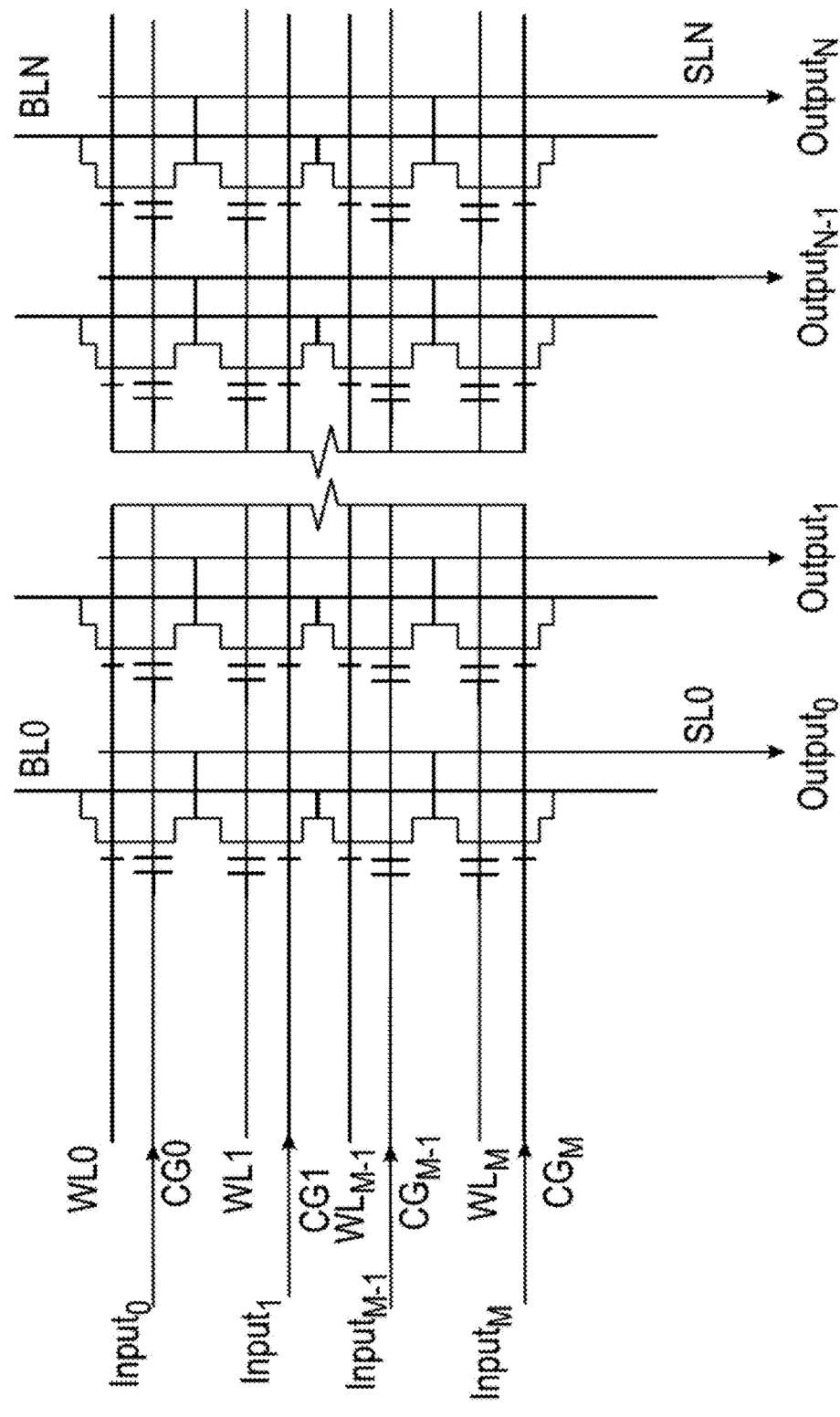
FIG. 29 depicts another example of a VMM system.
Figure 30:
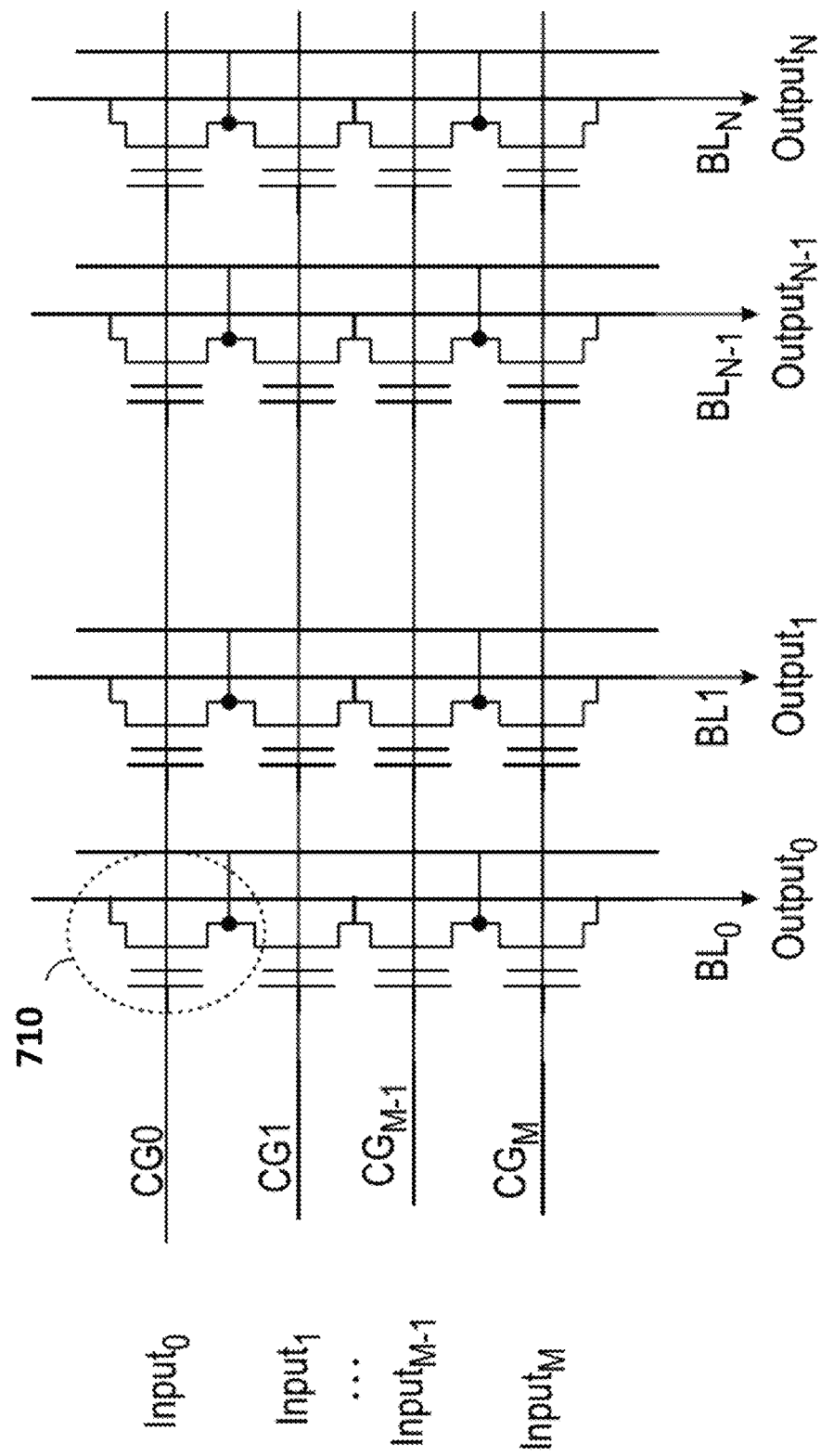
FIG. 30 depicts another example of a VMM system.
Figure 31:
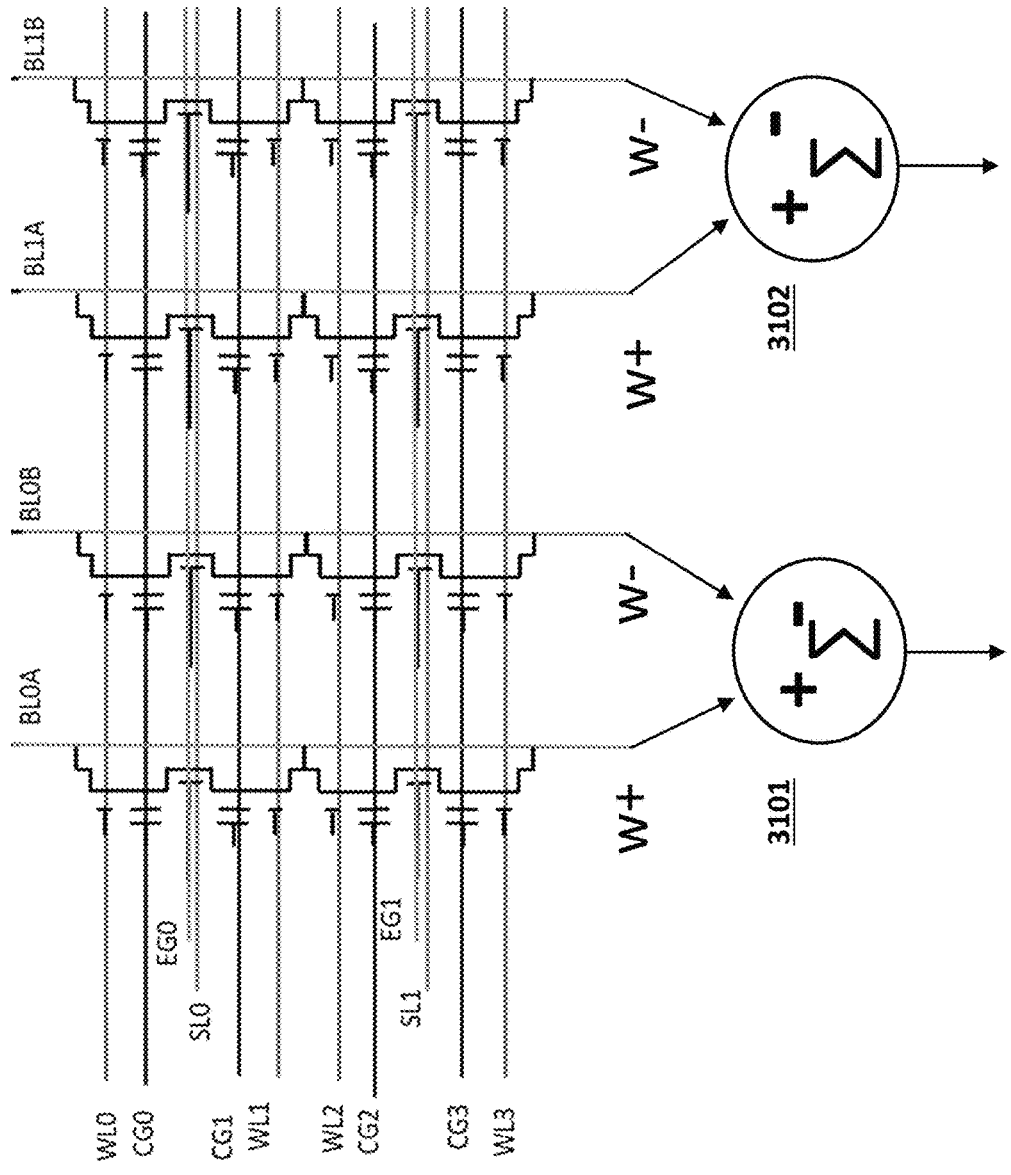
FIG. 31 depicts another example of a VMM system.
Figure 32:
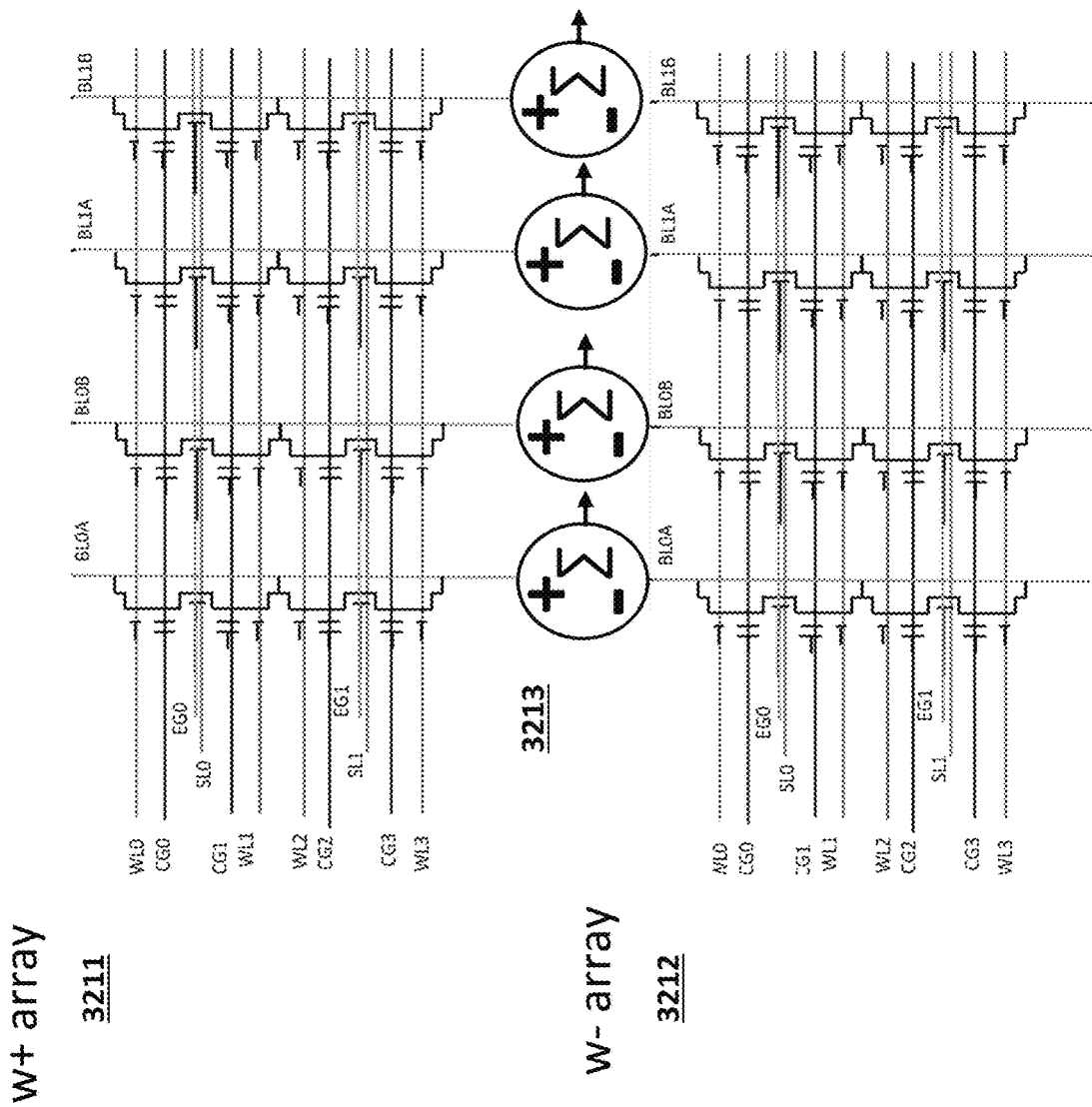
FIG. 32 depicts another example of a VMM system.
Figure 33:
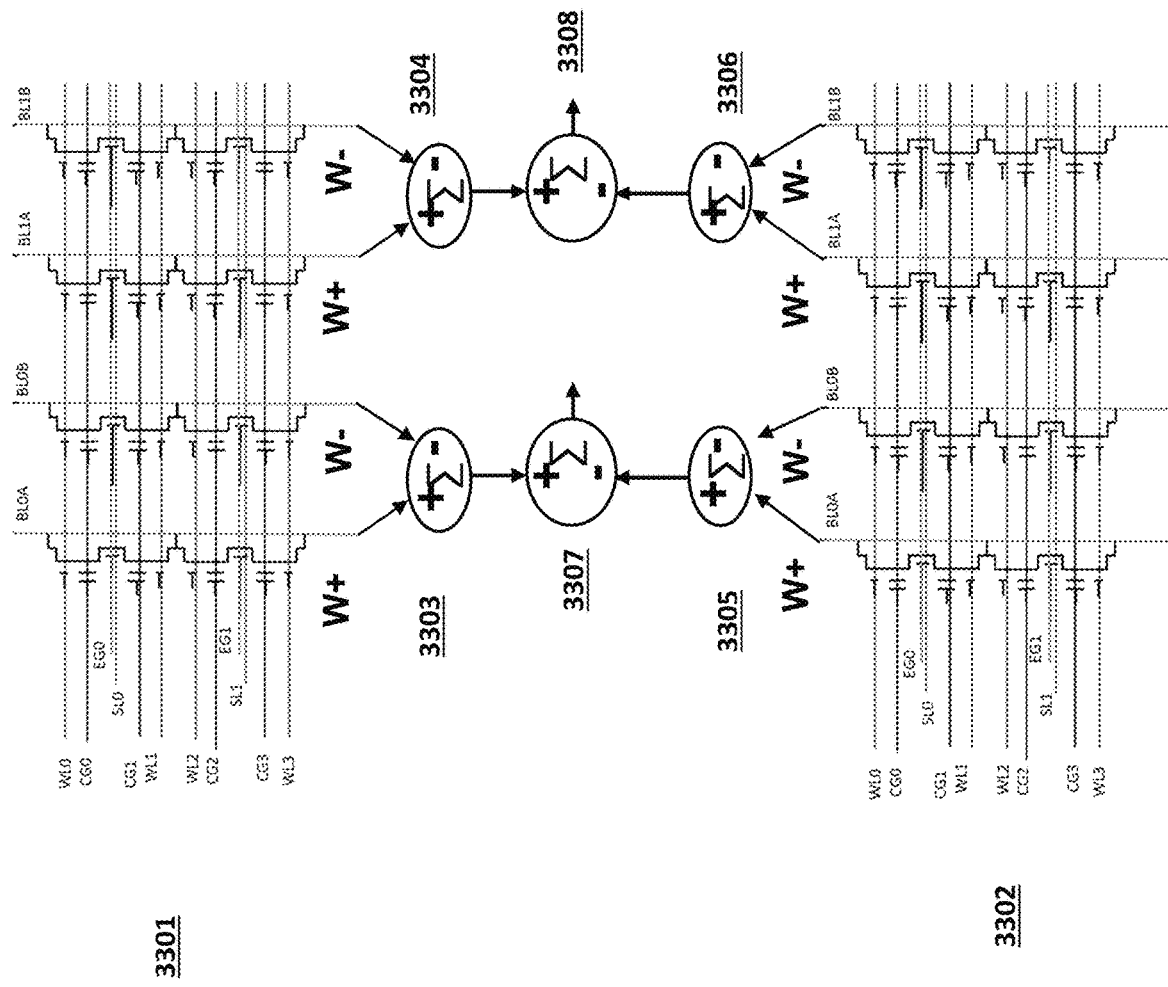
FIG. 33 depicts another example of a VMM system.
Figure 34:
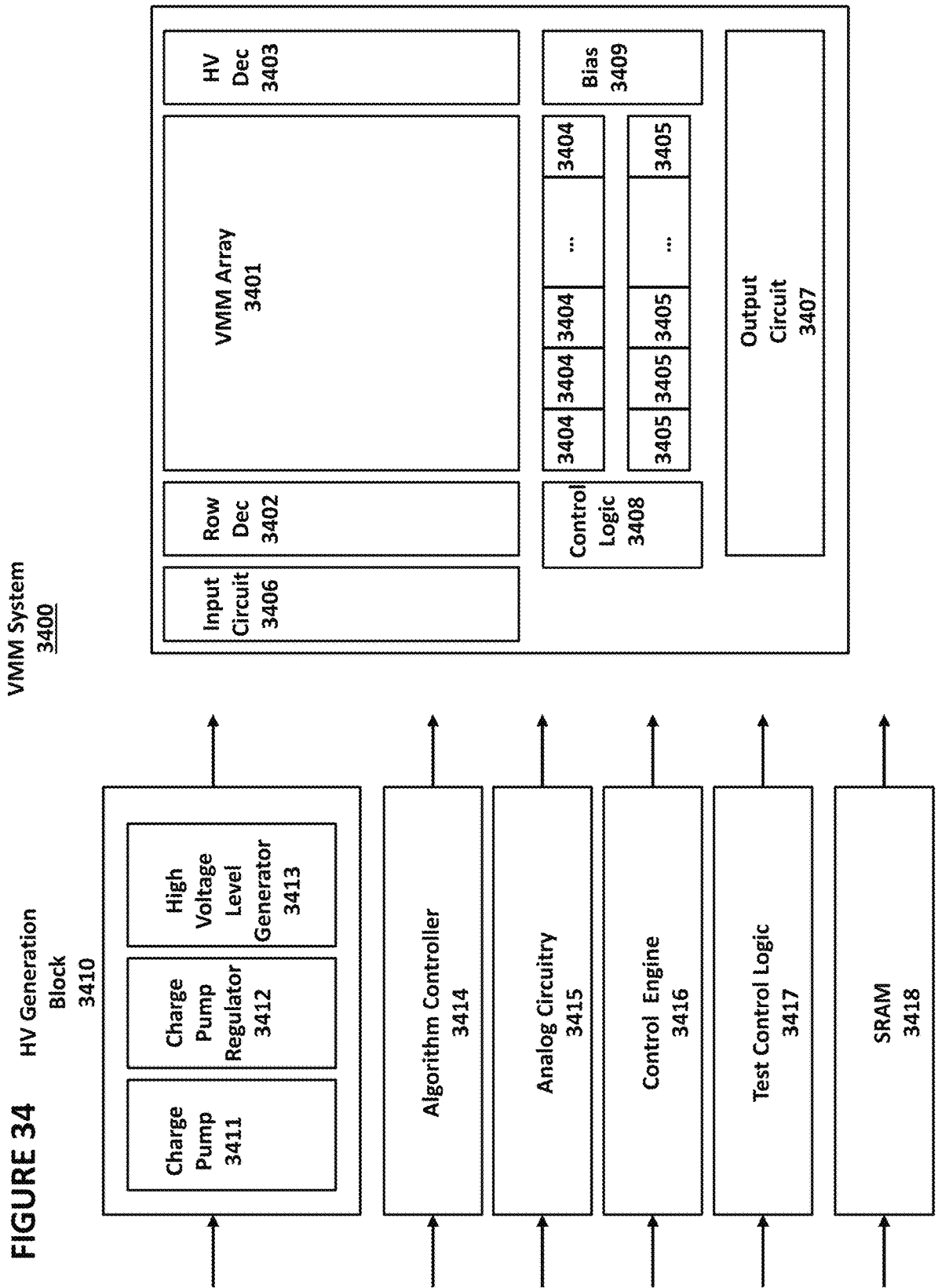
FIG. 34 depicts another example of a VMM system.

FIG. 34 depicts a block diagram of VMM system 3400. VMM system 3400 comprises VMM array 3401, row decoder 3402, high voltage row decoder 3403, column decoders 3404, bit line drivers 3405, input circuit 3406, output circuit 3407, control logic 3408, and bias generator 3409. VMM system 3400 further comprises high voltage generation block 3410, which comprises charge pump 3411, charge pump regulator 3412, and high voltage level generator 3413. VMM system 3400 further comprises (program/erase, or weight tuning) algorithm controller 3414, analog circuitry 3415, control engine 3416 (that may include special functions such as arithmetic functions, activation functions, embedded microcontroller logic, without limitation), test control logic 3417, and static random access memory (SRAM) block 3418 to store intermediate data such as for input circuits (e.g., activation data) or output circuits (neuron output data) or data for programming (such as input data for whole row or multiple rows).

The input circuit 3406 may include circuits such as a DAC (digital to analog converter), DPC (digital to pulses converter, digital to time modulated pulse converter), AAC (analog to analog converter, such as a current to voltage converter, logarithmic converter), PAC (pulse to analog level converter), or any other type of converters. The input circuit 3406 may implement one or more of normalization, linear or non-linear up/down scaling functions, or arithmetic functions. The input circuit 3406 may implement a temperature compensation function for input levels. The input circuit 3406 may implement an activation function such as ReLU or sigmoid.

The output circuit 3407 may include circuits such as an ADC (analog to digital converter, to convert neuron analog output to digital bits), AAC (analog to analog converter, such as a current to voltage converter, logarithmic converter), APC (analog to pulse(s) converter, analog to time modulated pulse converter), or any other type of converters. The output circuit 3407 may implement an activation function such as rectified linear activation function (ReLU) or sigmoid. The output circuit 3407 may implement one or more of statistic normalization, regularization, up/down scaling/gain functions, statistical rounding, or arithmetic functions (e.g., add, subtract, divide, multiply, shift, log) for neuron outputs. The output circuit 3407 may implement a temperature compensation function for neuron outputs or array outputs (such as bitline output) so as to keep power consumption of the array approximately constant, or to improve precision of the array (neuron) outputs, such as by keeping the IV slope approximately the same.

Figure 35:
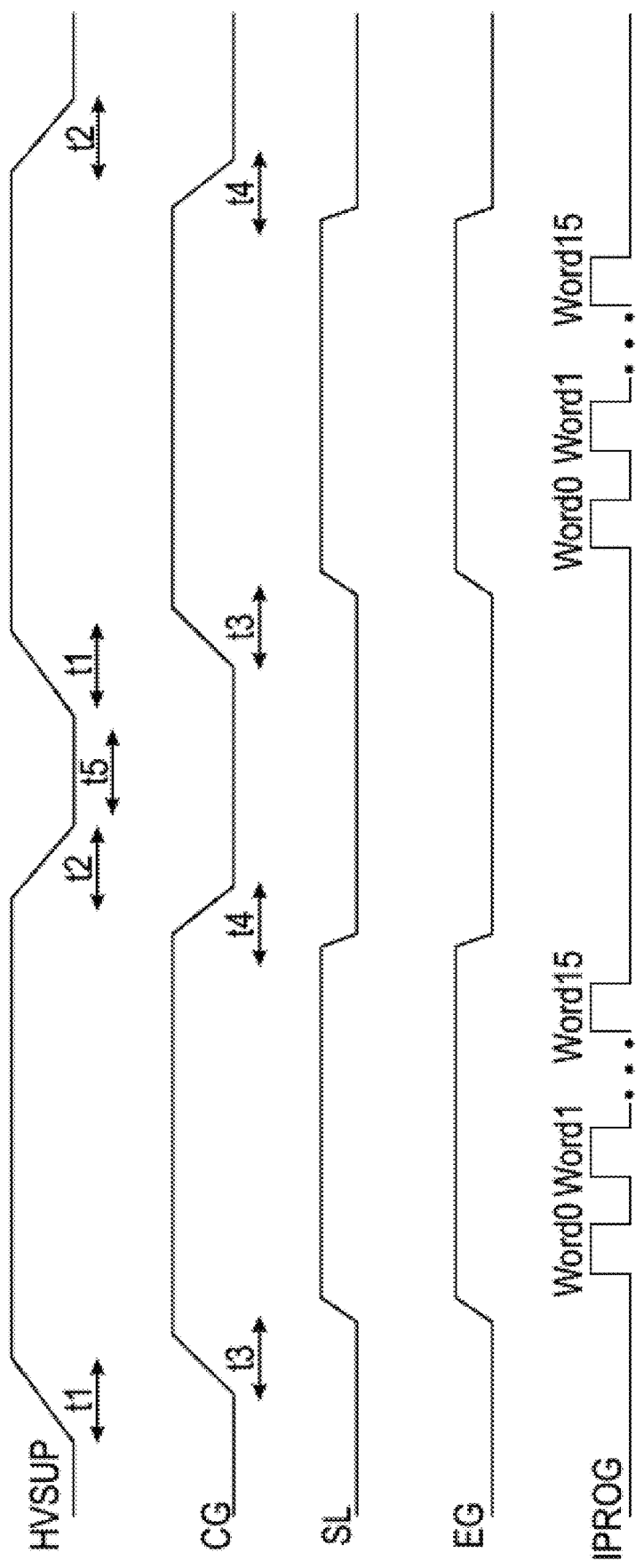
FIG. 35 depicts an example of a prior art programming waveform.

FIG. 35 depicts timing waveforms for prior art programming operation 3500. Shown here are exemplary signals for HVSUP (the high voltage supply generated by high voltage generation block 3410 in FIG. 34, which includes charge pump 3411, and which HVSUP is particularly generated by high voltage level generator 3413, and which is supplied to control gate lines, source lines, and/or bit lines of selected cells during a programming operation). In particular, FIG. 35 depicts CG (the voltage applied to control gate lines coupled to the selected cells during a programming operation), SL (the voltage applied to source lines coupled to the selected cells during a programming operation), EG (the voltage applied to erase gate lines coupled to the selected cells during a programming operation), and IPROG (the voltage generated by bias generator 3409 or analog circuitry 3415 and applied to bit lines coupled to the selected cells during a programming operation). These voltages are selected, for example, according to Tables 1-8 described previously for programming operations, without limitation. As can be seen, there is a significant ramp-up time, t1, and ramp-down time, t2, for HVSUP due to the high voltage of its peak value and the actions involved in generating that voltage, such as capacitance. The ramp-up time is, for example, affected by the charge pumping action of charge pump 3411 which takes time. The ramp-down time is, for example, affected by the time required to discharge the high voltage for all devices coupled to the high voltage, which includes large capacitance loading that causes the ramp-down time to be slow. There is a shorter ramp-up time t3 for CG, and a shorter ramp-down time t4 for CG.

Typical values for t1, t2, t3, t4, and t5 (to be described below) are 20-60 µs, 5-20 µs, 0.1-1 µs, 0.1-1 µs, and 0.1 µs, respectively. By contrast, the time required to program a single cell once the relevant voltages are in place is only 1 µs. As a result, it is common in the prior art to program an entire row of cells in a single high voltage cycle of HVSUP so that only a single ramp-up period and a single ramp-down period for HVSUP are invoked for the programming of the entire row. For example, a row might contain 2048 cells, and each word might contain 128 bits, meaning that each row contains 16 words. Thus, in the example of FIG. 35, Word0, . . . , Word15 (16 words total) are programmed during a single cycle of HVSUP, such that a single ramp-up of t1 and a ramp-down of t2 are incurred for the programming of each set of 16 words. An additional delay of t5 is incurred between programming different rows of cells.

Figure 36A:
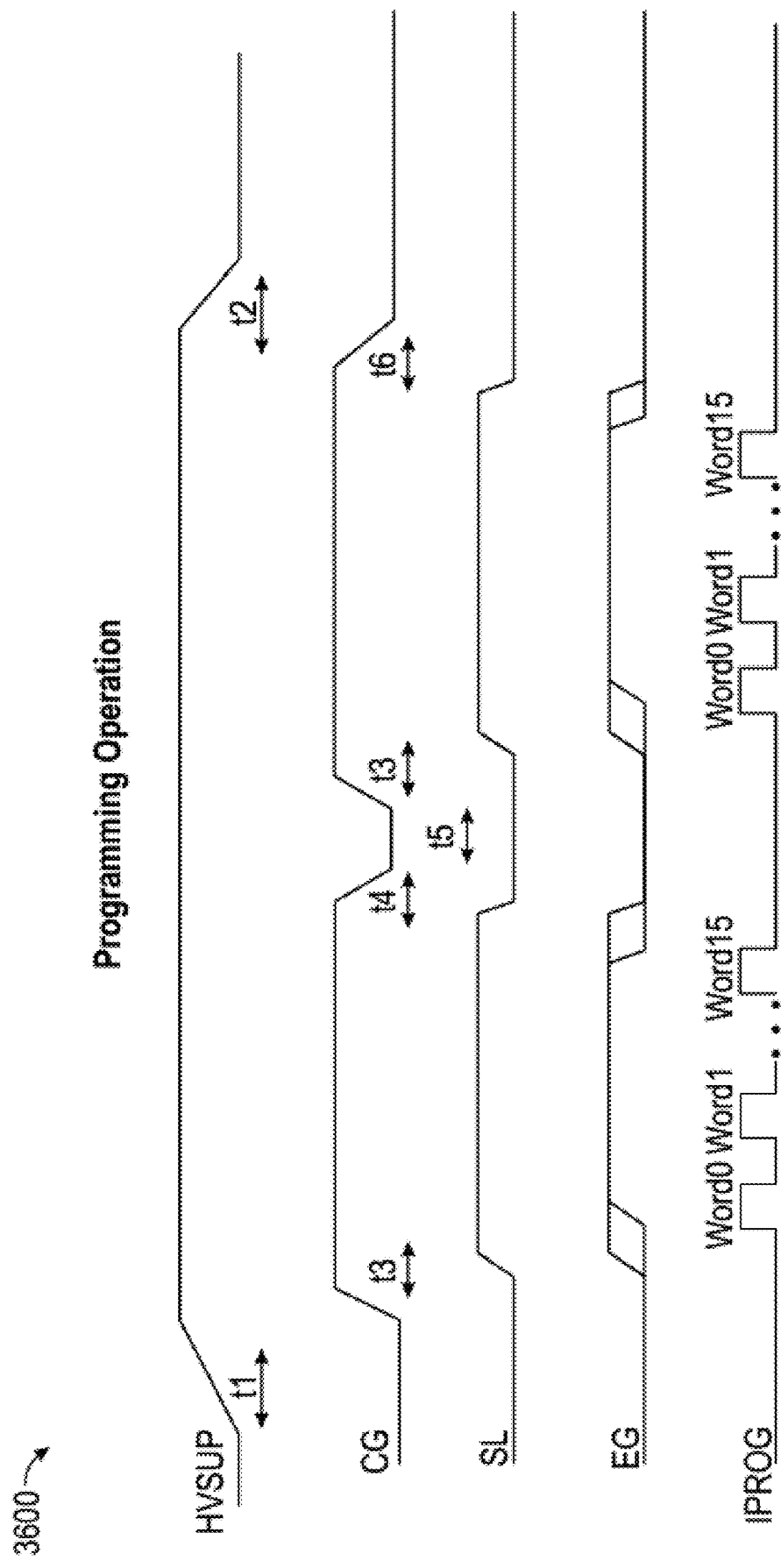

FIG. 36A depicts timing waveforms for programming operation 3600. Again, waveforms are shown for HVSUP, CG, SL, EG, and IPROG. Here, K consecutive rows of cells are programmed for each cycle of HVSUP, where K>1. For example, K=2, K=3, or K=4.

First, the ramp-up period of t1 is incurred such as from charge pumping action of charge pump 3411 and from charging up all capacitance loading of all devices coupled to high voltage generation block 3410. After the high voltage (HVSUP) is stable, the HVSUP is then switched into one or more lines coupled to the array terminals (CG, WL, SL, EG, and/or BL). For example, HVSUP can be applied to a CG, SL, or EG line, and other voltages (lower than HVSUP) can be applied to the remaining lines according to Table Nos. 1-8, above. The high voltages applied to CG, SL, EG, and BL optionally can be four different voltages. The low voltages applied to CG, SL, EG, and BL optionally can be four different voltages, the same voltage (such as ground) or any variation in between. Second, the program current (IPROG) is enabled for a tPROG (e.g., 0.5-1 µs) for each word for 16 words of a row as example. Instead of HVSUP ramping down after each row programming, HVSUP stays high for a next row programming, and instead, a circuit switches CG, SL, and EG off and then back on. Switching CG, SL, and EG off and then back on requires a time period equal to t4+t3+t5, where t4 is the ramp-down time required for the slowest of CG, SL, and EG, t3 is the ramp-up period for the slowest of CG, SL, and EG, and t5 provides a gap to ensure the ramp-up circuitry does not mistakenly begin ramping up CG, SL, and EG before it has completed its ramp-down. Notably, t3 is much smaller than t1, and t4 is much smaller than t2. Third, a second row of cells is programmed without ramping down HVSUP. Fourth, the ramp-down period of t2 is incurred. For example, typical numbers are t1~10-60 µs, t3~0.1-1 µs, t4~0.1~1 µs, t5<0.1 µs, t2~2=10 µs. Using this same sequence, K rows are programmed for each constant high period of HVSUP, where K>1. In the example shown, the ramp-up and ramp-down slopes of CG, SL, and EG are steeper than the ramp-up and ramp-down slope, respectively, of HVSUP.

Figure 36B:
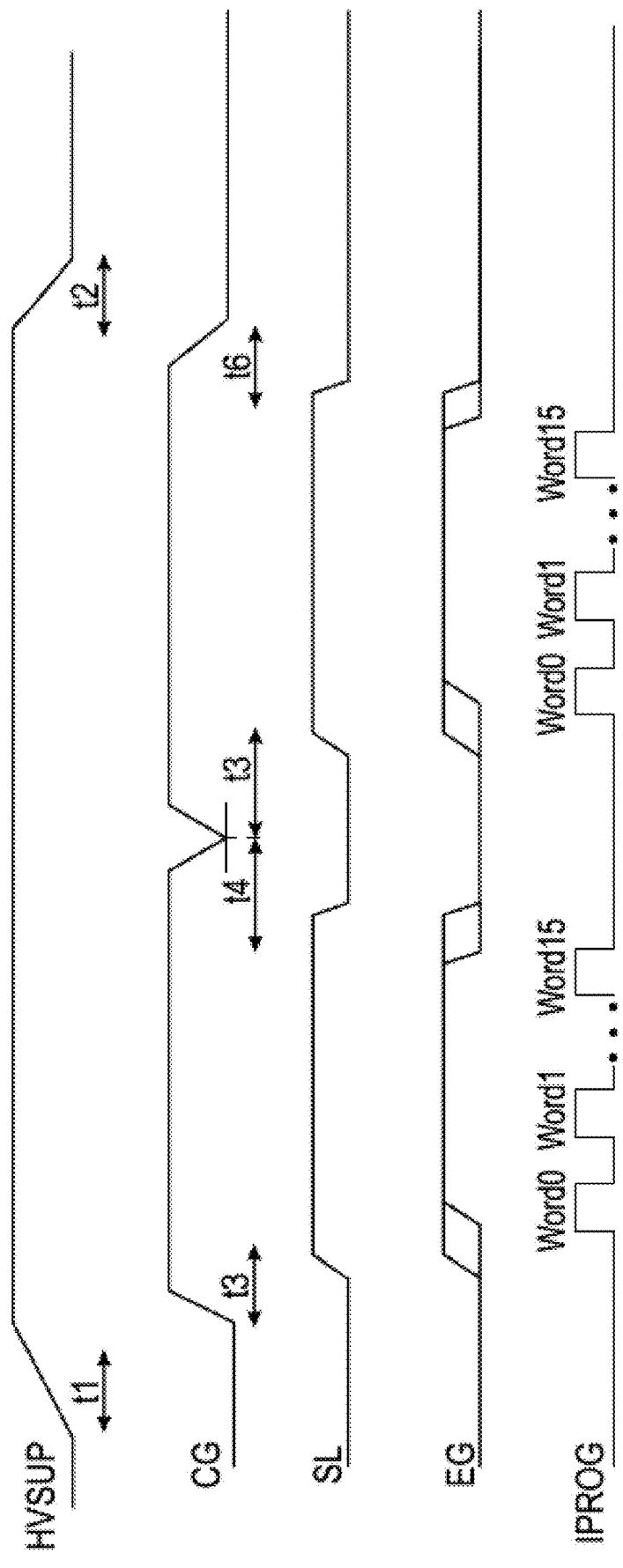

FIG. 36B depicts timing waveforms for programming operation 3620, which is similar to programming operation 3600 in FIG. 36A except there is no t5, meaning there is no delay between the end of the ramp-down period of t4 and the ramp-up period of t3 and the CG signal is switched without delay from a first CG line for a first row to a second CG line for a second row. This reduces the programming time compared to programming operation 3600.

FIG. 36C depicts timing waveforms for programming operation 3640, which is similar to programming operation 3600 of FIG. 36A except t4 and t3 overlap, meaning that the CG signal is switched from a first CG line for a first row to a second CG line for a second row while the ramp-down period of t4 is occurring. This reduces the programming time compared to programming operation 3620, although there is an increased risk that the ramp-down of CG does not progress to the point where it will be considered by "low" before it ramps-up again.

Figure 36D:
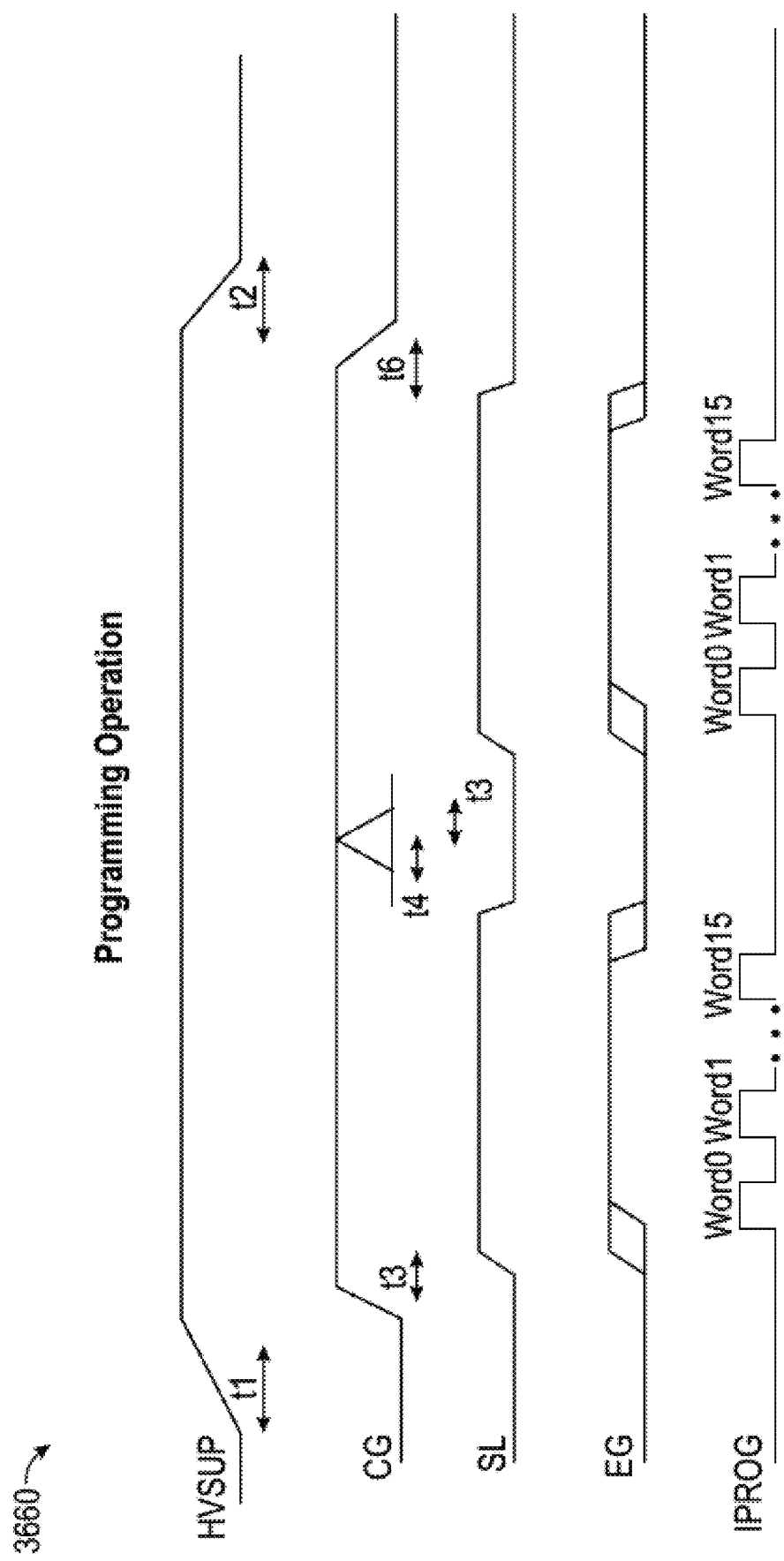

FIG. 36D depicts timing waveforms for programming operation 3660, which is similar to programming operation 3600 of FIG. 36A, except that t3 begins before t4 ends, meaning that the CG signal that is applied to a second CG line of a second row ramps up before, or at the same time, that the CG signal that is applied to a first CG line of a first row ramps down. This reduces the programming time compared to programming operation 3640, at the expense of not having the option of using a change in state of CG to trigger any action.

Thus, programming operations 3600, 3620, 3640, and 3660 are faster than programming operation 3500 for the programming of two or more consecutive rows. This amount can be significant, on the order of ~3-10× improvement in programming time FIG. 37 to 41 depict circuitry for implementing programming operations 3600, 3620, 3640, and 3660.

Figure 37:
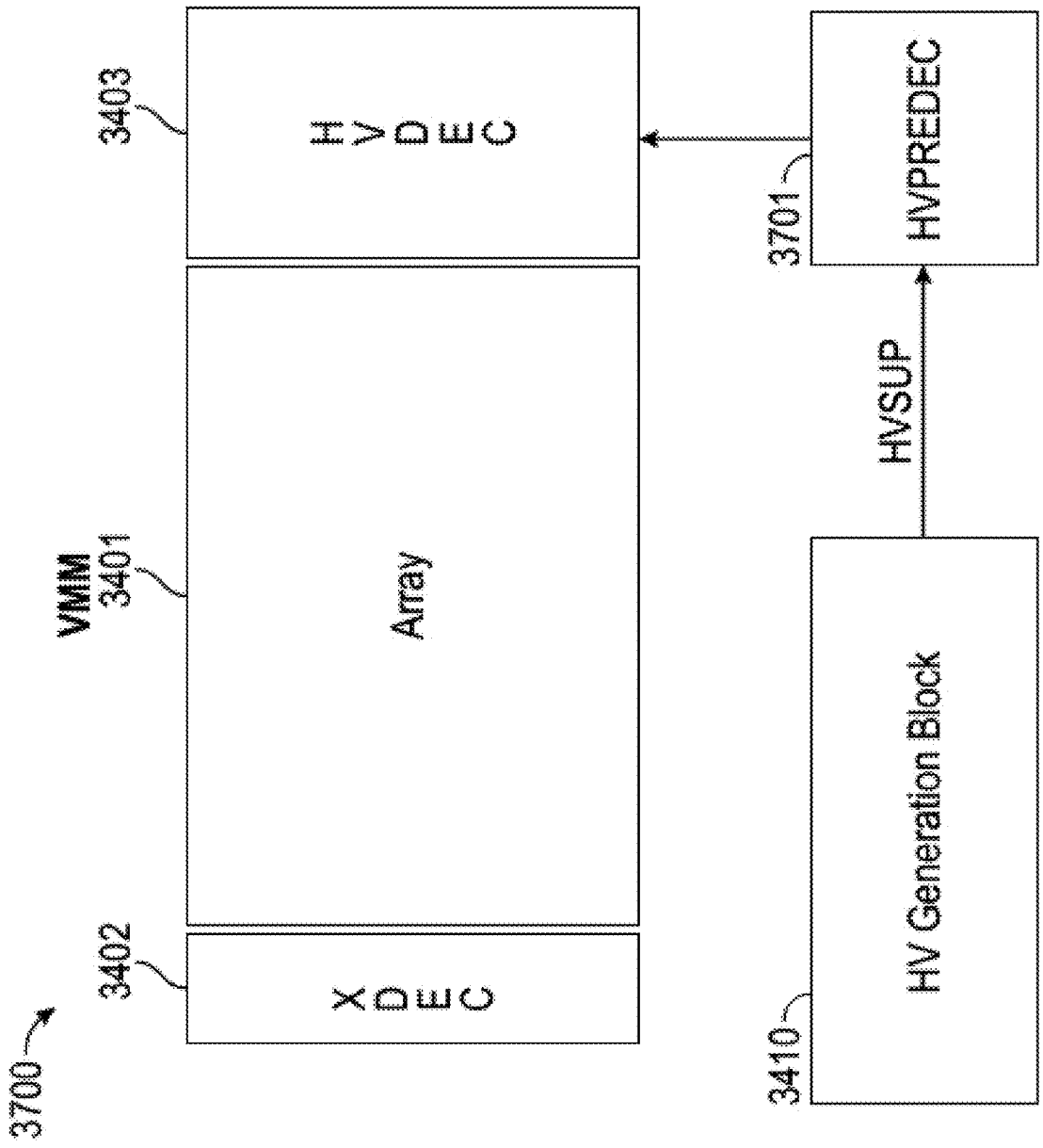
FIG. 37 depicts a block diagram of VMM system for consecutive row programming.

FIG. 37 depicts VMM system 3700, which comprises VMM array 3401, row decoder 3402, high voltage row decoder 3403, and high voltage generation block 3410 as in FIG. 34. VMM system 3700 further comprises high voltage predecoder 3701, which implements the switching off and on sequence for CG, SL, and EG discussed previously with respect to FIG. 36, and which receives HVSUP as a voltage input.

The ramp-up and ramp-down functions for HVSUP as shown in FIGS. 36A-36D can be implemented in HV generation block 3410, HV predecoder 3701 or the row decoder 3402. FIGS. 38-41 depict circuits that can be used to implement the ramp-up and ramp-down functions.

Figure 38:
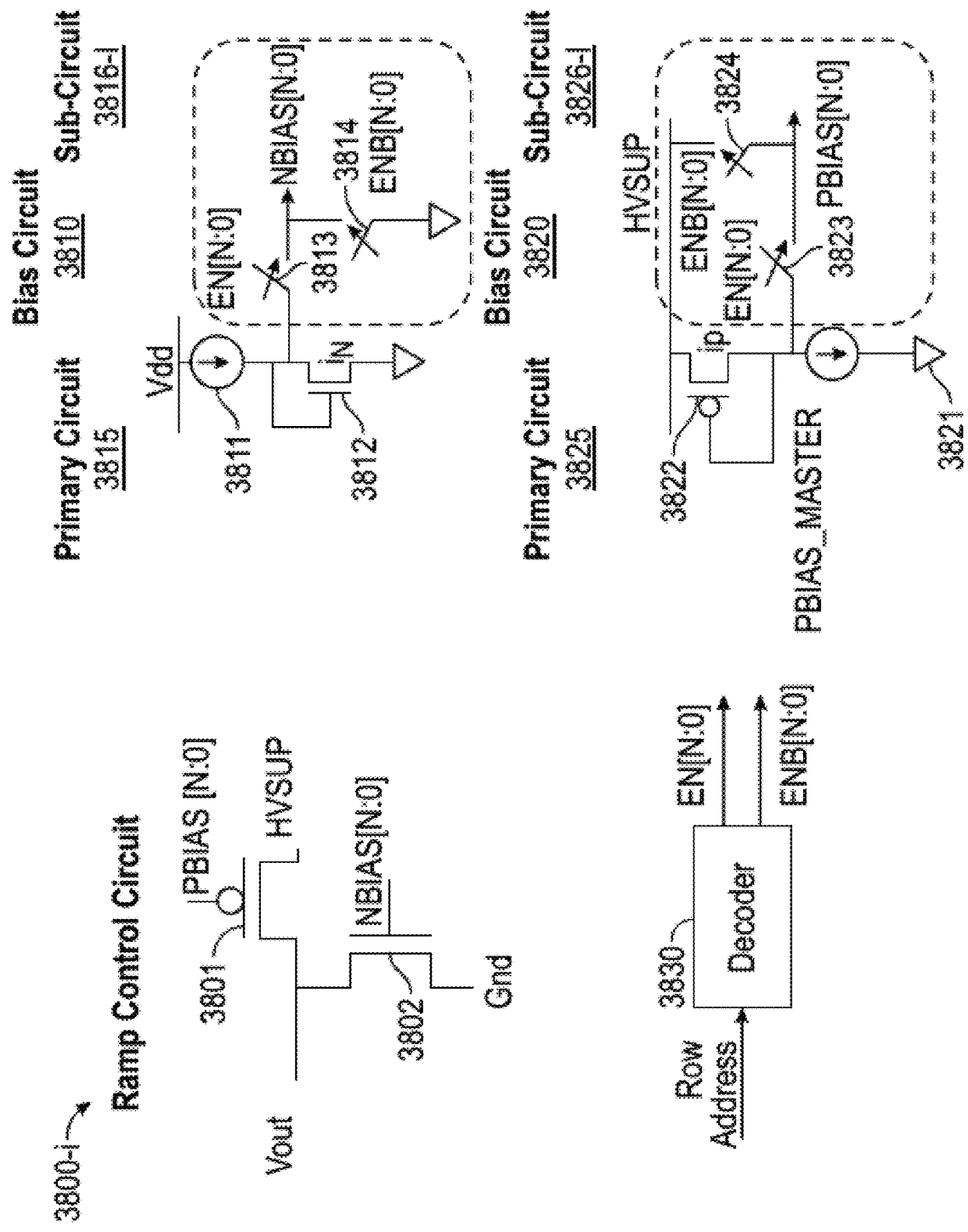
FIG. 38 depicts a ramp control circuit.

FIG. 38 depicts ramp control circuit 3800-$i$, bias circuit 3810, bias circuit 3820, and decoder 3830, where i ranges from 0 to N, where there are N+1 rows of cells in array 3401. Ramp control circuit 3800-$i$ comprises PMOS transistor 3801 and NMOS transistor 3802, and can cause a signal Vout (e.g., CG, EG, SL array terminals, pre-decoded High Voltage Signals) to ramp up towards HVSUP from ground or to ramp down to ground. A first terminal of PMOS transistor 3801 receives HVSUP, a gate of PMOS transistor 3801 receives a first control signal, PBIAS[N:0] (which optionally is a current-controlled signal), and a second terminal of PMOS transistor 3801 is the Vout node. A first terminal of NMOS transistor 3802 is coupled to the Vout node, a gate of NMOS transistor 3802 receives a second control signal, NBIAS[N:0](which optionally is a current-controlled signal), and a second terminal of NMOS transistor 3802 is coupled to ground.

An instantiation of ramp control circuit 3800-$i$ is coupled to each control gate line, source line, and erase gate line to perform the switching-in and switching-off operations of programming operation 3600, 3620, 3640, and 3660. In the example shown, the suffix [N:0] indicates that there are N+1 different instantiations. The instantiations of ramp control circuit 3800 are coupled together in a decoding current mirror configuration.

Decoder 3830 receives a row address and generates enable signals, EN[N:0], complements of the enable signals, ENB[N:0], such that N+1 EN signals and N+1 ENB signals are generated, one each for each of the instantiations of ramp control circuit 3800.

Bias circuit 3810 comprises primary circuit 3815 and N+1 instantiations of sub-circuit 3816-$i$, where i ranges from 0 to N. Primary circuit 3815 comprises current source 3811 and NMOS transistor 3812 and generates the current $i_N$ that will be mirrored to generate NBIAS[N:0]. Each sub-circuit 3816-$i$ comprises switch 3813 controlled by EN[N:0] from decoder 3830 and switch 3814 controlled by ENB[N:0] from decoder 3830.

Bias circuit 3820 comprises primary circuit 3825 and N+1 instantiations of sub-circuit 3826-$i$, where i ranges from 0 to N. Primary circuit 3825 comprises current source 3821 and PMOS transistor 3822 and generates the current $i_p$ that will be mirrored to generate PBIAS[N:0]. Each sub-circuit 3826-$i$ comprises switch 3823 controlled by EN[N:0] from decoder 3830 and switch 3824 controlled by ENB[N:0] from decoder 3830.

In ramp control circuit 3800-$i$, a high voltage on NBIAS [N:0] causes a ramp down, and low voltage on PBIAS [N:0] causes a ramp up. When PBIAS is asserted to switch on PMOS transistor 3801, and NBIAS is de-asserted, Vout is pulled up to HVSUP, thus performing a switch on function. When NBIAS is asserted to switch on NMOS transistor 3802, and PBIAS is de-asserted, Vout is pulled down to ground, thus performing a switch off function. Ramp control circuit 3800 here is shown for Vout, which can be used to provide the CG, SL, or EG voltages in FIGS. 36A-36D. Due to the use of the current mirrors in bias circuit 3810 and bias circuit 3820, all N+1 instantiations receive identical currents on PBIAS [N:0] and identical currents on NBIAS [N:0] when the corresponding row is enabled by the row address provided to decoder 3830.

Figure 39:
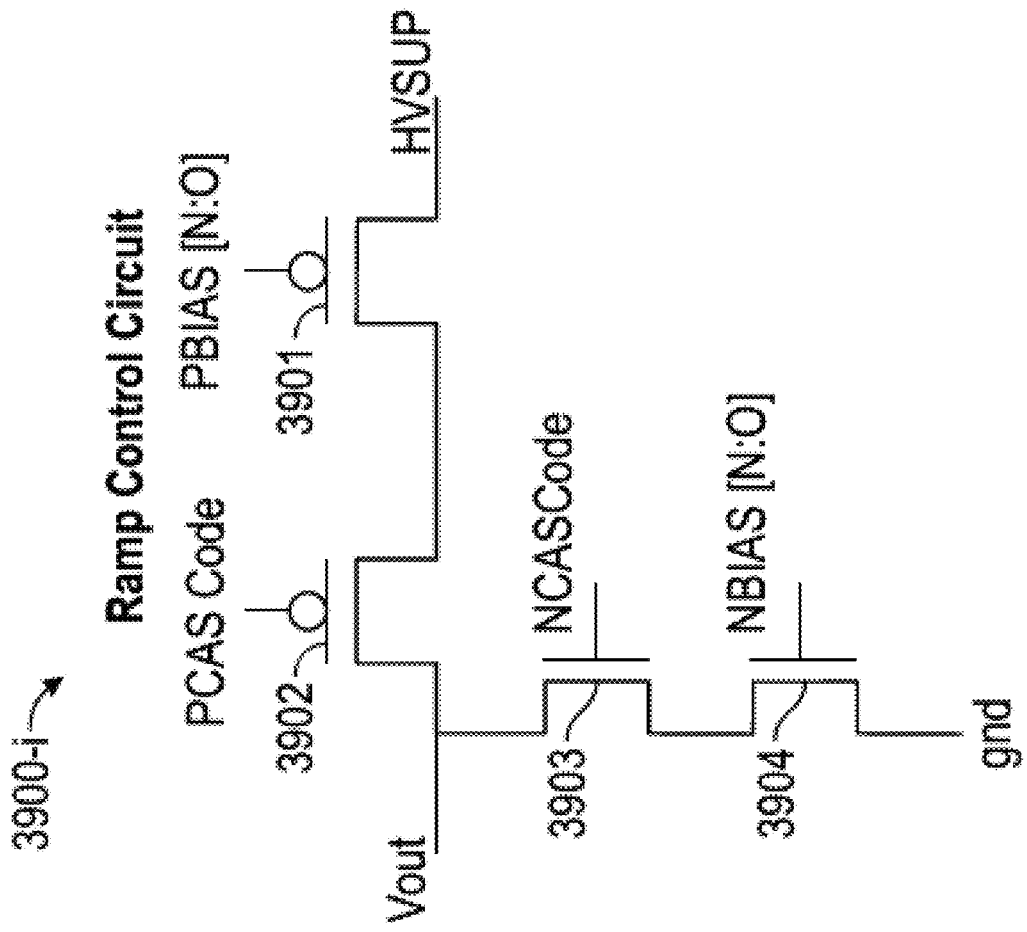
FIG. 39 depicts a ramp control circuit.

FIG. 39 depicts ramp control circuit 3900-$i$, where $i$ ranges from 0 to N, where there are N+1 rows of cells in array 3401. Ramp control circuit 3900-$i$ comprises PMOS transistors 3901 and 3902 and NMOS transistors 3903 and 3904. An instantiation of ramp control circuit 3900-$i$ is coupled to each control gate line, source line, and erase gate line to perform the switching-in and switching-off operations of programming operation 3600. In the example shown, the suffix [N:0] indicates that there are N+1 different instantiations. A high voltage on NBIAS [N:0] and NCASCODE causes a ramp down, and a low voltage on PBIAS [N:0] and PCASCODE causes a ramp up.

A first terminal of PMOS transistor 3901 receives HVSUP and a gate of PMOS transistor 3901 receives a first control signal, PBIAS[N:0] (which optionally is a current-controlled signal). A first terminal of PMOS transistor 3902 is coupled to a second terminal of PMOS transistor 3901, a gate of PMOS transistor 3902 receives a second control signal, PCASCODE, and a second terminal of PMOS transistor 3902 is coupled to the Vout node (e.g., CG, EG, SL array terminals, pre-decoded High Voltage Signals). A first terminal of NMOS transistor 3903 is coupled to the Vout node and a gate of NMOS transistor 3903 receives a third control signal, NCASCODE. A first terminal of NMOS transistor 3904 is coupled to a second terminal of NMOS transistor 3903, a gate of NMOS transistor 3904 receives a fourth control signal, NBIAS [N:0] (which optionally is a current-controlled signal), and a second terminal of NMOS transistor 3904 is coupled to ground.

PMOS transistor 3902 and NMOS transistor 3903 perform a cascoding function to isolate PMOS transistor 3901 and NMOS transistor 3904 from Vout. When PCASCODE and PBIAS for row N are asserted, PMOS transistors 3901 and 3902 are turned on, and with NCASCODE and NBIAS for row N de-asserted, Vout is pulled up to HVSUP, thus performing a switch on function. When NCASCODE and NBIAS for row N are asserted, NMOS transistors 3903 and 3904 are turned on, and with PCASCODE and PBIAS for row N de-asserted, Vout is pulled down to ground, thus performing a switch off function. Ramp control circuit 3900 here is shown for Vout, which can be used to provide the CG, SL, or EG voltages in FIGS. 36A-36D. Optionally, the PBIAS [N:0] signals for the N+1 instantiations of ramp control circuit 3900-I can be provided by bias circuit 3820 in FIG. 38, such that all N+1 instantiations receive identical currents on PBIAS [N:0], and the NBIAS [N:0] signals for the N+1 instantiations of ramp control circuit can be provided by bias circuit 3810 in FIG. 38, such that all N+1 instantiations receive identical currents on NBIAS [N:0]. Optionally, decoder 3830 in FIG. 38 also is used in these configurations to provide EN[N:0] and EN[N:B].

Figure 40:
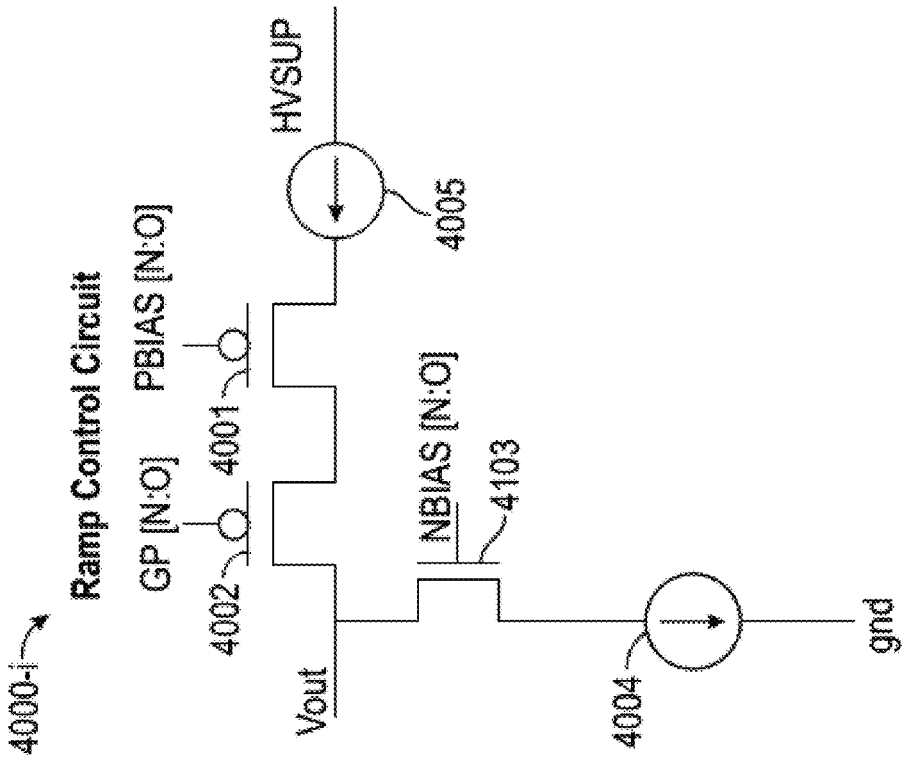
FIG. 40 depicts a ramp control circuit.

FIG. 40 depicts ramp control circuit 4000-$i$, where $i$ ranges from 0 to N. Ramp control circuit 4000-$i$ comprises PMOS transistors 4001 and 4002, NMOS transistor 4003, and current bias sources 4004 and 4005. Current bias source 4005 comprises a first terminal coupled to the high voltage generation block. PMOS transistor 4001 comprises a first terminal coupled to a second terminal of current bias source 4005, a second terminal, and a gate to receive a first control signal, PBIAS[N:0] (which optionally is a current-controlled signal). PMOS transistor 4002 comprises a first terminal coupled to the second terminal of PMOS transistor 4001, a second terminal coupled to the Vout node (e.g., CG, EG, SL array terminals, pre-decoded High Voltage Signals), and a gate to receive a second control signal, GP[N:0]. NMOS transistor 4003 comprises a first terminal coupled to the Vout node, a second terminal, and a gate to receive a third control signal, NBIAS[N:0] (which optionally is a current-controlled signal). Current bias source 4004 is coupled between the second terminal of NMOS transistor 4004 and ground.

An instantiation of ramp control circuit 4000 is coupled to each control gate line, source line, and erase gate line to perform the switching-in and switching-off operations of programming operation 3600, 3620, 3640, and 3660. In the example shown, the suffix [N:0] indicates that there are N+1 different instantiations. A high voltage on NBIAS [N:0] causes a ramp down, and a low voltage on PBIAS [N:0] and GP[N:0] causes a ramp up. When PBIAS and GP for row N are asserted, PMOS transistors 4001 and 4002 are turned on, and with NBIAS for row N de-asserted, Vout is pulled up to HVSUP, where the slope of the ramp can be controlled by the amount of current provided by current bias source 4005, thus performing a switch on function. When NBIAS is asserted, NMOS transistor 4003 is turned on, and with PBIAS and GP for row N de-asserted, Vout is pulled down to ground, where the slope of the ramp down can be controlled by the amount of current provided by current bias source 4004, thus performing a switch off function. Ramp control circuit 4000 here is shown for Vout, and Vout can be used for CG, SL, or EG in FIGS. 36A-36D.

Optionally, the PBIAS [N:0] signals for the N+1 instantiations of ramp control circuit 3900-I can be provided by bias circuit 3820 in FIG. 38, such that all N+1 instantiations receive identical currents on PBIAS [N:0], and the NBIAS [N:0] signals for the N+1 instantiations of ramp control circuit can be provided by bias circuit 3810 in FIG. 38, such that all N+1 instantiations receive identical currents on NBIAS [N:0]. Optionally, decoder 3830 in FIG. 38 also is used in these configurations to provide EN[N:0] and EN[N:B].

Figure 41:
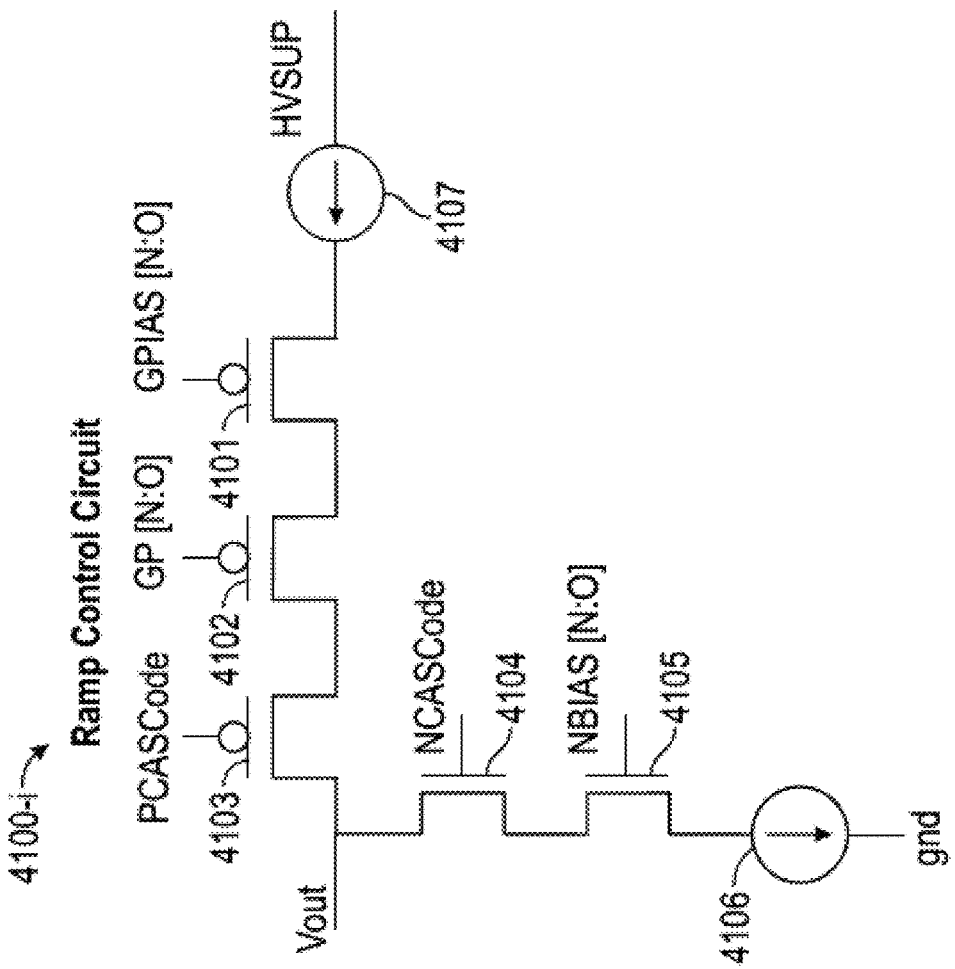
FIG. 41 depicts a ramp control circuit.

FIG. 41 depicts ramp control circuit 4100-$i$, where $i$ ranges from 0 to N. Ramp control circuit 4100-I comprises PMOS transistors 4101, 4102, and 4103; NMOS transistors 4104 and 4105; and current bias source 4106 and current bias source 4107. An instantiation of ramp control circuit 4100-$i$ is coupled to each control gate line, source line, and erase gate line to perform the switching-in and switching-off operations of programming operation 3600.

Current bias source 4107 comprises a first terminal coupled to HVSUP. PMOS transistor 4101 comprises a first terminal coupled to a second terminal of current bias source 4107, a second terminal, and a gate to receive a first control signal, GPIAS[N:0] (which optionally is a current-controlled signal). PMOS transistor 4102 comprises a first terminal coupled to the second terminal of PMOS transistor 4101, a second terminal, and a gate to receive a second control signal, GP[N:0]. PMOS transistor 4103 comprises a first terminal coupled to the second terminal of PMOS transistor 4103, a second terminal coupled to the Vout node, and a gate to receive a third control signal, PCASCODE. NMOS transistor 4104 comprises a first terminal coupled to the Vout node, a second terminal, and a gate to receive a fourth control signal, NCASCODE. NMOS transistor 4105 comprises a first terminal coupled to the second terminal of the NMOS transistor 4104, a second terminal, and a gate to receive a fifth control signal, NBIAS[N:0] (which optionally is a current-controlled signal). Current bias source 4106 is coupled between the second terminal of NMOS transistor 4105 and ground.

In the example shown, the suffix [N:0] indicates that there are N+1 different instantiations. A high voltage on NBIAS [N:0] causes a ramp down, and a low voltage on PBIAS [N:0] and GP[N:0] causes a ramp up. PMOS transistor 4103 and NMOS transistor 4104 perform a cacoding function. GP[N:0] performs another pre-decoded signal function. When GPIAS, GP and PCASCODE for row N are asserted, PMOS transistors 4101, 4102 and 4103 are turned on, and with NBIAS and NCASCODE for row N de-asserted, Vout is pulled up to CGSUP, where the slope of the ramp can be controlled by the amount of current provided by current bias source 4107, thus performing a switch on function. When NBIAS and NCASCODE are asserted, NMOS transistors 4104 and 4105 are turned on, and with PBIAS, GP and PCASCODE for row N de-asserted, Vout is pulled down to ground which is accelerated by current bias source 4107, where the slope of the ramp down can be controlled by the amount of current provided by current bias source 4106, thus performing a switch off function. Ramp control circuit 4100 here is shown for Vout, which can be used for CG, SL, or EG in FIGS. 36A-36D.

Optionally, the PBIAS [N:0] signals for the N+1 instantiations of ramp control circuit 3900-I can be provided by bias circuit 3820 in FIG. 38, such that all N+1 instantiations receive identical currents on PBIAS [N:0], and the NBIAS [N:0] signals for the N+1 instantiations of ramp control circuit can be provided by bias circuit 3810 in FIG. 38, such that all N+1 instantiations receive identical currents on NBIAS [N:0]. Optionally, decoder 3830 in FIG. 38 also is used in these configurations to provide EN[N:0] and EN[N:B].

Figure 42:
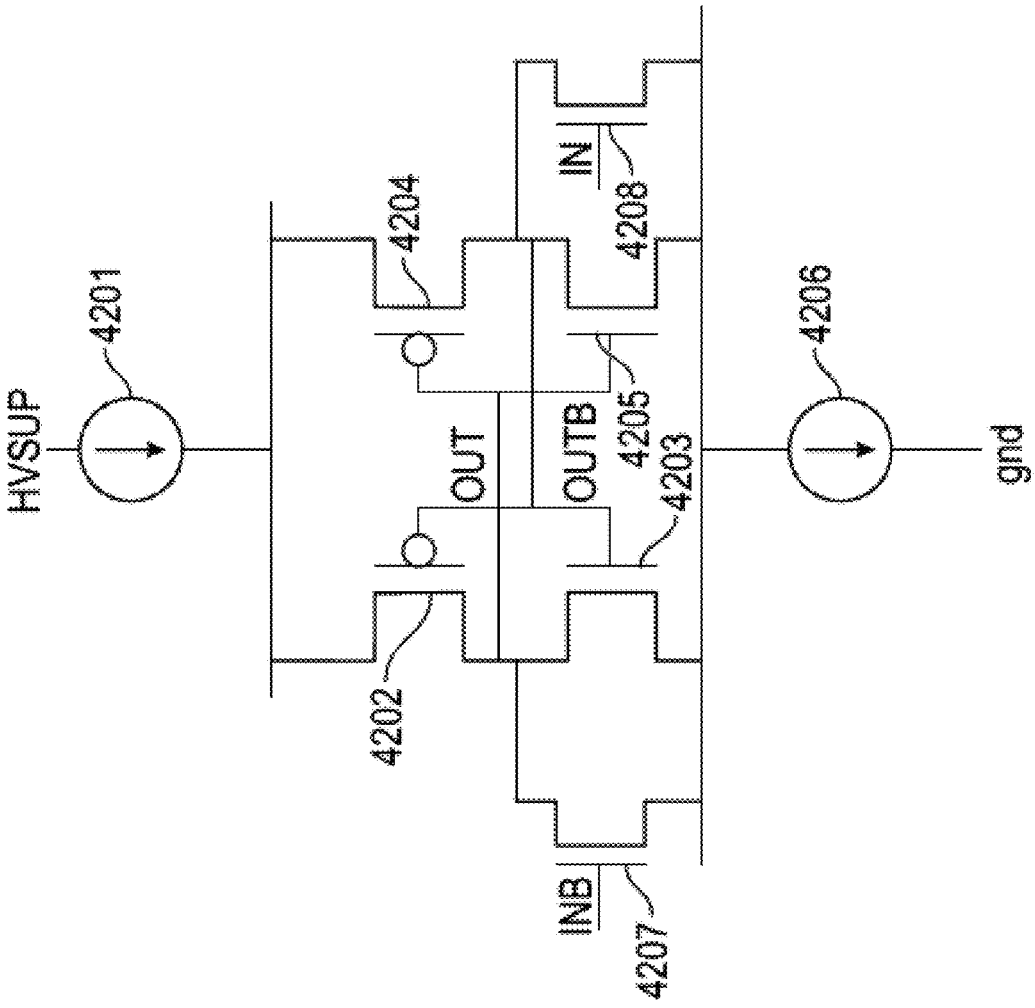
FIG. 42 depicts a high voltage level shifter and inverter.

FIG. 42 depicts high voltage level shifter and inverter 4200, which comprises current bias source 4201; PMOS transistors 4202 and 4204; NMOS transistors 4203, 4205, 4207, and 4208; and current bias source 4206. The inputs, IN and INB (logic voltage levels, where INB is the inverse of IN), are received, and the output (high voltage level), OUT, is generated, at the drain of NMOS transistor 4208. A low value for IN results in a high value for OUT, and a high value for IN results in a low value for OUT, where the high values of IN and OUT are different voltage levels.

In some detail, when IN is high, NMOS transistor 4208 is on, pulling OUT to ground, and PMOS transistor 4204 is turned off and NMOS transistor 4205 is turned on, such that OUT is pulled low by NMOS transistor 4205, which in turn turns on PMOS transistor 4202 and turns off NMOS transistor 4203, latching the high voltage level shifter.

When IN is low, INB is high, PMOS transistor 4204 is on, NMOS transistor 4205 is off, and OUT is pulled high to HVSUP, which in turn turns off PMOS transistor 4202 and turns on NMOS transistor 4203. The current bias sources 4201 and 4206 respectively control the slope of the ramping of the output voltages.

Figure 43:
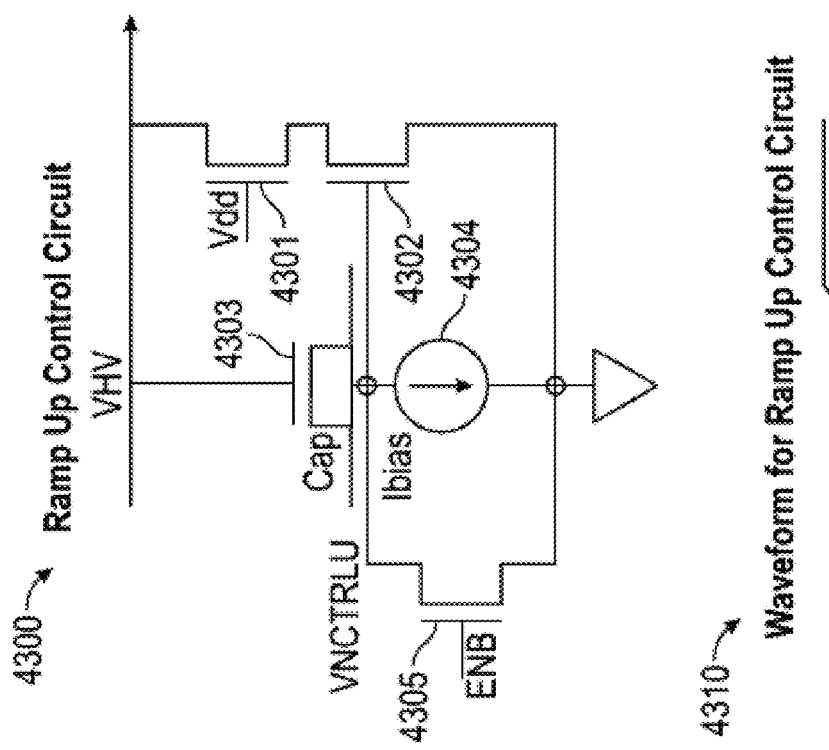
FIG. 43 depicts a ramp-up control circuit and its exemplary waveforms.

FIG. 43 depicts ramp up control circuit 4300, which comprises NMOS transistors 4301, 4302, and 4305; capacitor 4303, which has a capacitance Cap; and current bias 4304, which draws current Ibias. Ramp up control circuit 4300 provides ramp up control to VHV (e.g., HVSUP, CG, EG, SL array terminals, pre-decoded High Voltage Signals). The ramp up control circuit 4300 can be applied at the HV generation block 3410, HV predecoder 3701, or row decoders 3402. VHV is the ramp controlled high voltage node. NMOS transistor 4301 is always on based on VDD being applied to its gate. VNCTRLU is a control bias signal that turns on transistor 4302, which will sink current from HVSUP to control the ramp rate of the VHV. ENB is high when it is desired for VNCTRLU to be low, as NMOS transistor 4305 will pull down VNCTRLU to ground. When VNCTRLU is low, NMOS transistor 4302 will be off. ENB goes low when it is desired for VHV to ramp up to a final voltage. When ENB goes low, NMOS transistor 4305 turns off. Charge will begin to accumulate on the lower plate of capacitor 4303 to produce a voltage on VCNTRLU to control the ramp rate of the VHV. The ramp-up rate is equal to Cap*VHV/Ibias. FIG. 4310 shows the waveforms for the ramp up control circuit 4300. The voltage at node VHV is initially kept at a low voltage level before ramping (circuit not shown).

Figure 44:
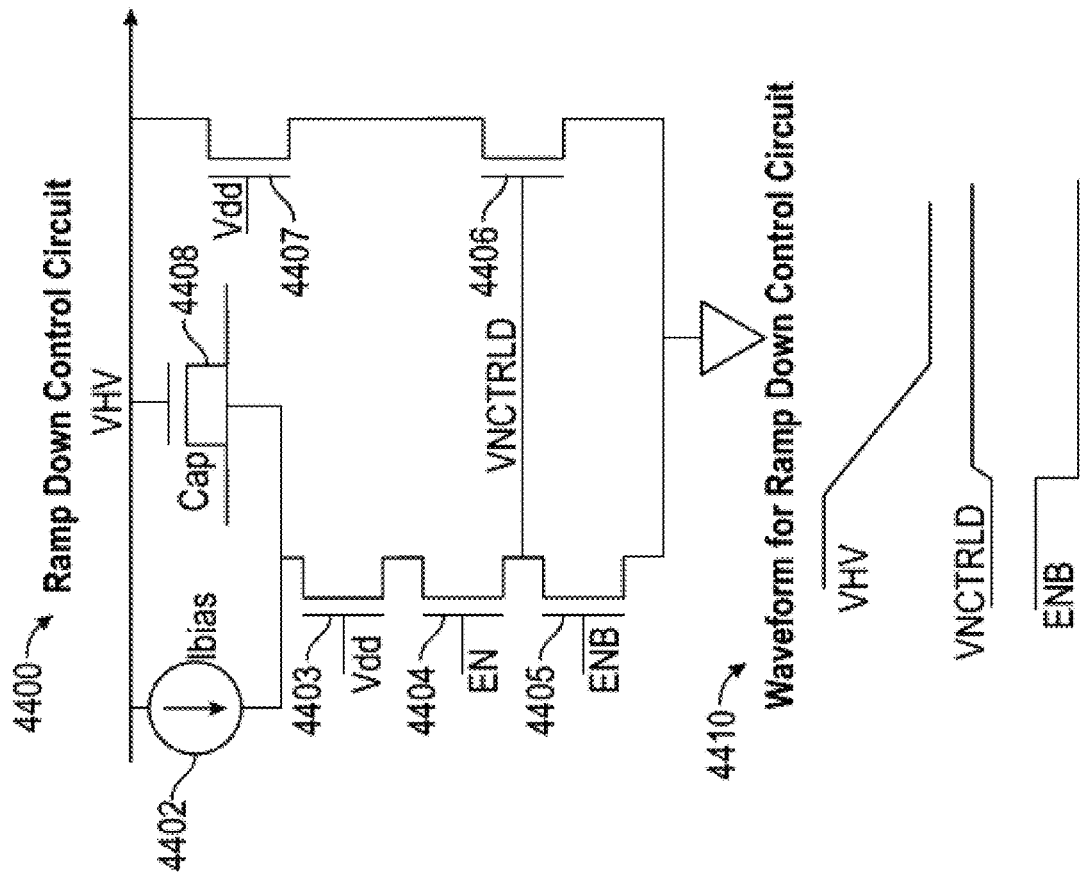
FIG. 44 depicts a ramp-down control circuit and its exemplary waveforms.

FIG. 44 depicts ramp-down control circuit 4400, which comprises NMOS transistors 4403, 4404, 4405, 4406, and 4407; current bias source 4402, which draws current Ibias; and capacitor 4408, which has a capacitance, Cap. Ramp-down control circuit 4400 is switchably coupled during a programming operation to the CG, SL, or EG lines of the selected row (where it is switched from a first selected row to a second selected row during the operation). Ramp-down control circuit 4400 can be implemented in HV generation block 3410, HV predecoder 3701, or row decoder 3402. VHV is the controlled ramp down high voltage node (e.g., HVSUP, CG, EG, SL array terminals, pre-decoded High Voltage Signals). NMOS transistors 4403 and 4407 are always on based on VDD being applied to their respective gates. When EN is high, ENB will be low, and NMOS transistor 4404 will be on and NMOS transistor 4405 will be off. In this state, VCNTRLD will be at a bias voltage to control the ramp down rate of the VHV. When EN goes low, ENB will go high, and transistor 4405 will turn on and VCNTRLD will be pulled to ground. The ramp-down rate is equal to Cap*VHV/Ibias. FIG. 4410 shows the waveforms for ramp down control circuit 4400.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method comprising:
   ramping up an output of a high voltage generator to a first voltage level;
   while maintaining the output of the high voltage generator at the first voltage level, programming a plurality of words of K rows of memory cells in an array of memory cells using the output of the high voltage generator, where K>1;
   after the programming, ramping down the output of the high voltage generator to a second voltage level; and for one or more of the K rows, ramping up a control gate line voltage to a third voltage level prior to programming the row and ramping down the control gate line voltage to a fourth voltage level after programming the row, wherein the fourth voltage level equals the second voltage level.

2. A method comprising:

ramping up an output of a high voltage generator to a first voltage level;

while maintaining the output of the high voltage generator at the first voltage level, programming a plurality of words of K rows of memory cells in an array of memory cells using the output of the high voltage generator, where K>1;

after the programming, ramping down the output of the high voltage generator to a second voltage level;

for one or more of the K rows, ramping up a control gate line voltage to a third voltage level prior to programming the row and ramping down the control gate line voltage to a fourth voltage level after programming the row; and for one or more of the K rows, ramping up a source line voltage to a fifth voltage level prior to programming the row and ramping down the source line voltage to a sixth voltage level after programming the row.

3. The method of claim 2, comprising:

for one or more of the K rows, ramping up an erase gate line voltage to a seventh voltage level prior to programming the row and ramping down the source line voltage to an eighth voltage level after programming the row.

4. A method comprising:

ramping up an output of a high voltage generator to a first voltage level;

while maintaining the output of the high voltage generator at the first voltage level, programming a plurality of words of K rows of memory cells in an array of memory cells using the output of the high voltage generator, where K>1;

after the programming, ramping down the output of the high voltage generator to a second voltage level;

for one or more of the K rows, ramping up a control gate line voltage to a third voltage level prior to programming the row and ramping down the control gate line voltage to a fourth voltage level after programming the row; and for one or more of the K rows, ramping up a control gate line voltage to a third voltage level prior to programming the row and ramping down the control gate line voltage to a fifth voltage level between the fourth voltage level and the third voltage level after programming the row.

5. The method of claim 4, wherein the fourth voltage level equals the second voltage level.

6. A method comprising:

ramping up an output of a high voltage generator to a first voltage level;

while maintaining the output of the high voltage generator at the first voltage level, programming a plurality of words of K rows of memory cells in an array of memory cells using the output of the high voltage generator, where K>1;

after the programming, ramping down the output of the high voltage generator to a second voltage level; and for one or more of the K rows, ramping up a control gate line voltage to a third voltage level prior to programming the row and ramping down the control gate line voltage to a fourth voltage level after programming the row, wherein the ramping up of the control gate line voltage is ramp-rate controlled.

7. The method of claim 6, wherein a ramp-rate of the ramping up of the control gate line voltage is faster than ramp-rate of the output of the high voltage generator.

8. A system comprising:

an array of memory cells arranged in rows and columns;

a high voltage generation block to generate: (i) a first ramp-up voltage prior to a programming operation of a plurality of words in K rows of memory cells in the array, where K>1, (ii) a high voltage during the programming operation of K rows of memory cells in the array, and (iii) a first ramp-down voltage after the programming operation of K rows of memory cells in the array; and a ramp control circuit to: (i) generate a second ramp-up voltage steeper than the first ramp-up voltage before programming one of the K rows of memory cells, (ii) apply the high voltage to a control gate line of a row of the array of memory cells to program one of the K rows of memory cells, and (iii) generate a second ramp-down voltage steeper than the first ramp-down voltage after programming the one of the K rows of memory cells.

9. The system of claim 8, wherein the ramp control circuit comprises:

a PMOS transistor comprising a first terminal coupled to the high voltage generation block, a second terminal coupled to the control gate line, and a gate to receive a first control signal; and an NMOS transistor comprising a first terminal coupled to the control gate line, a second terminal coupled to a ground terminal and a gate to receive a second control signal.

10. The system of claim 9, wherein the PMOS transistor is current-controlled by the gate of the PMOS transistor and the NMOS transistor is current-controlled by the gate of the NMOS transistor.

11. The system of claim 8, wherein the ramp control circuit comprises:

a first PMOS transistor comprising a first terminal coupled to the high voltage generation block, a second terminal, and a gate to receive a first control signal;

a second PMOS transistor comprising a first terminal coupled to the second terminal of the first PMOS transistor, a second terminal coupled to the control gate line, and a gate to receive a second control signal;

a first NMOS transistor comprising a first terminal coupled to the control gate line, a second terminal, and a gate to receive a third control signal; and a second NMOS transistor comprising a first terminal coupled to the second terminal of the first NMOS transistor, a second terminal coupled to a ground terminal, and a gate to receive a fourth control signal.

12. The system of claim 11, wherein the second PMOS transistor is current-controlled by the gate of the second PMOS transistor and the second NMOS transistor is current-controlled by the gate of the second NMOS transistor.

13. The system of claim 8, wherein the ramp control circuit comprises:

a first current bias source comprising a first terminal coupled to the high voltage generation block;

a first PMOS transistor comprising a first terminal coupled to a second terminal of the first current source, a second terminal, and a gate to receive a first control signal;

a second PMOS transistor comprising a first terminal coupled to the second terminal of the first PMOS transistor, a second terminal coupled to the control gate line, and a gate to receive a second control signal;

an NMOS transistor comprising a first terminal coupled to the control gate line, a second terminal, and a gate to receive a third control signal; and a second current bias source coupled between the second terminal of the NMOS transistor and ground.

14. The system of claim 8, wherein the ramp control circuit comprises:

a first current bias source comprising a first terminal coupled to the high voltage generation block;

a first PMOS transistor comprising a first terminal coupled to a second terminal of the first current source, a second terminal, and a gate to receive a first control signal;

a second PMOS transistor comprising a first terminal coupled to the second terminal of the first PMOS transistor, a second terminal, and a gate to receive a second control signal;

a third PMOS transistor comprising a first terminal coupled to the second terminal of the second PMOS transistor, a second terminal coupled to the control gate line, and a gate to receive a third control signal;

a first NMOS transistor comprising a first terminal coupled to the control gate line, a second terminal, and a gate to receive a fourth control signal;

a second NMOS transistor comprising a first terminal coupled to the second terminal of the first NMOS transistor, a second terminal, and a gate to receive a fifth control signal; and a second current bias source coupled between the second terminal of the second NMOS transistor and ground.

15. A system comprising:

an array of memory cells arranged in rows and columns;

a high voltage generation block to generate: (i) a first ramp-up voltage prior to a programming operation of a plurality of words in K rows of memory cells in the array, where K>1, (ii) a high voltage during the programming operation, and (iii) a first ramp-down voltage after the programming operation;

a ramp up control circuit to generate a second ramp-up voltage steeper than the first ramp-up voltage before programming one of the K rows of memory cells, and apply the high voltage to a control gate line to program the one of the K rows of memory cells; and a ramp down control circuit to generate a second ramp-down voltage steeper than the first ramp-down voltage after programming the one of the K rows of memory cells.

* * * * *